United States Patent
Yang et al.

(10) Patent No.: US 10,615,911 B2
(45) Date of Patent: Apr. 7, 2020

(54) DATA PROCESSING METHOD, APPARATUS, AND SYSTEM

(71) Applicant: Huawei Technologies Co., Ltd., Shenzhen (CN)

(72) Inventors: Wenbin Yang, Beijing (CN); Xinyuan Wang, Beijing (CN); Tongtong Wang, Beijing (CN); Penghao Si, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 78 days.

(21) Appl. No.: 15/918,432

(22) Filed: Mar. 12, 2018

(65) Prior Publication Data
US 2018/0205493 A1    Jul. 19, 2018

Related U.S. Application Data

(63) Continuation of application No. PCT/CN2016/081721, filed on May 11, 2016.

(51) Int. Cl.
*H04L 1/00* (2006.01)
*H04L 27/04* (2006.01)
(Continued)

(52) U.S. Cl.
CPC ........ *H04L 1/0041* (2013.01); *H03M 13/258* (2013.01); *H04L 1/0045* (2013.01); *H04L 1/0058* (2013.01); *H04L 27/04* (2013.01); *H03M 13/152* (2013.01); *H03M 13/1515* (2013.01); *H04L 25/49* (2013.01)

(58) Field of Classification Search
CPC ... H04L 1/0041; H04L 1/0045; H04L 1/0058; H04L 27/04; H03M 13/253; H03M 13/258; H03M 13/29; H03M 13/2906
See application file for complete search history.

(56) References Cited

U.S. PATENT DOCUMENTS

| 4,346,473 | A |   | 8/1982 | Davis |          |
|-----------|---|---|--------|----------|-----------|
| 6,064,697 | A | * | 5/2000 | Yoshikawa | H03M 5/145 |
|           |   |   |        |          | 375/242   |

(Continued)

FOREIGN PATENT DOCUMENTS

| CN | 103354983 A | 10/2013 |
| CN | 103534971 A | 1/2014 |

(Continued)

OTHER PUBLICATIONS

Hormis et al. "Low-Complexity Coded-Modulation for ISI-Constrained Channels," IEEE Transactions on Communications, vol. 57, No. 6, pp. 1836-1846, XP011262837, Institute of Electrical and Electronics Engineers, New York, New York (Jun. 2009).

(Continued)

*Primary Examiner* — Shelly A Chase
(74) *Attorney, Agent, or Firm* — Leydig, Voit & Mayer, Ltd.

(57) ABSTRACT

This application discloses a data processing method and apparatus. The method includes: distributing, by a first distribution circuit, a first bit stream to FEC encoders 1 to N in a round robin fashion, where digital signals 1 to N that are output after being encoded by the FEC encoders 1 to N are in a one-to-one correspondence with a least significant bit to a most significant bit of an input signal of a PAM circuit, a coding gain $G_X$ of an FEC encoder X is greater than a coding gain $G_Y$ of an FEC encoder Y, $1 \le X < Y \le N$, $N \ge 2$, and X, Y, and N are all integers. In the method, different FEC coding gains can be provided for links with different bit error rates, so that a requirement of a high-rate Ethernet for a high gain during long-distance data transmission is met, and physical-layer resources occupied by FEC are reduced.

26 Claims, 13 Drawing Sheets

(51) Int. Cl.
*H03M 13/25* (2006.01)
*H03M 13/15* (2006.01)
*H04L 25/49* (2006.01)

(56) References Cited

U.S. PATENT DOCUMENTS

| | | | |
|---|---|---|---|
| 6,269,129 | B1 | 7/2001 | Rhee et al. |
| 8,949,699 | B1 | 2/2015 | Gustlin |
| 9,729,170 | B1* | 8/2017 | Roldan .................... H03M 9/00 |
| 2003/0115540 | A1* | 6/2003 | Bae ..................... H03M 13/253 |
| | | | 714/792 |
| 2016/0070615 | A1 | 3/2016 | Zhong |
| 2016/0094311 | A1 | 3/2016 | Su et al. |
| 2016/0301498 | A1 | 10/2016 | Yang et al. |

FOREIGN PATENT DOCUMENTS

| | | |
|---|---|---|
| CN | 103797742 A | 5/2014 |
| CN | 104995887 A | 10/2015 |
| EP | 1553706 A1 | 7/2005 |
| WO | 2012125943 A1 | 9/2012 |
| WO | 2015089741 A1 | 6/2015 |

OTHER PUBLICATIONS

Wachsmann et al., "Multilevel Codes: Theoretical Concepts and Practical Design Rules," IEEE Transactions on Information Theory, vol. 45, No. 5, pp. 1361-1391 XP002187530, Institute of Electrical and Electronics Engineers, New York, New York (Jul. 1999).

Yang et al., "LSB-coded modulation and its applications to microwave digital radios", Global Telecommunications Conference, 1996. vol. 2, pp. 1243-1247. XP010220116, Institute of Electrical and Electronics Engineers, New York, New York (Nov. 1996).

"IEEE P802.3bs™/D1.1 Draft Standard for Ethernet Amendment: Media Access Control Parameters, Physical Layers and Management Parameters for 400 Gb/s Operation," IEEE P802.3bs™/D1.1, Institute of Electrical and Electronics, New York, New York (Nov. 27, 2015).

* cited by examiner

DATA PROCESSING METHOD, APPARATUS, AND SYSTEM

CROSS-REFERENCE TO RELATED APPLICATIONS

This application is a continuation of International Application No. PCT/CN2016/081721, filed on May 11, 2016, which is hereby incorporated by reference in its entirety.

TECHNICAL FIELD

This application relates to the field of communications technologies, and in particular, to a data processing method, apparatus, and system.

BACKGROUND

As technologies develop, a rate of an Ethernet develops from 10 megabit/s (megabit/s), 100 megabit/s, 1 gigabit/s (gigabit/s), and 10 gigabit/s, to 40 gigabit/s and 100 gigabit/s. With rapid development of Internet Protocol (IP) videos and cloud computing, service traffic increases by 50% to 80% every year. This drives the Ethernet to evolve towards a higher rate. An Ethernet (collectively referred to as a next generation Ethernet in this application) with a rate greater than 100 gigabit/s may have a rate of 400 gigabit/s, 1 terabit/s (terabit/s), or 1.6 terabit/s.

As a rate of an Ethernet interface increases, a bandwidth of a single channel is hardly greater than 100 gigabit/s. To enable a bandwidth of the Ethernet interface to exceed 100 gigabit/s, a multichannel becomes an optional manner. If a transmission rate of the single channel is increased, a transmission loss phenomenon is introduced, and a bit error occurs during data transmission. Therefore, for the next generation Ethernet interface, to enable a receiver circuit to correct an error that occurs in a data transmission process, a forward error correction (FEC) mechanism is introduced.

In an existing physical layer architecture of an Ethernet interface of 40 gigabit/s and an Ethernet interface of 100 gigabit/s, to correct an error introduced during long-distance transmission, a high-gain FEC mechanism is used. However, physical-layer resources of an Ethernet interface are increased in the high-gain FEC mechanism.

SUMMARY

To reduce occupation of physical-layer resources, embodiments of this application provide a data processing method, a data processing apparatus, and a data processing system.

Technical solutions provided in the embodiments of this application are as follows:

According to a first aspect, this application provides a data processing method, where the method is performed by a transmitter circuit in an Ethernet interface, the transmitter circuit includes an FEC encoding circuit, a first distribution circuit, and a data processing circuit, and the method includes:

performing, by the FEC encoding circuit, FEC encoding on a first bit stream, to obtain a second bit stream;

distributing, by the first distribution circuit, the second bit stream to N channels in a round robin fashion, where the N channels are respectively represented by channels 1 to N, the second bit stream includes N digital signals, the N digital signals are respectively represented by digital signals 1 to N, the digital signals 1 to N are respectively transmitted to N subcircuits of the data processing circuit by using the channels 1 to N, the N subcircuits are respectively represented by subcircuits 1 to N, the digital signals 1 to N are in a one-to-one correspondence with the channels 1 to N, the channels 1 to N are in a one-to-one correspondence with the subcircuits 1 to N, L subcircuits of the N subcircuits are L FEC encoders, W subcircuits of the N subcircuits are W delayers, and the L subcircuits do not intersect with the W subcircuits;

respectively processing, by the subcircuits 1 to N, the digital signals 1 to N, to obtain N processed digital signals, where the N processed digital signals are respectively represented by bit streams 1 to N, and the bit streams 1 to N are in a one-to-one correspondence with the digital signals 1 to N, where the L FEC encoders respectively perform FEC encoding processing on L input digital signals, to obtain L bit streams, and the W delayers respectively perform delay processing on W input digital signals, to obtain W bit streams, where coding gains (coding gain) of the subcircuits 1 to N are respectively represented by $G_1$ to $G_N$, a coding gain of a subcircuit X is $G_X$, a coding gain of a subcircuit Y is $G_Y$, $G_X > G_Y$, $L+W=N$, $L \geq 1$, $W \geq 0$, $1 \leq X \leq Y \leq N$, $N \geq 2$, and L, W, X, Y, and N are all integers; and sending, by the subcircuits 1 to N, the bit streams 1 to N to a pulse amplitude modulation PAM circuit, where the PAM circuit is configured to modulate the bit streams 1 to N, the bit streams 1 to N are an input signal of the PAM circuit, and the bit streams 1 to N are in a one-to-one correspondence with a least significant bit to a most significant bit of the input signal.

In the embodiments of this application, FEC encoders with different coding gains correspond to digital signals with different bit error rates. An FEC encoder with a high gain corresponds to a digital signal with a high bit error rate, and an FEC encoder with a low gain corresponds to a digital signal with a low bit error rate. Therefore, FEC with a relatively high gain covers data that easily encounters a bit error on a link. FEC with different gains is used, so that chip resources occupied by FEC are reduced, and implementation complexity of an entire system is reduced.

In an optional implementation manner, the subcircuit 1 is an FEC encoding circuit, and $G_1 > G_N$. In this way, data with a relatively high bit error rate is corrected by using relatively complex FEC, and data with a relatively low bit error rate may be corrected by using relatively simple FEC. Therefore, system complexity is reduced, and chip resources occupied by FEC are reduced.

In an optional implementation manner, $G_1$ is greater than or equal to each coding gain in $G_2$ to $G_{N-1}$. Therefore, chip resources occupied by FEC are further reduced, and implementation complexity of a system is reduced.

In an optional implementation manner, the transmitter circuit further includes a first alignment marker addition circuit, and the method further includes:

after the first distribution circuit distributes the first bit stream to the channels 1 to N in a round robin fashion, and before the subcircuits 1 to N respectively process the digital signals 1 to N, receiving, by the first alignment marker addition circuit, the digital signals 1 to N, and adding, by the first alignment marker addition circuit, first alignment markers 1 to N to the digital signals 1 to N, where the digital signals 1 to N are in a one-to-one correspondence with the first alignment markers 1 to N, and the first alignment markers 1 to N are used for determining boundaries of the bit streams 1 to N; or after the subcircuits 1 to N send the bit streams 1 to N to the pulse amplitude modulation PAM circuit, receiving, by the first alignment marker addition circuit, the bit streams 1 to N, and adding, by the first alignment marker addition circuit, first alignment markers 1 to N to the bit streams 1 to N, where the bit streams 1 to N are in a one-to-one correspondence with the first alignment markers 1 to N, and the first alignment markers 1 to N are used for determining boundaries of the bit streams 1 to N.

In an optional implementation manner, the transmitter circuit further includes a second distribution circuit, the PAM circuit includes M modulators, and after the sending, by the subcircuits 1 to N, the bit streams 1 to N to a pulse amplitude modulation PAM circuit, the method further includes:

receiving, by the second distribution circuit, the bit streams 1 to N;

distributing, by the second distribution circuit, the bit streams 1 to N, to obtain N×M bit streams $BS_{11}$ to $BS_{NM}$, where a bit stream i corresponds to $BS_{i1}$ to $BS_{iM}$, and values of i are all integers from 1 to N; and sending, by the second distribution circuit, $BS_{i1}$ to $BS_{iM}$ to the M modulators, where $BS_{i1}$ to $BS_{iM}$ are in a one-to-one correspondence with the M modulators, the M modulators are respectively configured to modulate $BS_{i1}$ to $BS_{iM}$, and M is an integer greater than or equal to 2.

In this implementation manner, multiple modulators are used to modulate multiple bit streams, so as to meet a transmission rate requirement of a high-rate Ethernet.

In an optional implementation manner, the transmitter circuit further includes a second distribution circuit and a multiplexing circuit, the PAM circuit includes M modulators, and after the sending, by the subcircuits 1 to N, the bit streams 1 to N to a pulse amplitude modulation PAM circuit, the method further includes:

receiving, by the second distribution circuit, the bit streams 1 to N;

distributing, by the second distribution circuit, the bit streams 1 to N, to obtain N×P bit streams $AS_{11}$ to $AS_{NP}$, where a bit stream i corresponds to $AS_{i1}$ to $AS_{iP}$, and values of i are all integers from 1 to N;

multiplexing, by the multiplexing circuit, the N×P bit streams $AS_{11}$ to $AS_{NP}$ into N×M bit streams $BS_{11}$ to $BS_{NM}$, where a bit stream i corresponds to $BS_{i1}$ to $BS_{iM}$, and values of i are all integers from 1 to N; and sending, by the multiplexing circuit, $BS_{i1}$ to $BS_{iM}$ to the M modulators, where $BS_{i1}$ to $BS_{iM}$ are in a one-to-one correspondence with the M modulators, the M modulators are respectively configured to modulate $BS_{i1}$ to $BS_{iM}$, P≥M, P is an integer multiple of M, and M is an integer greater than or equal to 2.

In this implementation manner, the foregoing multiplexing circuit is used, so that the FEC encoding circuit and the PAM circuit may be separately disposed on two chips, and a person skilled in the art can set the FEC encoding circuit in such a manner that the FEC encoding circuit includes multiple subcircuits, for example, 16 subcircuits. According to a quantity of modulators that need to be used, data is transmitted between an FEC encoding circuit and a modulator by using a multiplexer, so that flexibility of disposing a circuit is improved.

In an optional implementation manner, the transmitter circuit further includes a second alignment marker addition circuit, and after the sending, by the second distribution circuit, $BS_{i1}$ to $BS_{iM}$ to the M modulators, the method further includes:

receiving, by the second alignment marker addition circuit, $BS_{11}$ to $BS_{NM}$; and respectively adding, by the second alignment marker addition circuit, N×M second alignment markers to $BS_{11}$ to $BS_{NM}$, where the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

In an optional implementation manner, the transmitter circuit further includes a second alignment marker addition circuit, and after the sending, by the multiplexing circuit, $BS_{i1}$ to $BS_{iM}$ to the M modulators, the method further includes:

receiving, by the second alignment marker addition circuit, $BS_{11}$ to $BS_{NM}$; and respectively adding, by the second alignment marker addition circuit, N×M second alignment markers to $BS_{11}$ to $BS_{NM}$, where the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

In an optional implementation manner, the second bit stream includes an FEC code word, and the FEC code word includes multiple symbols, where the first distribution circuit sends the second bit stream to a channel P according to a first unit;

the first distribution circuit sends the second bit stream to a channel Q according to a second unit;

a quantity of bits included in the first unit is equal to or is not equal to a quantity of bits included in the second unit; and 1≤P≤N−1, 2≤Q≤N, P≠Q, and both P and Q are integers.

In an optional implementation manner, the first unit is one or more symbols, and the second unit is one or more symbols. Distribution is performed in such a manner, so that a quantity of distributed data units is an integer multiple of a quantity of symbols in the FEC code word. Therefore, consecutive errors are avoided, a bit error rate of data is reduced, and FEC performance in some scenarios is improved.

In an optional implementation manner, the sending, by the first distribution circuit, the second bit stream to a channel P according to a first unit specifically includes:

sending, by the first distribution circuit, a first part of a first symbol to the channel P, where the first unit includes the first part of the first symbol; and the method further includes:

sending, by the first distribution circuit, a second part of the first symbol to a channel P+1, where the first symbol includes the first part and the second part.

Distribution performed in such a manner can reduce resources required for performing an alignment operation on the second bit stream.

According to a second aspect, this application provides a data processing method, where the method is performed by a receiver circuit in an Ethernet interface, the receiver circuit includes a processing circuit, a first data merging circuit, and a forward error correction FEC decoding circuit, and the method includes:

respectively receiving, by N subcircuits of the processing circuit, N bit streams output by a pulse amplitude demodulation circuit, where the N subcircuits are respectively represented by subcircuits 1 to N, the N bit streams are respectively represented by bit streams 1 to N, the bit streams 1 to N are in a one-to-one correspondence with a least significant bit to a most significant bit of an output signal of the pulse amplitude demodulation circuit, the subcircuits 1 to N are in a one-to-one correspondence with the bit streams 1 to N, L subcircuits of the N subcircuits are L FEC decoders, W subcircuits of the N subcircuits are W delayers, the L subcircuits do not intersect with the W subcircuits, L+W=N, L≥1, W≥0, N≥2, and L, W, and N are all integers;

respectively processing, by the subcircuits 1 to N, the bit streams 1 to N, to obtain digital signals 1 to N, where the bit streams 1 to N are in a one-to-one correspondence with the digital signals 1 to N, the L FEC decoders respectively perform FEC decoding on L input bit streams, to obtain L digital signals, and the W delayers respectively perform delay processing on W input bit streams, to obtain W digital signals, where coding gains (coding gain) of the subcircuits 1 to N are respectively represented by $G_1$ to $G_N$, a coding gain of a subcircuit X is $G_X$, a coding gain of a subcircuit Y is $G_Y$, $G_X > G_Y$, $1 \leq X \leq Y \leq N$, and X and Y are integers;

sending, by the subcircuits 1 to N, the digital signals 1 to N to the first merging circuit;

merging, by the first data merging circuit, the digital signals 1 to N into a serial first bit stream; and performing, by the FEC decoding circuit, FEC decoding on the first bit stream, to obtain a second bit stream.

In this way, FEC decoders with different coding gains correspond to digital signals with different bit error rates. An FEC decoder with a high gain corresponds to a digital signal with a high bit error rate, and an FEC decoder with a low gain corresponds to a digital signal with a low bit error rate. In this way, FEC with a relatively high gain covers data that easily encounters a bit error on a link. FEC with different gains is used, so that chip resources occupied by FEC are reduced, and implementation complexity of an entire system is reduced.

In a possible implementation manner, the subcircuit 1 is an FEC decoder, and $G_1 > G_N$. In this way, data with a relatively high bit error rate is corrected by using relatively complex FEC, and data with a relatively low bit error rate may be corrected by using relatively simple FEC. Therefore, system complexity is reduced, and chip resources occupied by FEC are reduced.

In a possible implementation manner, $G_1$ is greater than or equal to each coding gain in $G_2$ to $G_{N-1}$. Therefore, chip resources occupied by FEC are further reduced, and implementation complexity of a system is reduced.

In a possible implementation manner, the receiver circuit further includes a first alignment marker identification circuit, and before the respectively receiving, by N subcircuits of the processing circuit, N bit streams output by a pulse amplitude demodulation circuit, the method further includes:

identifying, by the first alignment marker identification circuit, first alignment markers 1 to N that are included in the bit streams 1 to N, where the bit streams 1 to N are in a one-to-one correspondence with the first alignment markers 1 to N; and determining boundaries of the bit streams 1 to N based on the first alignment markers 1 to N.

In a possible implementation manner, the pulse amplitude demodulation circuit includes M demodulators, the receiver circuit further includes a second data merging circuit, and before the respectively receiving, by N subcircuits of the processing circuit, N bit streams output by a pulse amplitude demodulation circuit, the method further includes:

receiving, by the second data merging circuit, N×M bit streams output by the M demodulators, where the N×M bit streams are respectively represented by $BS_{11}$ to $BS_{NM}$, a bit stream i corresponds to $BS_{i1}$ to $BS_{iM}$, and values of i are all integers from 1 to N; and merging, by the second data merging circuit, $BS_{i1}$ to $BS_{iM}$ into the bit stream i, where $BS_{i1}$ to $BS_{iM}$ are in a one-to-one correspondence with the M demodulators, and M is an integer greater than or equal to 2.

In a possible implementation manner, the pulse amplitude demodulation circuit includes M demodulators, the receiver circuit further includes a demultiplexing circuit and a second data merging circuit, and before the respectively receiving, by N subcircuits of the processing circuit, N bit streams output by a pulse amplitude demodulation circuit, the method further includes:

receiving, by the demultiplexing circuit, N×M bit streams output by the M demodulators, where the N×M bit streams are respectively represented by $BS_{11}$ to $BS_{NM}$; and demultiplexing $BS_{11}$ to $BS_{NM}$ into N×P bit streams, where the N×P bit streams are respectively represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2;

receiving, by the second data merging circuit, $AS_{11}$ to $AS_{NP}$; and merging, by the second data merging circuit, $AS_{i1}$ to $AS_{iP}$ into the bit stream i, where the bit stream i corresponds to $AS_{i1}$ to $AS_{iP}$, values of i are all integers from 1 to N, P≥M, P is an integer multiple of M, and M is an integer greater than or equal to 2.

In a possible implementation manner, the receiver circuit further includes a second alignment marker identification circuit, and before the respectively receiving, by N subcircuits of the processing circuit, N bit streams output by a pulse amplitude demodulation circuit, the method further includes:

identifying, by the second AM identification circuit, N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determining a boundary of each bit stream of $BS_{11}$ to $BS_{NM}$ based on $AM_{11}$ to $AM_{NM}$.

According to a third aspect, this application provides a data processing apparatus used for an Ethernet interface. The data processing apparatus is configured to perform the method in the first aspect or any possible implementation manner of the first aspect. Specifically, the data processing apparatus includes a circuit that is configured to perform the method in the first aspect or any possible implementation manner of the first aspect.

According to a fourth aspect, this application provides a data processing apparatus used for an Ethernet interface. The data processing apparatus is configured to perform the method in the second aspect or any possible implementation manner of the second aspect. Specifically, the data processing apparatus includes a circuit that is configured to perform the method in the second aspect or any possible implementation manner of the second aspect.

According to a fifth aspect, this application provides a data processing method, where the method is performed by a transmitter circuit in an Ethernet interface, the transmitter circuit includes a first distribution circuit and a first forward error correction FEC encoding circuit, and the method includes:

distributing, by the first distribution circuit, a first bit stream to N channels in a round robin fashion, where the N channels are respectively represented by channels 1 to N, the first bit stream includes N digital signals, the N digital signals are respectively represented by digital signals 1 to N, the digital signals 1 to N are respectively transmitted to N FEC encoders of the first FEC encoding circuit by using the channels 1 to N, the N FEC encoders are respectively represented by FEC encoders 1 to N, the digital signals 1 to N are in a one-to-one correspondence with the channels 1 to N, and the channels 1 to N are in a one-to-one correspondence with the FEC encoders 1 to N; and respectively performing, by the FEC encoders 1 to N, FEC encoding on the digital signals 1 to N, to obtain N FEC code words, where an FEC encoder X performs FEC encoding on a digital signal X, an FEC encoder Y performs FEC encoding on a digital signal Y, the N FEC code words are respectively represented by $F_1$ to $F_N$, the digital signals 1 to N are in a one-to-one correspondence with $F_1$ to $F_N$, coding gains of the FEC encoders 1 to N are respectively represented by $G_1$ to $G_N$, a coding gain of the FEC encoder X is represented by $G_X$, a coding gain of the FEC encoder Y is represented by $G_Y$, $G_X > G_Y$, $1 \leq X \leq Y \leq N$, $N \geq 2$, and X, Y, and N are all integers; and sending, by the FEC encoders 1 to N, $F_1$ to $F_N$ to a pulse amplitude modulation PAM circuit, where the PAM circuit is configured to modulate $F_1$ to $F_N$, $F_1$ to $F_N$ are an input signal of the PAM circuit, and $F_1$ to $F_N$ are in a one-to-one correspondence with a least significant bit to a most significant bit of the input signal.

In this way, FEC encoders with different coding gains correspond to digital signals with different bit error rates. An FEC encoder with a high gain corresponds to a digital signal with a high bit error rate, and an FEC encoder with a low gain corresponds to a digital signal with a low bit error rate. In this way, FEC with a relatively high gain covers data that easily encounters a bit error on a link. FEC with different gains is used, so that chip resources occupied by FEC are reduced, and implementation complexity of an entire system is reduced.

In a possible implementation manner, $G_1 > G_N$. In this way, data with a relatively high bit error rate is corrected by using relatively complex FEC, and data with a relatively low bit error rate may be corrected by using relatively simple FEC, so that system complexity is reduced, and chip resources occupied by FEC are reduced.

In a possible implementation manner, $G_1$ is greater than or equal to each coding gain in $G_2$ to $G_{N-1}$. Therefore, chip resources occupied by FEC are further reduced, and implementation complexity of a system is reduced.

In a possible implementation manner, the transmitter circuit further includes a first alignment marker addition circuit, and the method further includes:

after the first distribution circuit distributes the first bit stream to the channels 1 to N in a round robin fashion, and before the FEC encoders 1 to N respectively perform FEC encoding on the digital signals 1 to N, to obtain N FEC code words, respectively adding, by the first alignment marker addition circuit, first alignment markers 1 to N to the digital signals 1 to N, where the digital signals 1 to N are in a one-to-one correspondence with the first alignment markers 1 to N, the first alignment markers 1 to N are in a one-to-one correspondence with $F_1$ to $F_N$, and the first alignment markers 1 to N are used for determining boundaries of $F_1$ to $F_N$; or after the FEC encoders 1 to N send $F_1$ to $F_N$ to the PAM circuit, receiving, by the first alignment marker addition circuit, $F_1$ to $F_N$, and respectively adding first alignment markers 1 to N to $F_1$ to $F_N$, where the first alignment markers 1 to N are in a one-to-one correspondence with $F_1$ to $F_N$, and the first alignment markers 1 to N are used for determining boundaries of $F_1$ to $F_N$.

In a possible implementation manner, the transmitter circuit further includes a second distribution circuit, the PAM circuit includes M modulators, and after the sending, by the FEC encoders 1 to N, $F_1$ to $F_N$ to a PAM circuit, the method further includes:

receiving, by the second distribution circuit, $F_1$ to $F_N$;

distributing, by the second distribution circuit, $F_1$ to $F_N$, to obtain N×M bit streams, where the N×M bit streams are represented by $BS_{11}$ to $BS_{NM}$, $F_i$ corresponds to $BS_{i1}$ to $BS_{iM}$, and values of i are all integers from 1 to N; and respectively sending, by the second distribution circuit, $BS_{i1}$ to $BS_{iM}$ to the M modulators, where $BS_{i1}$ to $BS_{iM}$ are in a one-to-one correspondence with the M modulators, the M modulators are respectively configured to modulate $BS_{i1}$ to $BS_{iM}$, and M is an integer greater than or equal to 2.

Multiple modulators are used to perform signal modulation on the N FEC code words, so as to meet a transmission rate requirement of a high-rate Ethernet.

In a possible implementation manner, the transmitter circuit further includes a second distribution circuit and a multiplexing circuit, the PAM circuit includes M modulators, and after the sending, by the FEC encoders 1 to N, $F_1$ to $F_N$ to a PAM circuit, the method further includes:

receiving, by the second distribution circuit, $F_1$ to $F_N$;

distributing, by the second distribution circuit, $F_1$ to $F_N$, to obtain N×P bit streams, where the N×P bit streams are represented by $AS_{11}$ to $AS_{NP}$, $F_i$ corresponds to $AS_{i1}$ to $AS_{iP}$, and values of i are all integers from 1 to N;

multiplexing, by the multiplexing circuit, the N×P bit streams $AS_{11}$ to AS into N×M bit streams, where the N×M bit streams are represented by $BS_{11}$ to $BS_{NM}$, corresponds to $BS_{i1}$ to $BS_{iM}$, and values of i are all integers from 1 to N; and respectively sending, by the multiplexing circuit, $BS_{i1}$ to $BS_{iM}$ to the M modulators, where $BS_{i1}$ to $BS_{iM}$ are in a one-to-one correspondence with the M modulators, the M modulators are respectively configured to module $BS_{i1}$ to $BS_{iM}$, $P \geq M$, P is an integer multiple of M, and M is an integer greater than or equal to 2.

The foregoing multiplexing circuit is used, so that the first FEC encoding circuit and the PAM circuit may be separately disposed on two chips, and a person skilled in the art can set output of the first FEC encoding circuit to multiple channels of output, for example, 16 channels of output. According to a quantity of modulators that need to be used, data is transmitted between an FEC encoding circuit and a modulator by using a multiplexer, so that flexibility of disposing a circuit is improved.

In a possible implementation manner, the transmitter circuit further includes a second alignment marker addition circuit, and after the respectively sending, by the second distribution circuit, $BS_{i1}$ to $BS_{iM}$ to the M modulators, the method further includes:

receiving, by the second alignment marker addition circuit, $BS_{11}$ to $BS_{NM}$; and respectively adding, by the second alignment marker addition circuit, N×M second alignment markers to $BS_{11}$ to $BS_{NM}$, where the N×M second alignment markers are represented by $AM_{11}$ to $AM_{NM}$, $BS_{11}$ to $BS_{NM}$ are in a one-to-one correspondence with $AM_{11}$ to $AM_{NM}$, and $AM_{11}$ to $AM_{NM}$ are used for determining boundaries of $BS_{11}$ to $BS_{NM}$.

In a possible implementation manner, the transmitter circuit further includes a second alignment marker addition circuit, and after the respectively sending, by the multiplexing circuit, $BS_{i1}$ to $BS_{iM}$ to the M modulators, the method further includes:

receiving, by the second alignment marker addition circuit, $BS_{11}$ to $BS_{NM}$; and respectively adding, by the second alignment marker addition circuit, N×M second alignment markers to $BS_{11}$ to $BS_{NM}$, where the N×M second alignment markers are represented by $AM_{11}$ to $AM_{NM}$, $BS_{11}$ to $BS_{NM}$ are in a one-to-one correspondence with $AM_{11}$ to $AM_{NM}$, and $AM_{11}$ to $AM_{NM}$ are used for determining boundaries of $BS_{11}$ to $BS_{NM}$.

In a possible implementation manner, the transmitter circuit further includes a second FEC encoding circuit, and before the distributing, by the first distribution circuit, a first bit stream to N channels in a round robin fashion, the method further includes:

performing, by the second FEC encoding circuit, FEC encoding on a second bit stream, to generate the first bit stream.

In a possible implementation manner, the first bit stream includes an FEC code word, and the FEC code word includes multiple symbols, where the first distribution circuit sends the first bit stream to a channel P according to a first unit;

the first distribution circuit sends the first bit stream to a channel Q according to a second unit;

a quantity of bits included in the first unit is equal to or is not equal to a quantity of bits included in the second unit; and $1 \leq P \leq N-1$, $2 \leq Q \leq N$, $P \neq Q$, and both P and Q are integers.

In a possible implementation manner, the first unit is one or more symbols, and the second unit is one or more symbols.

In a possible implementation manner, the sending, by the first distribution circuit, the first bit stream to a channel P according to a first unit specifically includes:

sending, by the first distribution circuit, a first part of a first symbol to the channel P, where the first unit includes the first part of the first symbol; and the method further includes:

sending, by the first distribution circuit, a second part of the first symbol to a channel P+1, where the first symbol includes the first part and the second part.

According to a sixth aspect, this application provides a data processing method, where the method is performed by a receiver circuit in an Ethernet interface, the receiver circuit includes a first forward error correction FEC decoding circuit and a first data merging circuit, and the method includes:

respectively receiving, by N FEC decoders of the first FEC decoding circuit, N bit streams output by a pulse amplitude demodulation circuit, where the N FEC decoders are respectively represented by FEC decoders 1 to N, the N bit streams are respectively represented by bit streams 1 to N, the bit streams 1 to N are in a one-to-one correspondence with a least significant bit to a most significant bit of an output signal of the pulse amplitude demodulation circuit, the FEC decoders 1 to N are in a one-to-one correspondence with the bit streams 1 to N, and N is an integer greater than or equal to 2;

respectively performing, by the FEC decoders 1 to N, FEC decoding on the bit streams 1 to N, to obtain N digital signals, where an FEC decoder X performs FEC decoding on a bit stream X, an FEC decoder Y performs FEC decoding on a bit stream Y, the N digital signals are respectively represented by digital signals 1 to N, the digital signals 1 to N are in a one-to-one correspondence with the FEC decoders 1 to N, coding gains of the FEC decoders 1 to N are respectively represented by $G_1$ to $G_N$, a coding gain of the FEC decoder X is represented by $G_X$, a coding gain of the FEC decoder Y is represented by $G_Y$, $G_X > G_Y$, $1 \leq X \leq Y \leq N$, $N \geq 2$, and X, Y, and N are all integers;

respectively sending, by the FEC decoders 1 to N, the digital signals 1 to N to the first data merging circuit; and merging, by the first data merging circuit, the digital signals 1 to N into a serial first bit stream.

In a possible implementation manner, $G_1 > G_N$. In this way, data with a relatively high bit error rate is corrected by using relatively complex FEC, and data with a relatively low bit error rate may be corrected by using relatively simple FEC, so that system complexity is reduced, and chip resources occupied by FEC are reduced.

In a possible implementation manner, $G_1$ is greater than or equal to each coding gain in $G_2$ to $G_{N-1}$. Therefore, chip resources occupied by FEC are further reduced, and implementation complexity of a system is reduced.

In a possible implementation manner, the receiver circuit further includes a first alignment marker identification circuit, and before the respectively receiving, by N FEC decoders of the first FEC decoding circuit, N bit streams output by a pulse amplitude demodulation circuit, the method further includes:

identifying, by the first alignment marker identification circuit, an alignment markers 1 to N included in the bit streams 1 to N, where the bit streams 1 to N are in a one-to-one correspondence with a comparison marker 1 to an alignment marker N; and determining boundaries of the bit streams 1 to N based on the alignment markers 1 to N.

In a possible implementation manner, the receiver circuit further includes a second FEC decoding circuit, and after the merging, by the first data merging circuit, the digital signals 1 to N into a serial first bit stream, the method further includes:

performing, by the second FEC decoding circuit, second FEC decoding on the serial first bit stream, to obtain a second bit stream.

In a possible implementation manner, the receiver circuit further includes a second data merging circuit, the pulse amplitude demodulation circuit includes M demodulators, and before the respectively receiving, by N FEC decoders of the first FEC decoding circuit, N bit streams output by a pulse amplitude demodulation circuit, the method further includes:

receiving, by the second data merging circuit, N×M bit streams output by the M demodulators, where the N×M bit streams are represented by $BS_{11}$ to $BS_{NM}$, a bit stream i corresponds to $BS_{i1}$ to $BS_{iM}$, and values of i are all integers from 1 to N; and merging, by the second data merging circuit, $BS_{i1}$ to $BS_{iM}$ into the bit stream i, where $BS_{i1}$ to $BS_{iM}$ are in a one-to-one correspondence with the M demodulators, and M is an integer greater than or equal to 2.

In a possible implementation manner, the receiver circuit further includes a demultiplexing circuit and a second data merging circuit, the pulse amplitude demodulation circuit includes M demodulators, and before the respectively receiving, by N FEC decoders of the first FEC decoding circuit, N bit streams output by a pulse amplitude demodulation circuit, the method further includes:

receiving, by the demultiplexing circuit, N×M bit streams output by the M demodulators, where the N×M bit streams are represented by $BS_{11}$ to $BS_{NM}$; and demultiplexing the N×M bit streams $BS_{11}$ to $BS_{NM}$ into N×P bit streams, where the N×P bit streams are represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2;

receiving, by the second data merging circuit, $AS_{11}$ to $AS_{NP}$; and merging, by the second data merging circuit, $AS_{i1}$ to $AS_{iP}$ into the bit streams i, where the bit stream i corresponds to $AS_{i1}$ to $AS_{iP}$, values of i are all integers from 1 to N, P≥M, P is an integer multiple of M, and M is an integer greater than or equal to 2.

In a possible implementation manner, the receiver circuit further includes a second alignment marker identification circuit, and before the respectively receiving, by N FEC decoders of the first FEC decoding circuit, N bit streams output by a pulse amplitude demodulation circuit, the method further includes:

identifying, by the second AM identification circuit, N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determining a boundary of each bit stream of $BS_{11}$ to $BS_{NM}$ based on $AM_{11}$ to $AM_{NM}$.

According to a seventh aspect, this application provides a data processing apparatus, configured to perform the method in the fifth aspect or any possible implementation manner of the fifth aspect. Specifically, the data processing apparatus includes a circuit that is configured to perform the method in the fifth aspect or any possible implementation manner of the fifth aspect.

According to an eighth aspect, this application provides a data processing apparatus, configured to perform the method in the sixth aspect or any possible implementation manner of the sixth aspect. Specifically, the data processing apparatus includes a circuit that is configured to perform the method in the sixth aspect or any possible implementation manner of the sixth aspect.

According to a ninth aspect, this application provides a data processing apparatus. The data processing apparatus includes: an input interface, an output interface, a processor, and a memory. The processor and the memory are connected to each other by using a bus. The processor is configured to execute code in the memory. When the code is executed, the processor is made to perform the method in the first aspect, the second aspect, the fifth aspect, the sixth aspect, any possible implementation manner of the first aspect, any possible implementation manner of the second aspect, any possible implementation manner of the fifth aspect, or any possible implementation manner of the sixth aspect.

According to a tenth aspect, this application provides a computer readable medium, configured to store a computer program. The computer program includes an instruction used to perform the method in the first aspect, the second aspect, the fifth aspect, the sixth aspect, any possible implementation manner of the first aspect, any possible implementation manner of the second aspect, any possible implementation manner of the fifth aspect, or any possible implementation manner of the sixth aspect.

DESCRIPTION OF EMBODIMENTS

Figure 1:
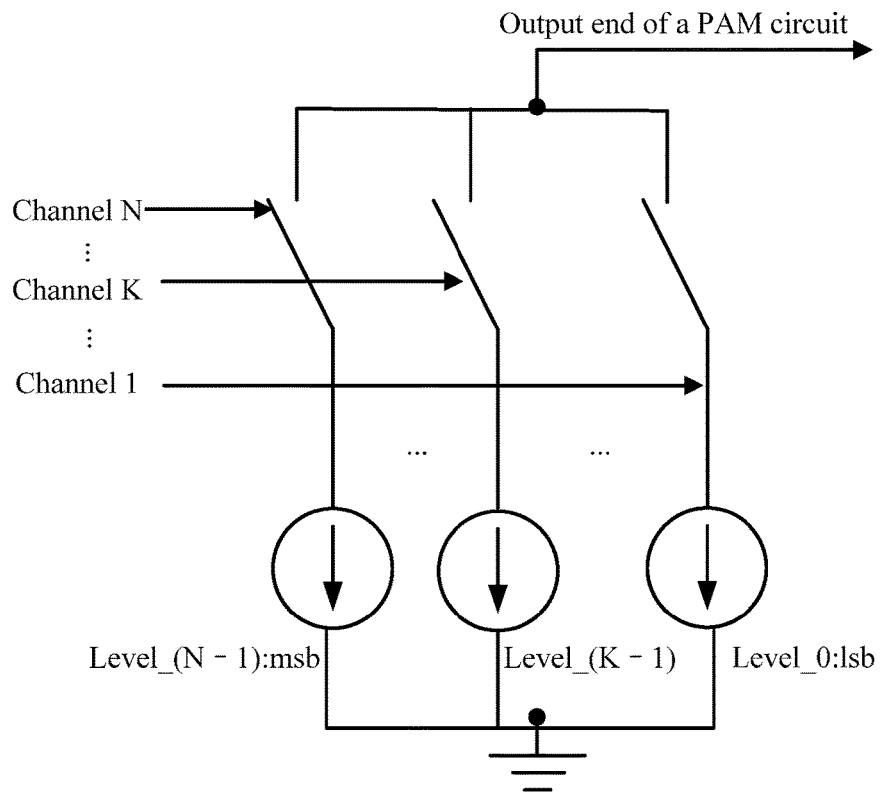
FIG. 1 is a schematic structural diagram of a pulse amplitude modulation (PAM) circuit according to an embodiment of this application.

Application scenarios described in the embodiments of this application are merely intended to describe the technical solutions in the embodiments of this application more clearly, and do not constitute any limitation to the technical solutions provided in the embodiments of this application. A person of ordinary skill in the art may be aware that the technical solutions provided in the embodiments of this application may also be applied to other scenarios.

Unless described oppositely, ordinal numbers such as "first" and "second" mentioned in the embodiments of this application are used to differentiate multiple objects, and are not used to limit an order of the multiple objects.

An Ethernet interface mentioned in the embodiments of this application refers to a circuit that can implement an Ethernet protocol. For example, the Ethernet interface may be a circuit board or a circuit card installed in a personal computer, a router, a switch, or a workstation. For example, the Ethernet interface can enable a personal computer or a switch to connect to a local area network by using a transmission mechanism such as the Ethernet. For example, to implement a function of sending data, the Ethernet interface may include a transmitter circuit. For another example, to implement a function of receiving data, the Ethernet interface may include a receiver circuit. For still another example, to implement functions of sending data and receiving data, the Ethernet interface may include a transmitter circuit and a receiver circuit.

A unit of rate mentioned in the embodiments of this application is bits per second (bit/s). "G" indicates a rate level of gigabit per second or gigabit per second. "T" indicates a rate level of trillion bits per second. "E" in "GE" mentioned in this specification indicates that a type of data is Ethernet data. For example, 100 GE refers to Ethernet data with a rate of 100 Gbit per second (gigabit/s).

A "data block" mentioned in the embodiments of this application may be a string of consecutive bits, or may be one bit. The data block in this application may be referred to as a "code block" or a "data code block". A "bit stream" mentioned in the embodiments of this application refers to a string of consecutive bits, or may be referred to as consecutive data blocks.

A "data unit" mentioned in the embodiments of this application may include one or a plurality of data blocks, and each data unit may include one or more bits.

An "FEC code word" mentioned in the embodiments of this application is an FEC code word that is obtained after an FEC encoder performs FEC encoding on a bit stream. The FEC code word includes A consecutive bits and B parity bits that are generated by performing FEC encoding on the A bits. Both A and B are positive integers.

A "granularity" mentioned in the embodiments of this application refers to a quantity of bits included in a distributed data unit. In this application, the granularity may be one or a plurality of data blocks, or may be one or a plurality of FEC encoding symbols. That is, the granularity may be one or more bits. When a data block is used as a smallest distribution granularity, preferably, a size of the data block is the same as a size of an encoding symbol in FEC encoding. A size in this application refers to a quantity of bits. For example, the size of the data block refers to a quantity of bits in the data block.

A "coding gain" mentioned in the embodiments of this application refers to a difference between signal-to-noise ratios (SNRs) of an unencoded system and an encoded system that have a same bit error rate (BER). For example, a BER of the unencoded system is $10^{-2}$, and an SNR is 4 dB (decibel). If an SNR of the corresponding encoded system is 2.5 dB at the same BER, a coding gain is 4 dB−2.5 dB=1.5 dB. The coding gain is an indicator for evaluating an FEC error correction capability. A higher coding gain indicates a stronger FEC error correction capability.

A PAM circuit mentioned in the embodiments of this application is a modulation circuit commonly used in the Ethernet. The PAM circuit in this application may include one or more modulators. The modulator is configured to modulate binary data. The PAM circuit in the embodiments of this application is specifically described in below with reference to FIG. 1. When the PAM circuit includes multiple modulators, the modulators modulate data in a same manner. In this specification, only one modulator is used as an example to describe a modulation manner of the PAM circuit. PAM may be specifically four-level pulse amplitude modulation (PAM-4), eight-level pulse amplitude modulation (PAM-8), or sixteen-level pulse amplitude modulation (PAM-16). N is used to represent a quantity of input levels of a modulator. PAM may be specifically represented by PAM-$2^N$. PAM-$2^N$ has N input levels, and the N input levels are respectively represented by Level_0 to Level_(N−1). As shown in FIG. 1, N channels are respectively in a one-to-one correspondence with the N input levels of the modulator. The N channels respectively send digital signals to the N levels of the modulator for modulation. The N channels are respectively represented by channels 1 to N. Each digital signal includes one or more data blocks. Each data block includes one or more bits. A digital signal transmitted on a channel K of the N channels corresponds to the $(K-1)^{th}$ input level of the PAM circuit. At a particular time, the channel K sends only one bit to the PAM circuit. K is equal to any integer from 1 to N, and N is an integer greater than or equal to 2. The PAM circuit receives, at a same time, N pieces of data sent by the channels 1 to N. The N pieces of data are respectively represented by data 1 to N. Each of the data 1 to N is 0 or 1. A binary sequence including the data 1 to N is an input signal of the modulator. The data 1 to N is in a one-to-one correspondence with a least significant bit to a most significant bit of the input signal. The modulator modulates the binary sequence including the N pieces of data that are received at the same time into a pulse signal with amplitude corresponding to the binary sequence of data, and sends the pulse signal to a receiver circuit.

In a specific implementation manner, PAM-4 is used for the modulator. The modulator can modulate only one of four types of input signals at a same time. The four types of input signals are separately 00, 01, 10, and 11. The modulator modulates a received input signal, to obtain a pulse signal with corresponding amplitude, and sends the pulse signal to the receiver circuit.

Specifically, for example, the modulator modulates 10. The modulator receives the data 1 sent by the channel 1 and data 2 sent by a channel 2. A binary sequence including the data 1 and the data 2 is an input signal of the modulator. For example, the data 1 is 0, the data 2 is 1, the sequence of binary data including the data 1 and the data 2 is: data 2-data 1, and corresponding binary data is 10. The data 1 corresponds to the $0^{th}$ bit, that is, a least significant bit of the input signal. The data 2 corresponds to the first bit, that is, a most significant bit of the input signal. The data 1 corresponds to Level_0 of the modulator, and the data 2 corresponds to Level_1 of the modulator. The modulator modulates the received data 10, to obtain a pulse signal with corresponding amplitude, and sends the obtained pulse signal to the receiver circuit.

In another specific implementation manner, PAM-8 is used for the modulator. The modulator can modulate only one of eight types of input signals at a same time. The eight types of input signals are separately 000, 001, 010, 011, 100, 101, 110, and 111. The modulator modulates a received input signal, to obtain a pulse signal with corresponding amplitude, and sends the pulse signal to the receiver circuit.

Specifically, for example, the modulator modulates binary data 101. The modulator receives the data 1 sent by the channel 1, data 2 sent by a channel 2, and data 3 sent by a channel 3. A binary sequence including the data 1, the data 2, and the data 3 is an input signal of the modulator. The data 1 is 1, the data 2 is 0, and the data 3 is 1. The sequence of binary data including the data 1, the data 2, and the data 3 is: data 3-data 2-data 1, and corresponding binary data is 101. The data 1 corresponds to the $0^{th}$ bit, that is, a least significant bit of the input signal. The data 2 corresponds to the first bit of the input signal. The data 3 corresponds to the second bit, that is, a most significant bit of the input signal. The data 1 corresponds to Level_0 of the modulator, the data 2 corresponds to Level_1 of the modulator, and the data 3 corresponds to Level 2 of the modulator. The modulator modulates the received data 101, to obtain a pulse signal with corresponding amplitude, and sends the obtained pulse signal to the receiver circuit.

A specific process of round-robin distribution mentioned in the embodiments of this application is described below with reference to FIG. 2 by using examples.

Figure 2:
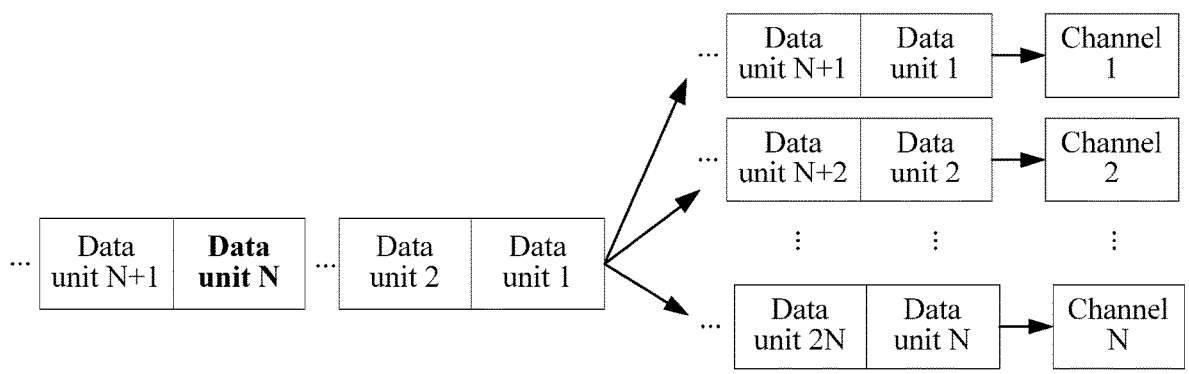
FIG. 2 is a schematic diagram of a method for distributing data in a round robin fashion according to an embodiment of this application.

As shown in FIG. 2, a first bit stream includes multiple data units, and each data unit includes one or more bits. A process of round-robin distribution is as follows: A first data unit in the first bit stream is distributed to a channel 1, a second data unit is distributed to a channel 2, . . . , and an $N^{th}$ data unit is distributed to a channel N. An $(N+1)^{th}$ data unit is distributed to the channel 1, an $(N+2)^{th}$ data unit is distributed to the channel 2, . . . , and a $(2N)^{th}$ data unit is distributed to the channel N. The rest may be deduced by analogy, until the last data unit in the first bit stream is distributed to a corresponding channel. Each data unit includes one or more data blocks, and each data block includes one or more bits.

Alternatively, the process of round-robin distribution may be performed in the following manner: A first data unit in the first bit stream is distributed to a channel 1, a second data unit is distributed to a channel 2, . . . , and an $N^{th}$ data unit is distributed to a channel N. In such a manner, each data unit in the first bit stream includes multiple bits.

That, mentioned in the embodiments of this application, a first distribution circuit distributes the first bit stream in an aware manner when performing a distribution operation means that the first distribution circuit performs an alignment operation on the first bit stream, to identify a boundary of each symbol in the first bit stream, and distributes the first bit stream at a same granularity or different granularities according to the identified boundary of each symbol. The first bit stream includes an FEC code word that is obtained after the first bit stream is encoded by the FEC encoding circuit, and the FEC code word includes multiple symbols. The first distribution circuit distributes the first bit stream to a channel P according to a first unit. The first distribution circuit distributes the first bit stream to a channel Q according to a second unit. The first unit is one or more symbols, and the second unit is one or more symbols. The same granularity or different granularities means that a quantity of bits included in the first unit is equal to or is not equal to a quantity of bits included in the second unit. $1 \leq P \leq N-1$, $2 \leq Q \leq N$, $P \neq Q$, and both P and Q are integers.

The first distribution circuit distributes the first bit stream at a same granularity or different granularities. Performing distribution at a same granularity corresponds to a first distribution manner mentioned below. Performing distribution at different granularities corresponds to distributing the first bit stream in a second distribution manner mentioned below. The aware manner helps reduce a bit error rate of data and improve FEC performance in some scenarios.

That, mentioned in the embodiments of this application, a first distribution circuit distributes the first bit stream in a blind manner when performing a distribution operation means that in a blind distribution scenario, the first distribution circuit does not perform the foregoing alignment operation, and does not identify the boundary of each symbol in the first bit stream either. Specifically, the first bit stream includes an FEC code word that is obtained after the first bit stream is encoded by the FEC encoding circuit, and the FEC code word includes multiple symbols. The first distribution circuit distributes the first bit stream to a channel P according to a first unit. The first distribution circuit distributes the first bit stream to a channel Q according to a second unit. The first unit is one or more symbols, and the second unit is one or more symbols. A quantity of bits included in the first unit is equal to or is not equal to a quantity of bits included in the second unit. $1 \leq P \leq N-1$, $2 \leq Q \leq N$, $P \neq Q$, and both P and Q are integers.

That the first distribution circuit distributes the first bit stream to a channel P according to a first unit specifically includes: The first distribution circuit sends a first part of a first symbol to the channel P, where the first unit includes the first part of the first symbol; and the first distribution circuit sends a second part of the first symbol to a channel P+1, where the first symbol includes the first part and the second part. In comparison with the aware distribution manner, in the blind distribution manner, a resource required by the first distribution circuit for performing an alignment operation on the first bit stream can be saved.

The aware manner and the blind manner involved in the embodiments of this application are further described below with reference to FIG. 3 by using examples.

Figure 3:
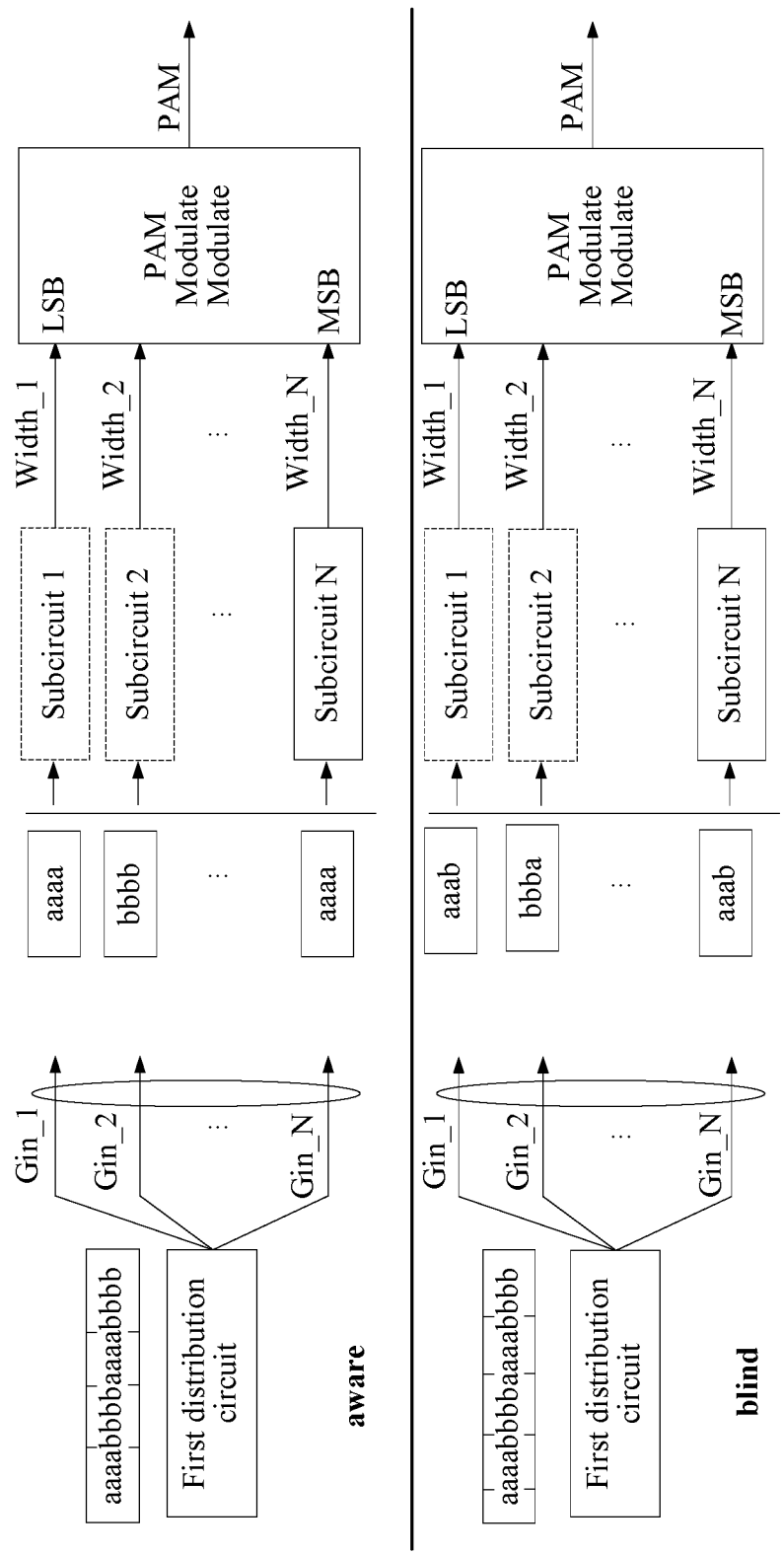
FIG. 3 is a schematic diagram of a distribution scenario according to an embodiment of this application.

As shown in FIG. 3, a bit sequence in a first bit stream is: . . . aaaabbbbaaaabbbb . . . . In an aware distribution scenario, a first distribution circuit is aligned with a first alignment circuit according to boundaries of symbols, to identify a boundary of each symbol and distribute the first bit stream at a same granularity or different granularities. For example, as shown in FIG. 3, the first bit stream is distributed as N data units by using a quantity of bits included in one symbol as a granularity. The N data units are respectively represented by a data unit 1, a data unit 2, . . . , and a data unit N, and aaaa, bbbb, . . . , and aaaa shown in FIG. 3 respectively correspond to the data unit 1, the data unit 2, . . . , and the data unit N. In an example for description in FIG. 3, each data unit includes one symbol and each symbol includes four bits.

In a blind scenario, when distributing a first bit stream, a first distribution circuit does not perform an alignment operation on the received first bit stream, and does not identify boundaries of symbols, but distributes the first bit stream as N data units at a same granularity or different granularities. The N data units are respectively represented by a data unit 1, a data unit 2, . . . , and a data unit N, and aaab, bbba, . . . , and aaab shown in FIG. 3 respectively correspond to the data unit 1, the data unit 2, . . . , and the data unit N.

A person skilled in the art may understand that, in the aware scenario and the blind scenario, alternatively, each symbol may include one bit, 10 bits, or 66 bits, and each data unit may include one bit or multiple bits. This is not limited in this application.

In the embodiments of this application, a first distribution circuit distributes a first bit stream to N channels in a round robin fashion in two manners. In a first distribution manner, the first bit stream is distributed at a same granularity. In a second distribution manner, the first bit stream is distributed at different granularities.

The first distribution manner is described below with reference to FIG. 4.

Figure 4:
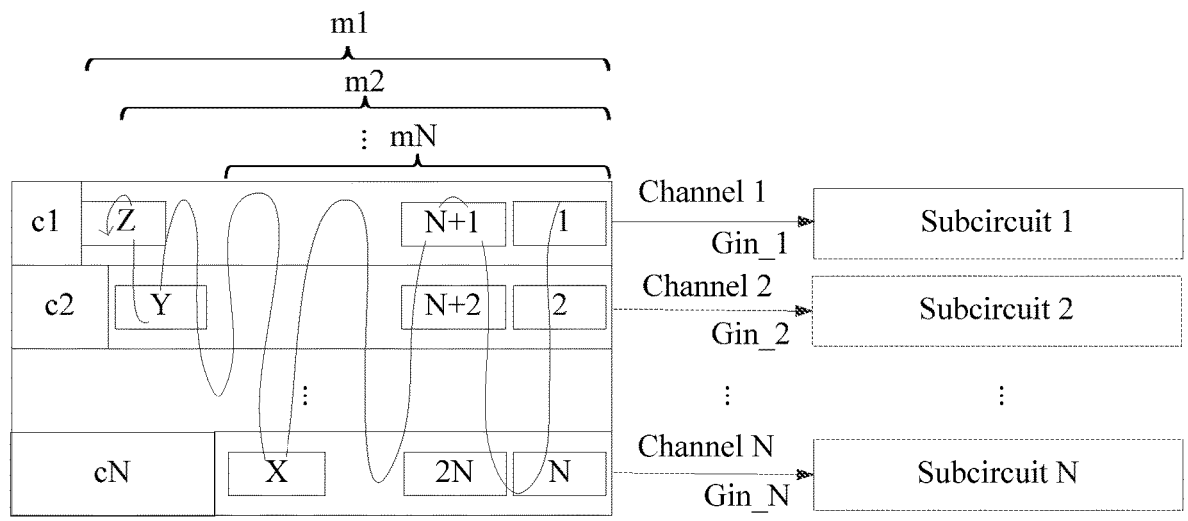
FIG. 4 is a schematic diagram of a first distribution manner according to an embodiment of this application.

As shown in FIG. 4, a first distribution circuit distributes a first bit stream to N channels in a round robin fashion according to a particular granularity and a particular quantity of data blocks. The N channels are respectively represented by channels 1 to N. The first bit stream includes N digital signals, and the N digital signals are respectively represented by digital signals 1 to N. The digital signals 1 to N are respectively transmitted to N subcircuits by using the channels 1 to N. The N subcircuits are respectively represented by subcircuits 1 to N. In some embodiments of this application, all the subcircuits 1 to N may be FEC encoders. Alternatively, some of the subcircuits 1 to N may be FEC encoders, and other circuits may be delayers. The digital signals 1 to N are in a one-to-one correspondence with the channels 1 to N. The channels 1 to N are in a one-to-one correspondence with the subcircuits 1 to N.

In FIG. 4, c1, c2, . . . , and cN are respectively quantities of bits included in encoding parity bits stored in the subcircuits 1 to N. When a subcircuit is a delayer, a quantity of bits included in an encoding parity bit reserved for the delayer is 0, and a coding gain of the delayer is 0. m1, m2, . . . , and mN respectively represent quantities of bits included in information bits of all of the digital signals 1 to N. c1+m1=c2+m2= . . . =cN+mN. Each of the digital signals 1 to N includes multiple data units. Quantities of bits included in all data units in a digital signal i are the same, where i is any integer from 1 to N. Quantities of bits in data units of each of the digital signals 1 to N are respectively G1, G2, . . . , and GN. In the first distribution manner, G1:G2: . . . GN=1:1: . . . 1. That is, the first distribution circuit distributes the first bit stream to the N subcircuits in a round robin fashion at a same distribution granularity. Quantities of data units included in the N digital signals are respectively p1, p2, . . . , and pN. In this embodiment of this application, quantities of bits distributed by the first distribution circuit to the subcircuits 1 to N within a same time slice are respectively Gin_1, Gin_2, . . . , and Gin_N. The following is met: Gin_1:Gin_2: . . . Gin_N=m1:m2: . . . mN=G1×p1:G2×p2: . . . GN×Pn=p1:p2: . . . pN.

The "encoding parity bit" in this application is an FEC code generated when FEC is performed. The "information bit" in this application is information encoded by the FEC encoder when FEC is performed.

The second distribution manner is described below with reference to FIG. 5.

Figure 5:
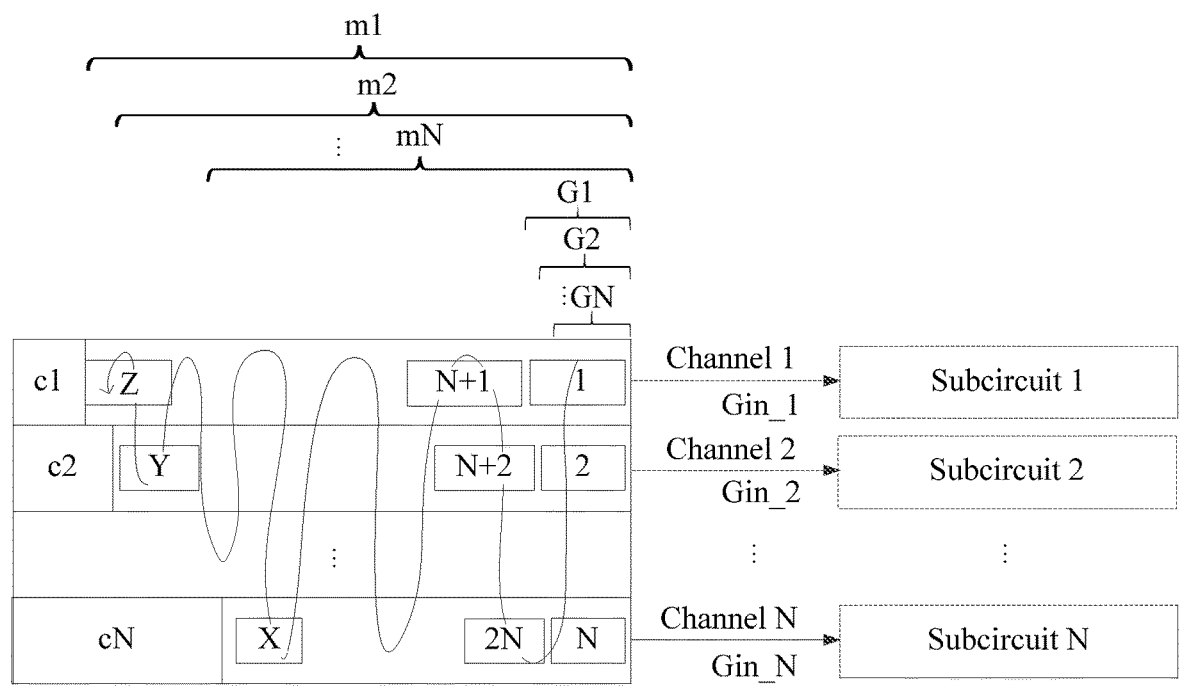
FIG. 5 is a schematic diagram of a second distribution manner according to an embodiment of this application.

As shown in FIG. 5, a first distribution circuit distributes a first bit stream to N channels in a round robin fashion according to a particular granularity and a particular quantity of data blocks. The N channels are respectively represented by channels 1 to N. The first bit stream includes N digital signals, and the N digital signals are respectively represented by digital signals 1 to N. The digital signals 1 to N are respectively transmitted to N subcircuits by using the channels 1 to N. The N subcircuits are respectively represented by subcircuits 1 to N. In some embodiments of this application, all the subcircuits 1 to N may be FEC encoders. Alternatively, some of the subcircuits 1 to N may be FEC encoders, and other circuits may be delayers. The digital signals 1 to N are in a one-to-one correspondence with the channels 1 to N. The channels 1 to N are in a one-to-one correspondence with the subcircuits 1 to N.

In FIG. 5, c1, c2, . . . , and cN respectively correspond to quantities of bits included in encoding parity bits reserved for the subcircuits 1 to N. When a subcircuit is a delayer, a quantity of bits included in an encoding parity bit reserved for the delayer is 0, and a coding gain of the delayer is 0. m1, m2, . . . , and mN respectively represent quantities of bits included in information bits of all of the digital signals 1 to N. c1+m1=c2+m2= . . . =cN+mN. In the digital signals 1 to N, the digital signals 1 to N each include multiple data units. Quantities of bits included in all data units in a digital signal i are the same, where i is any integer from 1 to N. Quantities of bits included in data units of each of the digital signals 1 to N are respectively G1, G2, . . . , and GN. In the second distribution manner, at least two of G1 to GN are different. Optionally, any two of G1 to GN are different. Optionally, G1 to GN are in descending order. That is, the second distribution circuit distributes the first bit stream to the N subcircuits in a round robin fashion at different distribution granularities. A person skilled in the art may understand that G1 to GN may be set according to an actual need. This is not limited in this application. Quantities of data units included in the N digital signals are respectively: p1, p2, . . . , and pN, where p1:p2: . . . pN=1:1: . . . 1. Quantities of bits distributed by the first distribution circuit to the subcircuits 1 to N within a same time slice are respectively Gin_1 to Gin_N. The following is met: Gin_1:Gin_2: . . . Gin_N=m1:m2: mN=G1×p1:G2×p2: GN×Pn=G1:G2: . . . GN.

A specific process of data merging mentioned in the embodiments of this application is described below with reference to FIG. 6 by using examples.

Figure 6:
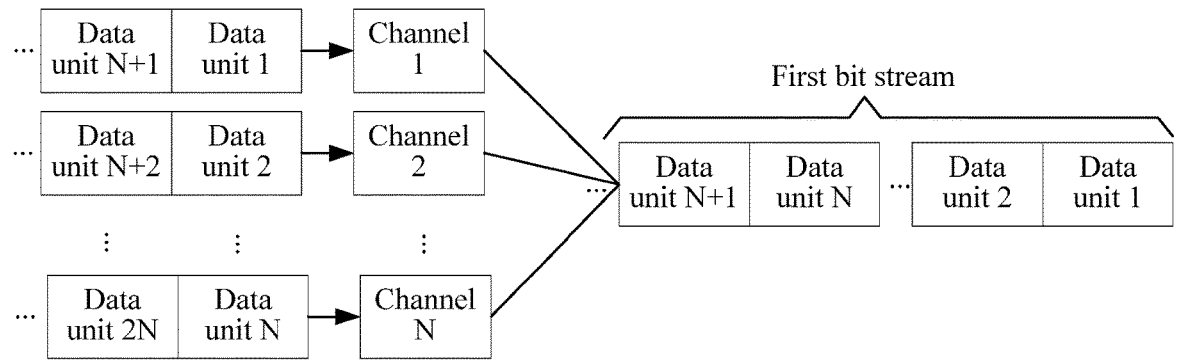
FIG. 6 is a schematic diagram of a data merging method according to an embodiment of this application.

As shown in FIG. 6, channels 1 to N are in a one-to-one correspondence with digital signals 1 to N. Each of the digital signals 1 to N includes multiple data units, and each data unit includes one or more bits. An order of data merging is as follows: A data unit 1 on the channel 1, a data unit 2 on a channel 2, . . . , a data unit N on the channel N, a data unit (N+1) on the channel 1, a data unit (N+2) on the channel 2, . . . , and a data unit 2N on the channel N are sequentially sent, . . . , and so on, until the last data unit on the N channels is sent. In this case, N bit streams on the channels 1 to N are merged into a serial first bit stream.

Alternatively, the process of data merging may be performed in the following manner: A data unit 1 on the channel 1, a data unit 2 on a channel 2, . . . , and a data unit N on the channel N are sequentially sent. In this case, the N data units on the channels 1 to N are merged into a serial first bit stream. In such a manner, each data unit on the channels 1 to N includes multiple bits.

Figure 7:
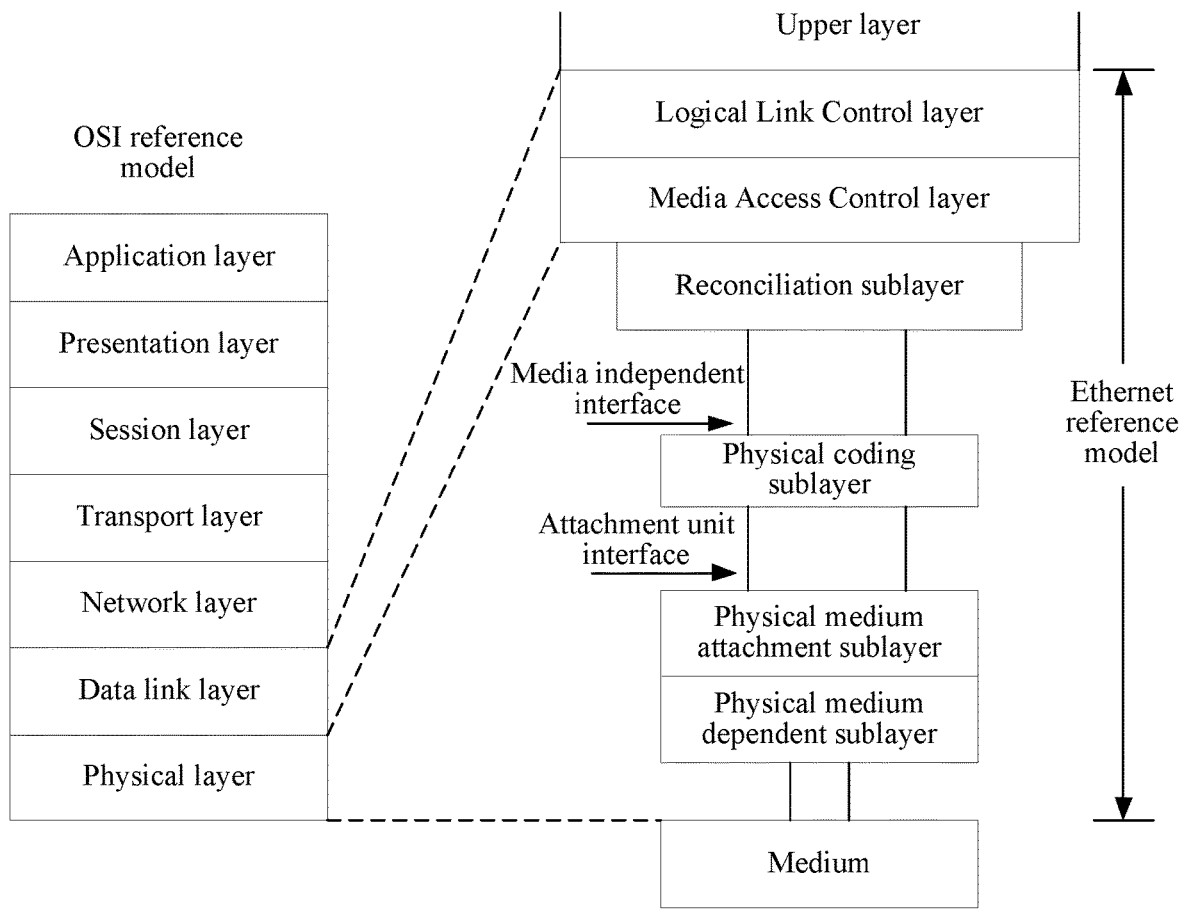
FIG. 7 is a schematic diagram of an Ethernet reference model according to an embodiment of this application.

An application scenario involved in the embodiments of this application is described below with reference to FIG. 7.

An Ethernet of 10 M to a current Ethernet of 100 G have similar architecture models. As shown in FIG. 7, an Ethernet includes: a Logical Link Control (LLC) layer, a Media Access Control (MAC) layer, a reconciliation sublayer (RS), and a physical layer entity (PHY). The PHY includes: a physical coding sublayer (PCS), a physical medium attachment (PMA) sublayer, and a physical medium dependent (PMD) sublayer. The PMA sublayer is located between the PCS and the PMD sublayer. A function of the PMA sublayer is to provide an attachment function between the PCS and the PMD sublayer, so as to attach data from multiple logical channels of the PCS to a channel of the PMD, and attach data from multiple channels of the PMD sublayer to multiple logical channels at the PCS.

The PCS is connected to the PMA sublayer by using an attachment unit interface (AUI). The AUI is a physical interface. For example, for an Ethernet of 400 G, the AUI interface is a 400 G unit interface (400 Gigabit Attachment Unit Interface, CDAUI). "CD" in "CDAUI" is a Roman numeral for "400". Using a scenario in which the PCS distributes an FEC code word to 16 logical channels as an example, the CDAUI interface may be defined as the following types.

A CDAUI-16 includes 16 electrical channels, has a bandwidth of 25 G, and is used for transmitting an electrical signal.

A CDAUI-8 includes eight electrical channels, has a bandwidth of 50 G, and is used for transmitting an electrical signal.

A CDAUI-4 includes four electrical channels, has a bandwidth of 100 G, and is used for transmitting an electrical signal.

In this embodiment of this application, the electrical channel is an electrical channel of the attachment unit interface (AUI).

The LLC layer and the MAC layer are located at a data link layer in an open systems interconnection (OSI) reference model. The RS and the PHY are located at a physical layer of the OSI reference model. In other embodiments, a MAC control layer may further be included between the LLC layer and the MAC layer.

The RS is connected to the PCS by using a media independent interface (MII). The MII is a logical interface between the RS and the PCS. For example, for a 400 G Ethernet interface, the MII is a 400 G media independent interface (400 Gigabit Media Independent Interface, CDMII).

For line encoding mentioned in this embodiment of this application, 64B/66B encoding, 256B/257B encoding, or 512B/513B encoding may be used. "B" in the "64B/66B encoding", "256B/257B encoding", and "512B/513B encoding" refers to a bit. After line encoding, data from the MAC layer becomes multiple serial data code blocks. The data code blocks have a same size, and this depends on an encoding manner used in the line encoding. For example, if 64B/66B encoding is used in the line encoding, a size of a data code block obtained after encoding is 66 bits. The data code block may also be referred to as a 66B code block.

In this embodiment of this application, the RS converts serial data that is from the MAC layer into parallel Ethernet data that matches the MII, sends the parallel data to the PCS by using the media independent interface MII, and then performs, at the PCS, line encoding on the data that is transmitted by the MII, to obtain serial data code blocks.

Figure 8:
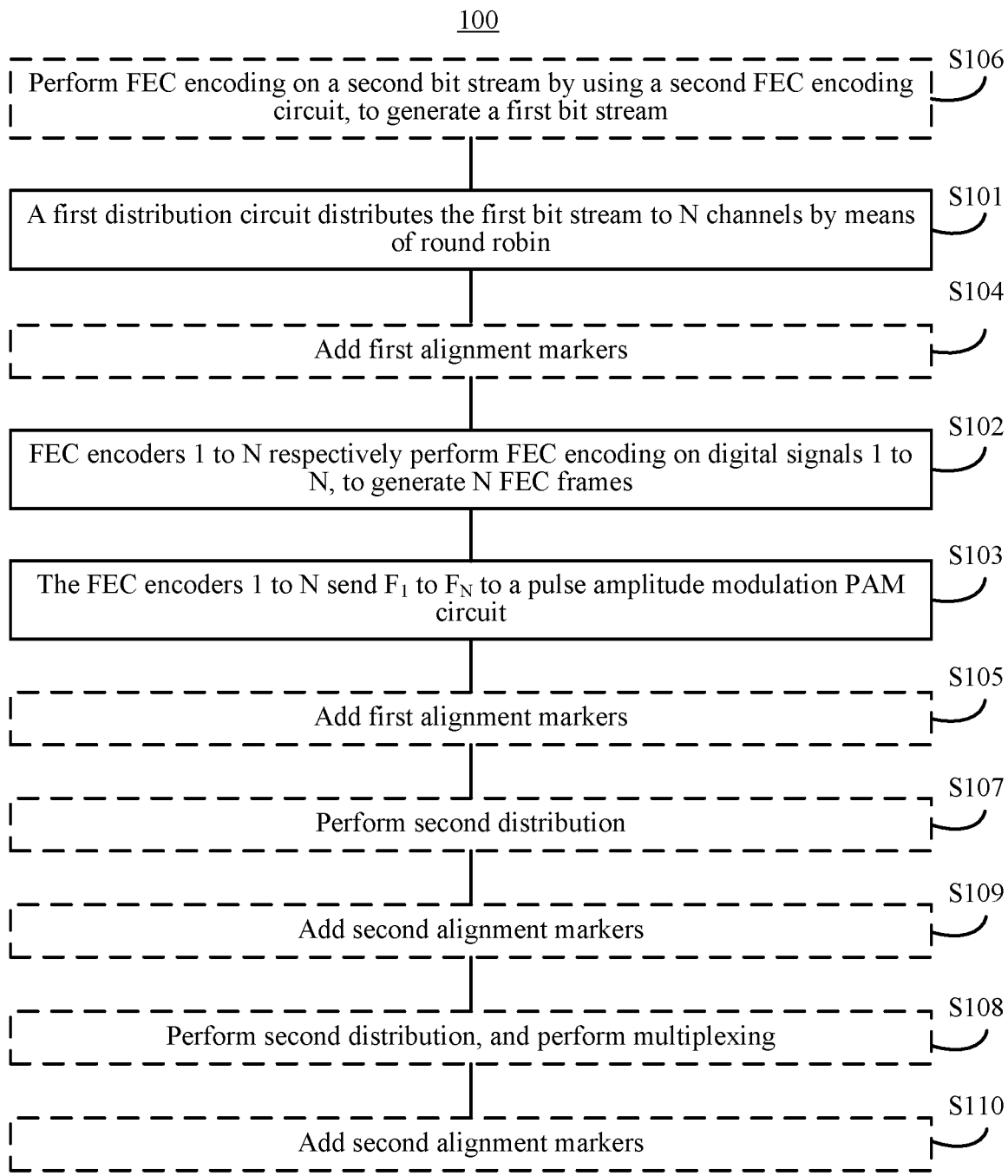
FIG. 8 is a flowchart of a data processing method according to an embodiment of this application.

A data processing method 100 in an Ethernet according to an embodiment of this application is described in detail below with reference to FIG. 8. The method 100 is performed by a transmitter circuit in an Ethernet interface. The transmitter circuit may be the PHY shown in FIG. 7. The transmitter circuit includes a first distribution circuit and a first forward error correction encoding circuit. This embodiment of this application can be implemented in a PHY of an Ethernet above 100 G. A person skilled in the art may understand that this embodiment of this application is also applicable to an Ethernet below 100 G.

S101. The first distribution circuit distributes a first bit stream to N channels in a round robin fashion.

In a specific implementation manner, an RS converts serial Ethernet data that is from a MAC layer into parallel Ethernet data that matches an MII, and sends the parallel Ethernet data to a PCS in the PHY by using the MII. Then the PCS performs line encoding on the data that is transmitted by the MIT, to obtain serial data code blocks, that is, the first bit stream.

In another specific implementation manner, an RS converts serial Ethernet data that is from a MAC layer into parallel Ethernet data that matches an MII, and sends the parallel Ethernet data to a PCS in the PHY by using the MII. Then the PCS performs line encoding on the data that is transmitted by the MII, to obtain a second bit stream. A second FEC encoding circuit performs FEC encoding on the second bit stream, to obtain the first bit stream.

The first distribution circuit receives the first bit stream, and distributes the first bit stream to the N channels in a round robin fashion. Optionally, the first distribution circuit may distribute the first bit stream in the first distribution manner shown in FIG. 4 or the second distribution manner shown in FIG. 5. The first distribution circuit sends the second bit stream to a channel P according to a first unit. The first distribution circuit sends the second bit stream to a channel Q according to a second unit. A quantity of bits included in the first unit is equal to or is not equal to a quantity of bits included in the second unit. $1 \leq P \leq N-1$, $2 \leq Q \leq N$, $P \neq Q$, and both P and Q are integers.

The N channels are respectively represented by channels 1 to N. The first bit stream includes N digital signals, and the N digital signals are respectively represented by digital signals 1 to N. The digital signals 1 to N are respectively transmitted to N FEC encoders in the first FEC encoding circuit by using the channels 1 to N. The N FEC encoders are respectively represented by FEC encoders 1 to N. The digital signals 1 to N are in a one-to-one correspondence with the channels 1 to N, and the channels 1 to N are in a one-to-one correspondence with the FEC encoders 1 to N.

In a specific implementation manner, for example, the first distribution circuit distributes the first bit stream to two channels in a round robin fashion. The first bit stream is 101010 . . . 101010101010, the digital signal 1 is 000 . . . 000000, and a digital signal 2 is 111 . . . 111111. At a same moment, the digital signal 1 and the digital signal 2 are respectively transmitted to the FEC encoder 1 and an FEC encoder 2 of the first FEC encoding circuit by using a channel 1 and a channel 2.

S102. FEC encoders 1 to N respectively perform FEC encoding on digital signals 1 to N, to generate N FEC code words.

The FEC encoders 1 to N respectively receive the digital signals 1 to N. The FEC encoders 1 to N respectively perform FEC encoding on the digital signals 1 to N, to generate the N FEC code words. The N FEC code words are respectively represented by $F_1$ to $F_N$, and the digital signals 1 to N are in a one-to-one correspondence with $F_1$ to $F_N$.

S103. The FEC encoders 1 to N send $F_1$ to $F_N$ to a pulse amplitude modulation PAM circuit.

The FEC encoders 1 to N send $F_1$ to $F_N$ to the pulse amplitude modulation PAM circuit. The PAM circuit is configured to: modulate $F_1$ to $F_N$, to generate a modulation signal, and send the modulation signal to a receiver circuit. For a specific modulation process of the PAM circuit, refer to specific description of a modulation manner of the modulator shown in FIG. 1 in this specification. Details are not described herein. $F_1$ to $F_N$ are an input signal of the PAM circuit. $F_1$ to $F_N$ are in a one-to-one correspondence with a least significant bit to a most significant bit of the input signal.

Usually, a signal that is output after the PAM circuit modulates a digital signal corresponding to the least significant bit has relatively low amplitude. Therefore, the digital signal corresponding to the least significant bit has a relatively high bit error rate. A signal that is output after the PAM circuit modulates a digital signal corresponding to the most significant bit has relatively high amplitude. Therefore, the digital signal corresponding to the most significant bit has a relatively low bit error rate.

Optionally, in S102, an FEC encoder X performs FEC encoding on a digital signal X, and an FEC encoder Y performs FEC encoding on a digital signal Y. Coding gains of the FEC encoders 1 to N are respectively represented by $G_1$ to $G_N$, a coding gain of the FEC encoder X is represented by $G_X$, a coding gain of the FEC encoder Y is represented by $G_Y$, $G_X > G_Y$, $1 \leq X \leq Y \leq N$, $N \geq 2$, and X, Y, and N are all integers. FEC encoders with different coding gains correspond to digital signals with different bit error rates. An FEC encoder with a high gain corresponds to a digital signal with a high bit error rate, and an FEC encoder with a low gain corresponds to a digital signal with a low bit error rate. In this way, FEC with a relatively high gain covers data that easily encounters a bit error on a link. FEC with different gains is used, so that chip resources occupied by FEC are reduced, and implementation complexity of an entire system is reduced.

Further optionally, $G_1 > G_N$, that is, a coding gain of the FEC encoder 1 is greater than a coding gain of the FEC encoder N. In this embodiment of this application, $G_1 > G_N$. In this way, data with a relatively high bit error rate is corrected by using relatively complex FEC, and data with a relatively low bit error rate may be corrected by using relatively simple FEC. Therefore, system complexity is reduced, and chip resources occupied by FEC are reduced.

Further optionally, $G_1$ is greater than or equal to each coding gain in $G_2$ to $G_{N-1}$. When N=3, $G_2=G_{N-1}$. In the foregoing manner, chip resources occupied by FEC are further reduced, and implementation complexity of a system is reduced.

Optionally, KR4-FEC encoding, KP4-FEC encoding, Reed-Solomon (RS) forward error correction code RS-FEC ($n_1$, $k_1$, $t_1$, and m) encoding, or BCH-FEC ($n_3$, $k_3$, and $t_3$) encoding may be used by the FEC encoders 1 to N. Alternatively, any combination of KR4-FEC encoding, KP4-FEC encoding, Reed-Solomon (RS) forward error correction code RS-FEC ($n_1$, $k_1$, $t_1$, and m) encoding, or BCH-FEC ($n_3$, $k_3$, and $t_3$) encoding may be used.

Figure 9:
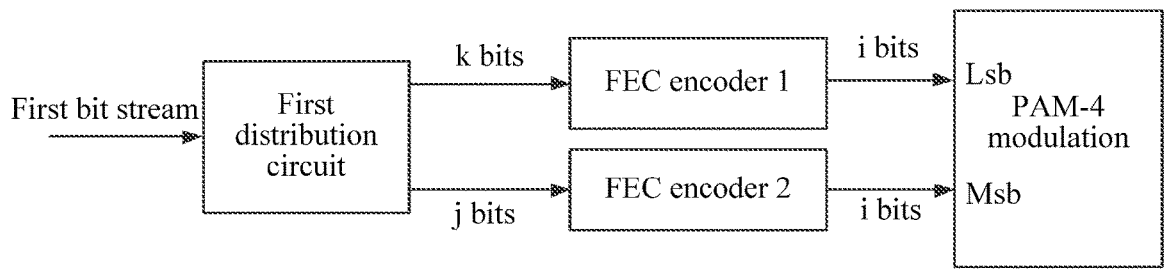
FIG. 9 is a schematic diagram of a data processing method according to an embodiment of this application.
Figure 11:
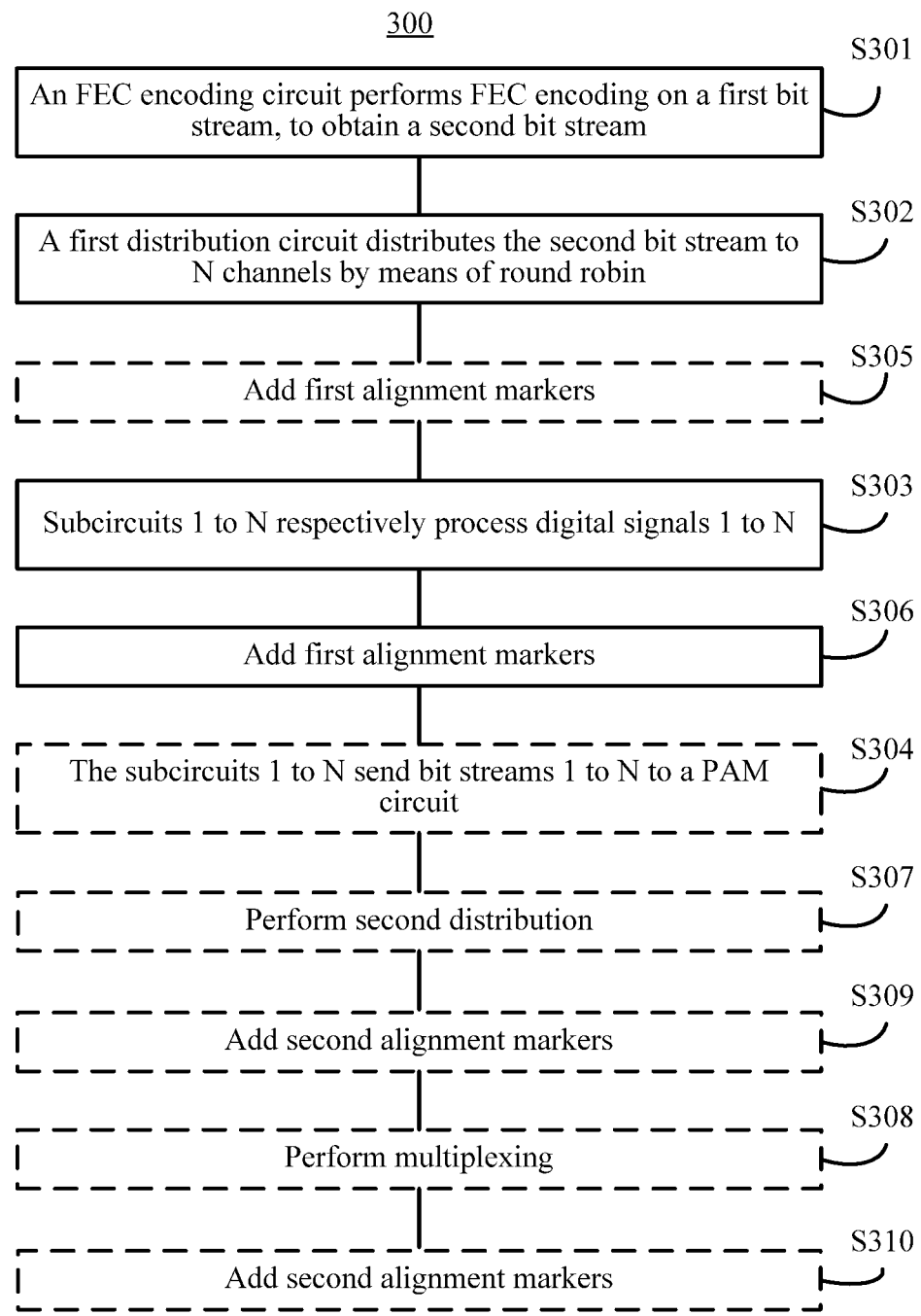
FIG. 11 is a flowchart of a data processing method according to still another embodiment of this application.

FEC encoding used by the first FEC encoding circuit is described below with reference to FIG. 9 by using examples. As shown in FIG. 11, the first FEC encoding circuit uses an FEC encoder 1 and an FEC encoder 2 to respectively perform FEC encoding on a digital signal 1 and a digital signal 2. An input bit width of the FEC encoder 1 is k bits, and an output bit width is i bits after the FEC encoder 1 performs error correction encoding. An input bit width of the FEC encoder 2 is j bits, and an output bit width is i bits after the FEC encoder performs error correction encoding. j<k<i, i>0, j>0, k>0, and i, j, and k are all integers.

For example, RS-FEC ($n_1$, $k_1$, $t_1$, and m) encoding is used by the FEC encoder 1, and RS-FEC ($n_2$, $k_2$, $t_2$, and m) encoding is used by the FEC encoder 2. In the foregoing example, k is a natural number that can be exactly divided by $k_1 \times m$ or can exactly divide $k_1 \times m$, j is a natural number that can be exactly divided by $k_2 \times m$ or can exactly divide $k_2 \times m$, and i is a natural number that can be exactly divided by $n_1 \times m$ or can exactly divide $n_1 \times m$, and i further needs to be a natural number that can be exactly divided by $n_2 \times m$ or can be exactly divided by $n_2 \times m$.

RS (288, 240, 24, and 10) encoding, RS (272, 256, t=8, and m=10) encoding, or the like may be specifically used by the FEC encoder 1. RS (528, 514, t=7, and m=10) encoding, RS (544, 514, t=15, and m=10) encoding, or the like may be specifically used by the FEC encoder 2. Alternatively, other types of encoding may be used. This is not limited in this application.

For example, BCH-FEC ($n_3$, $k_3$, and $t_3$) encoding is used by the FEC encoder 1, and BCH-FEC ($n_4$, $k_4$, and $t_4$) encoding is used by the FEC encoder 2, where k is a natural number that can be exactly divided by $k_3$ or can exactly divide $k_3$, j is a natural number that can be exactly divided by $k_4$ or can exactly divide $k_4$, and i is a natural number that can be exactly divided by $n_3$ or can exactly divide $n_3$, and i further needs to be a natural number that can be exactly divided by $n_4$ or can be exactly divided by $n_4$.

BCH (2960, 2480, and 48) encoding, BCH (2880, 2560, and 32) encoding, or the like may be specifically used by the FEC encoder 1. BCH (5920, 4960, and 96) encoding, BCH (5760, 5120, and 64) encoding, or the like may be specifically used by the FEC encoder 2. Alternatively, other types of encoding may be used. This is not limited in this application.

In another specific implementation manner, the transmitter circuit further includes a first alignment marker (AM) addition circuit. After S101 and before S102, the method 100 further includes S104: The first alignment marker addition circuit respectively adds first alignment markers 1 to N to the digital signals 1 to N, where the digital signals 1 to N are in a one-to-one correspondence with the first alignment markers 1 to N, the first alignment markers 1 to N are in a one-to-one correspondence with $F_1$ to $F_N$, and the first alignment markers 1 to N are used for determining boundaries of $F_1$ to $F_N$.

The first alignment markers described in this application refer to alignment markers included in the digital signals 1 to N.

In another specific implementation manner, after the FEC encoders 1 to N send $F_1$ to $F_N$ to the PAM circuit, that is, after S103, the method further includes S105: The first alignment marker addition circuit receives $F_1$ to $F_N$, and respectively adds first alignment markers 1 to N to $F_1$ to $F_N$, where the first alignment markers 1 to N are in a one-to-one correspondence with $F_1$ to $F_N$, and the first alignment markers 1 to N are used for determining boundaries of $F_1$ to $F_N$.

The first alignment marker addition circuit may be integrated with the first distribution circuit. Alternatively, the first alignment marker addition circuit and the first distribution circuit may be two circuits disposed independently from each other. This is not limited in this application.

The first alignment marker addition circuit respectively adds the first alignment markers 1 to N to the digital signals 1 to N at a same moment.

In the embodiments of this application, patterns of the first alignment markers 1 to N may be existing patterns of alignment markers at the PCS or variations of the patterns of the alignment markers, or may be redefined patterns. For example, the redefined pattern may include multiple pieces of eight-byte data. The data includes information such as a level of a corresponding PAM circuit, or a modulation number of the PAM circuit. Alternatively, a negation operation may be used to maintain direct current balance, so that direct current balance of an entire AM is maintained. The patterns of the first alignment markers are not limited in this application, provided that after the first alignment markers are added, the receiver circuit can align, by using received data and by using the patterns of the first alignment markers, different digital signals that correspond to a same level, and an original format in which a digital signal is received can be restored.

In the following example, the PAM circuit modulates data in an FEC code word by using two modulators, so as to describe addition of a first alignment marker corresponding to data of the $X^{th}$ level (X is between a least significant bit and a most significant bit) in the modulators.

The following definitions are provided for a first alignment marker of the first modulator after distribution.

AM_pattern_for_PAM1[7:0]=01010101, which is a special pattern and represents a start marker of the AM.

AM_pattern_for_PAM1[15:8]=8'h1, which represents the first PAM modulation signal.

AM_pattern_for_PAM1[23:16]=8'hN, which represents the $N^{th}$ level of the first PAM modulation signal.

AM_pattern_for_PAM1[31:24]=8'hxxxx, which represents other information.

AM_pattern_for_PAM1[63:32]=~AM_pattern_for_PAM1[31:0], which indicates that negation is performed to maintain direct current balance.

The following definitions are provided for a first AM of the second modulator after distribution.

AM_pattern_for_PAM2[7:0]=01010101, which is a special pattern and represents a start marker of the AM.

AM_pattern_for_PAM2[15:8]=8'h1, which represents the second PAM modulation signal.

AM_pattern_for_PAM2[23:16]=8'hN, which represents the $N^{th}$ level of the second PAM modulation signal.

AM_pattern_for_PAM2[31:24]=8'hxxxx, which represents other information.

AM_pattern_for_PAM2[63:32]=~AM_pattern_for_PAM2[31:0], which indicates that negation is performed to maintain direct current balance.

The foregoing "8'h1", "8'hN", and "8'hxxxx" represent eight-bit binary data.

A case of a PAM circuit including another quantity of modulators may be deduced by analogy. Details are not described in this application.

In a specific implementation manner of this application, the first distribution circuit and the first FEC encoding circuit may be located in a PCS chip, and the PAM circuit may be located in a PAM sublayer chip. Optionally, when the second FEC encoding circuit is configured, the second FEC encoding circuit may be located in the PCS chip.

In another specific implementation manner of this application, the first distribution circuit, the first FEC encoding circuit, and the PAM circuit may be all located in the PCS chip. Optionally, when the second FEC encoding circuit is configured, the second FEC encoding circuit is also located in the PCS chip.

In still another specific implementation manner of this application, the first distribution circuit, the first FEC encoding circuit, and the PAM circuit may be all located in the PAM sublayer chip. Optionally, when the second FEC encoding circuit is configured, the second FEC encoding circuit may be located in the PCS chip or the PAM sublayer chip.

In another specific implementation manner of this application, before S101, the method may further include S106: Perform FEC encoding on a second bit stream by using the second FEC encoding circuit, to generate the first bit stream.

The first bit stream generated in S106 includes an FEC code word, and the FEC code word includes multiple symbols. The first distribution circuit sends the first bit stream to the channel P according to the first unit. The first distribution circuit sends the first bit stream to the channel Q according to the second unit. A quantity of bits included in the first unit is equal to or is not equal to a quantity of bits included in the second unit. $1 \leq P \leq N-1$, $2 \leq Q \leq N$, $P \neq Q$, and both P and Q are integers.

Optionally, the first unit is one or more symbols, and the second unit is one or more symbols.

Optionally, the first distribution circuit sends a first part of a first symbol to the channel P, and the first unit includes the first part of the first symbol. The first distribution circuit sends a second part of the first symbol to a channel P+1. The first symbol includes the first part and the second part.

In another specific implementation manner of this application, the PAM circuit includes M modulators, and the transmitter circuit further includes a second distribution circuit. After S103, the method further includes S107:

the second distribution circuit receives $F_1$ to $F_N$;

the second distribution circuit distributes $F_1$ to $F_N$, to obtain N×M bit streams, where the N×M bit streams are represented by $BS_{11}$ to $BS_{NM}$, $F_i$ corresponds to $BS_{i1}$ to $BS_{iM}$, and values of i are all integers from 1 to N; and the second distribution circuit respectively sends $BS_{i1}$ to $BS_{iM}$ to the M modulators, where $BS_{i1}$ to $BS_{iM}$ are in a one-to-one correspondence with the M modulators, the M modulators are respectively configured to modulate $BS_{i1}$ to $BS_{iM}$, and M is an integer greater than or equal to 2. That the second distribution circuit distributes $F_1$ to $F_N$, to obtain N×M bit streams specifically includes: The second distribution circuit distributes each FEC code word in $F_1$ to $F_N$ as M bit streams, to obtain the N×M bit streams.

$BS_{i1}$ to $BS_{iM}$ are obtained by distributing F. $F_1$ includes $BS_{i1}$ to $BS_{iM}$. Each of the M modulators receives only one of $BS_{i1}$ to $BS_{iM}$.

In this implementation manner, multiple modulators are used to modulate multiple bit streams, so as to meet a transmission rate requirement of a high-rate Ethernet.

In another specific implementation manner, the PAM circuit includes M modulators, and the transmitter circuit further includes a second distribution circuit and a multiplexing circuit. After S103, the method further includes S108:

the second distribution circuit receives $F_1$ to $F_N$;

the second distribution circuit distributes $F_1$ to $F_N$, to obtain N×P bit streams, where the N×P bit streams are represented by $AS_{11}$ to $AS_{NP}$, $F_i$ corresponds to $AS_{i1}$ to $AS_{iP}$, and values of i are all integers from 1 to N;

the multiplexing circuit multiplexes the N×P bit streams $AS_{11}$ to $AS_{NP}$ into N×M bit streams, where the N×M bit streams are represented by $BS_{11}$ to $BS_{NM}$, $F_i$ corresponds to $BS_{i1}$ to $BS_{iM}$, and values of i are all integers from 1 to N; and the multiplexing circuit respectively sends $BS_{i1}$ to $BS_{iM}$ to the M modulators, where $BS_{i1}$ to $BS_{iM}$ are in a one-to-one correspondence with the M modulators, the M modulators are respectively configured to module $BS_{i1}$ to $BS_{iM}$, $P \geq M$, P is an integer multiple of M, and M is an integer greater than or equal to 2.

That the second distribution circuit distributes $F_1$ to $F_N$, to obtain N×P bit streams specifically includes: The second distribution circuit distributes each FEC code word in $F_1$ to $F_N$ as P bit streams, to obtain the N×P bit streams.

That the multiplexing circuit multiplexes the N×P bit streams $AS_{11}$ to $AS_{NP}$ into N×M bit streams specifically includes: The multiplexing circuit divides every P bit streams into M groups, where each group of bit streams includes P/M bit streams; and multiplexes the P/M bit streams in each group into one bit stream. For example, the second distribution circuit distributes each FEC code word as 16 pieces of data, and the multiplexing circuit divides the 16 pieces of data into four groups. Each group includes four pieces of data, and the four pieces of data in each group are multiplexed into one piece of data in a round robin fashion. The multiplexing circuit separately performs the foregoing operations on the N×P bit streams, to obtain the N×M bit streams.

$AS_{i1}$ to $AS_{iP}$ are obtained by distributing $F_i$. $F_i$ includes $AS_{i1}$ to $AS_{iP}$. Each of the M modulators receives only one of $AS_{i1}$ to $AS_{iP}$.

In this implementation manner, the foregoing multiplexing circuit is used, so that the first FEC encoding circuit and the PAM circuit may be separately disposed on two chips, and a person skilled in the art can set the first FEC encoding circuit in such a manner that the first FEC encoding circuit includes multiple FEC encoders and outputs multiple FEC code words, for example, 16 FEC code words. According to a quantity of modulators that need to be used, data is transmitted between an FEC encoding circuit and a modulator by using a multiplexer, so that flexibility of disposing a circuit is improved. A person skilled in the art may understand that the first FEC encoding circuit may output eight FEC code words, four FEC code words, or the like. The quantity of modulators may be set according to a requirement for a data processing rate. This is not limited in this application.

In a specific implementation manner of this application, the transmitter circuit may further include a second alignment marker addition circuit. After that the second distribution circuit respectively sends $BS_{i1}$ to $BS_{iM}$ to the M modulators, the method further includes S109:

the second alignment marker addition circuit receives $BS_{11}$ to $BS_{NM}$; and the second alignment marker addition circuit respectively adds N×M second alignment markers to $BS_{11}$ to $BS_{NM}$, where the N×M second alignment markers are represented by $AM_{11}$ to $AM_{NM}$, $BS_{11}$ to $BS_{NM}$ are in a one-to-one correspondence with $AM_{11}$ to $AM_{NM}$, and $AM_{11}$ to $AM_{NM}$ are used for determining boundaries of $BS_{11}$ to $BS_{NM}$.

In another specific implementation manner of this application, the transmitter circuit further includes a second alignment marker addition circuit. After that the multiplexing circuit sends $BS_{i1}$ to $BS_{iM}$ to the M modulators, the method further includes S110:

the second alignment marker addition circuit receives $BS_{11}$ to $BS_{NM}$; and the second alignment marker addition circuit respectively adds N×M second alignment markers to $BS_{11}$ to $BS_{NM}$, where the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

The second alignment marker addition circuit may be integrated with the second distribution circuit. Alternatively, the second alignment marker addition circuit and the second distribution circuit may be two circuits disposed independently from each other. This is not limited in this application.

The second alignment markers described in this application refer to alignment markers included in $BS_{11}$ to $BS_{NM}$.

The receiver circuit performs data alignment on $BS_{11}$ to $BS_{NM}$ by using the N×M second alignment markers, and after determining that boundaries of all data are aligned, further restores, by using a reverse process of second distribution, a data format that is used before the distribution. Second alignment markers are added at a same moment by using each piece of data as one group. The second alignment marker addition circuit respectively adds the N×M second alignment markers to $BS_{11}$ to $BS_{NM}$ in a same manner as the first alignment marker addition circuit adds N first alignment markers to the N FEC code words. Details are not described herein.

A data processing method 200 in an Ethernet according to an embodiment of this application is described in detail below with reference to FIG. 10. The method 200 is performed by a receiver circuit in an Ethernet interface. The receiver circuit includes a first forward error correction FEC decoding circuit and a first data merging circuit. The receiver circuit may be the PHY shown in FIG. 7. For example, the method shown in FIG. 10 and the method shown in FIG. 8 may form a complete technical solution, so as to implement FEC encoding and FEC decoding. Specifically, the method shown in FIG. 10 may be used to restore the first bit stream involved in S101 in FIG. 8. The method 200 includes the following steps.

S201. N FEC decoders of the first FEC decoding circuit respectively receive N bit streams output by a pulse amplitude demodulation circuit.

The pulse amplitude demodulation circuit receives a data signal sent by a transmitter circuit, demodulates the data signal into N bit streams, and sends the N bit streams to the first FEC decoding circuit. The N bit streams are respectively represented by bit streams 1 to N. The bit streams 1 to N are in a one-to-one correspondence with a least significant bit to a most significant bit of an output signal of the pulse amplitude demodulation circuit. The N FEC decoders are respectively represented by FEC decoders 1 to N. The FEC decoders 1 to N are in a one-to-one correspondence with the bit streams 1 to N. N is an integer greater than or equal to 2.

S202. FEC decoders 1 to N respectively perform FEC decoding on bit streams 1 to N, to obtain N digital signals.

An FEC decoder X performs FEC decoding on a bit stream X, and an FEC decoder Y performs FEC decoding on a bit stream Y. The N digital signals are respectively represented by digital signals 1 to N. The digital signals 1 to N are in a one-to-one correspondence with the FEC decoders 1 to N. Coding gains of the FEC decoders 1 to N are respectively represented by $G_1$ to $G_N$. A coding gain of the FEC decoder x is represented by $G_X$, and a coding gain of the FEC decoder Y is represented by $G_Y$. $G_X > G_Y$, $1 \leq X \leq Y \leq N$, $N \geq 2$, and X, Y, and N are all integers.

In an optional implementation manner, $G_1 > G_N$, that is, a coding gain of the FEC decoder 1 is greater than a coding gain of the FEC decoder N. The pulse amplitude demodulation circuit sends the bit stream 1 to the FEC decoder 1, and the pulse amplitude demodulation circuit sends the bit stream N to the FEC decoder N. The bit stream 1 and the bit stream N are an output signal of the pulse amplitude demodulation circuit. The bit stream 1 corresponds to a least significant bit of the output signal, and the bit stream N corresponds to a most significant bit of the output signal. Generally, in an output signal that is obtained after an input signal is demodulated by the pulse amplitude demodulation circuit, a bit error rate of an output signal corresponding to a least significant bit is the highest, and a bit error rate of an output signal corresponding to a most significant bit is the lowest.

In this embodiment of this application, $G_1 > G_N$. Therefore, data with a highest bit error rate is corrected by using relatively complex FEC, and data with a lowest bit error rate is corrected by using relatively simple FEC, so that system complexity is reduced, and chip resources occupied by FEC are reduced.

Optionally, $G_1$ is greater than or equal to each coding gain in $G_2$ to $G_{N-1}$. When N=3, $G_2=G_{N-1}$. In the foregoing manner, chip resources occupied by FEC are further reduced, and implementation complexity of a system is reduced.

The FEC decoders 1 to N select a corresponding code type according to an encoding code type used by the FEC encoders 1 to N in the transmitter circuit, to perform FEC decoding. That is, a process in which the FEC encoders 1 to N perform FEC decoding on the bit streams 1 to N is a reverse process of S102 in the method 100. Details are not described herein.

S203. The FEC decoders 1 to N respectively send digital signals 1 to N to the first data merging circuit.

S204. The first data merging circuit specifically selects a corresponding merging manner according to a distribution manner used by a first distribution circuit in a transmitter circuit. S204 in the method 200 is a reverse process of S101 in the method 100. Details are not described herein.

In an optional implementation manner, the receiver circuit further includes a first alignment marker identification circuit. Before that N FEC decoders of the first FEC decoding circuit respectively receive N bit streams output by a pulse amplitude demodulation circuit, the method further includes S205:

the first alignment marker identification circuit identifies an alignment markers 1 to N included in the bit streams 1 to N, where the bit streams 1 to N are in a one-to-one correspondence with a comparison marker 1 to an alignment marker N; and determines boundaries of the bit streams 1 to N based on the alignment markers 1 to N.

Step 205 is reverse processing of step 104 or step 105. Details are not described herein.

In an optional implementation manner, the receiver circuit further includes a second FEC decoding circuit. After the first data merging circuit merges the digital signals 1 to N into a serial first bit stream, the method further includes S206:

the second FEC decoding circuit performs second FEC decoding on the serial first bit stream, to obtain a second bit stream.

Step 206 is reverse processing of step 106. Details are not described herein.

In a specific implementation manner, the receiver circuit further includes a second data merging circuit, and the pulse amplitude demodulation circuit includes M demodulators. Before that N FEC decoders of the first FEC decoding circuit respectively receive N bit streams output by a pulse amplitude demodulation circuit, the method further includes S207:

the second data merging circuit receives N×M bit streams output by the M demodulators, where the N×M bit streams are represented by $BS_{11}$ to $BS_{NM}$, a bit stream i corresponds to $BS_{i1}$ to $BS_{iM}$, and values of i are all integers from 1 to N; and the second data merging circuit merges $BS_{i1}$ to $BS_{iM}$ into the bit stream i, where $BS_{i1}$ to $BS_{iM}$ are in a one-to-one correspondence with the M demodulators, and M is an integer greater than or equal to 2.

Step 207 is reverse processing of step 107. Details are not described herein.

In another specific implementation manner, the receiver circuit further includes a demultiplexing circuit and a second data merging circuit, and the pulse amplitude demodulation circuit includes M demodulators. Before that N FEC decoders of the first FEC decoding circuit respectively receive N bit streams output by a pulse amplitude demodulation circuit, the method further includes S208:

the demultiplexing circuit receives N×M bit streams output by the M demodulators, where the N×M bit streams are represented by $BS_{11}$ to $BS_{NM}$; and demultiplexes the N×M bit streams $BS_{11}$ to $BS_{NM}$ into N×P bit streams, where the N×P bit streams are represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2;

the second data merging circuit receives $AS_{11}$ to $AS_{NP}$; and the second data merging circuit merges $AS_{i1}$ to $AS_{iP}$ into the bit stream i, where the bit stream i corresponds to $AS_{i1}$ to $AS_{iP}$, values of i are all integers from 1 to N, P≥M, P is an integer multiple of M, and M is an integer greater than or equal to 2.

Step 208 is reverse processing of step 108. Details are not described herein.

In still another specific implementation manner, the receiver circuit further includes a second alignment marker AM identification circuit. Before that N FEC decoders of the first FEC decoding circuit respectively receive N bit streams output by a pulse amplitude demodulation circuit, the method further includes S209:

the second AM identification circuit identifies N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determines a boundary of each bit stream of $BS_{11}$ to $BS_{NM}$ based on $AM_{11}$ to $AM_{NM}$.

Step 209 is reverse processing of step 109. Details are not described herein.

Another data processing method 300 in an Ethernet according to an embodiment of this application is described in detail below with reference to FIG. 11. The method is performed by a transmitter circuit in an Ethernet interface. The transmitter circuit may be the PHY shown in FIG. 7. This embodiment of this application can be implemented in a PHY of an Ethernet above 100 G. However, a person skilled in the art may understand that this embodiment of this application can also be implemented in an Ethernet below 100 G.

Figure 10:
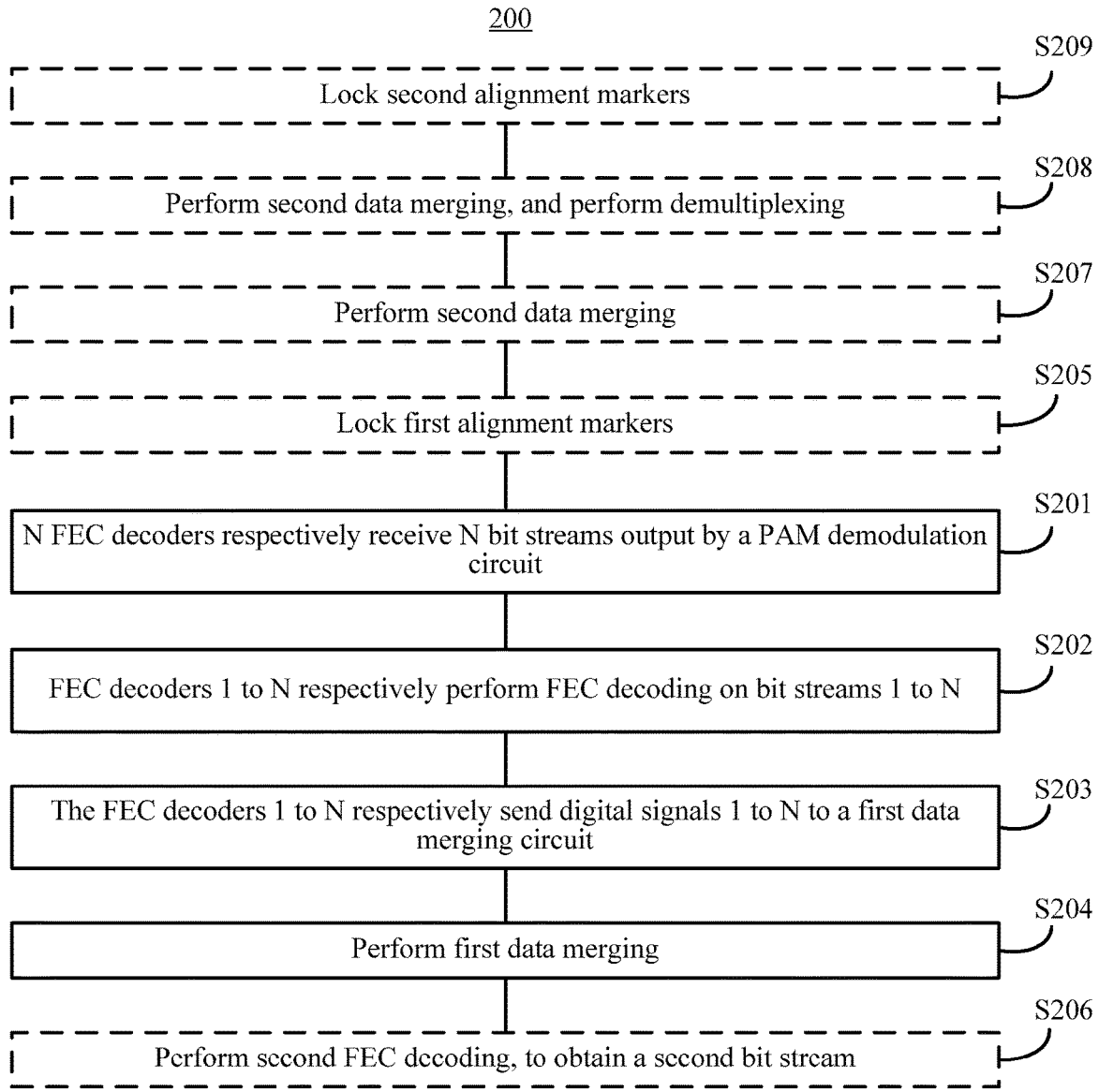
FIG. 10 is a flowchart of a data processing method according to another embodiment of this application.

The method shown in FIG. 11 is obtained by means of extension based on the method shown in FIG. 10. For specific implementation of an embodiment of FIG. 11, refer to descriptions of the method shown in FIG. 10 in this application. Details are not described herein again. A difference between the method shown in FIG. 11 and the method shown in FIG. 10 lies in that before a first distribution circuit distributes a second bit stream (corresponding to the first bit stream in the embodiment of FIG. 10) to a data processing circuit (corresponding to the first FEC encoding circuit in the embodiment of FIG. 10), an FEC encoding circuit (corresponding to the second FEC encoding circuit in the embodiment of FIG. 10) further performs FEC encoding on a first bit stream, to generate the second bit stream. The data processing circuit includes N subcircuits. L subcircuits of the N subcircuits are respectively L FEC encoder. W subcircuits of the N subcircuits are respectively W delayers. The L subcircuits do not intersect with the W subcircuits.

The data processing method 300 provided in this application is described in detail below with reference to FIG. 11. The method is performed by a transmitter circuit. The transmitter circuit includes an FEC encoding circuit, a first distribution circuit, and a data processing circuit. The method 300 includes the following steps.

S301. The FEC encoding circuit performs FEC encoding on a first bit stream, to obtain a second bit stream.

In a specific implementation manner, an RS converts serial Ethernet data that is from a MAC layer into parallel Ethernet data that matches an MII, and sends the parallel Ethernet data to a PCS in a PHY by using the MII. Then the PCS performs, at the PCS, line encoding on the data that is transmitted by the MII, to obtain the first bit stream. The FEC encoding circuit performs FEC encoding on the first bit stream, to obtain the second bit stream.

S302. The first distribution circuit distributes the second bit stream to N channels in a round robin fashion.

The N channels are respectively represented by channels 1 to N. The second bit stream includes N digital signals, and the N digital signals are respectively represented by digital signals 1 to N. The digital signals 1 to N are respectively transmitted to the N subcircuits of the data processing circuit by using the channels 1 to N. The N subcircuits are respectively represented by subcircuits 1 to N. The digital signals 1 to N are in a one-to-one correspondence with the channels 1 to N. The channels 1 to N are in a one-to-one correspondence with the subcircuits 1 to N. L subcircuits of the N subcircuits are L FEC encoders. W subcircuits of the N subcircuits are W delayers. The L subcircuits do not intersect with the W subcircuits. L+W=N, L≥1, W≥0, N≥2, and L, W, and N are all integers.

Specifically, the N subcircuits consists of the L FEC encoders and the W delayers. The L FEC encoders have a capability of performing FEC encoding. The W delayers have a capability of performing delay processing, but do not have the capability of performing FEC encoding. Therefore, a coding gain of each of the W delayers is equal to 0.

A specific distribution manner is the same as step S101. Details are not described herein again.

The second bit stream includes an FEC code word, and the FEC code word includes multiple symbols. The first distribution circuit sends the second bit stream to a channel P according to a first unit. The first distribution circuit sends the second bit stream to a channel Q according to a second unit. A quantity of bits included in the first unit is equal to or is not equal to a quantity of bits included in the second unit. $1 \leq P \leq N-1$, $2 \leq Q \leq N$, $P \neq Q$, and both P and Q are integers.

Optionally, the first unit is one or more symbols, and the second unit is one or more symbols.

Optionally, the first distribution circuit sends a first part of a first symbol to the channel P, and the first unit includes the first part of the first symbol. The first distribution circuit sends a second part of the first symbol to a channel P+1. The first symbol includes the first part and the second part.

S303. Subcircuits 1 to N respectively process digital signals 1 to N.

The subcircuits 1 to N respectively process the digital signals 1 to N, to obtain bit streams 1 to N. The bit streams 1 to N are in a one-to-one correspondence with the digital signals 1 to N. A PAM circuit is configured to modulate the bit streams 1 to N. The bit streams 1 to N are an input signal of the PAM circuit. The bit streams 1 to N are in a one-to-one correspondence with a least significant bit to a most significant bit of the input signal.

The L FEC encoders respectively perform FEC encoding processing on L input digital signals, to obtain L bit streams. The W delayers respectively perform delay processing on W input digital signals, to obtain W bit streams. Coding gains of the subcircuits 1 to N are respectively represented by $G_1$ to $G_N$. A coding gain of a subcircuit X is $G_X$, and a coding gain of a subcircuit Y is $G_Y$. $G_X > G_Y$, $1 \leq X \leq Y \leq N$, $N \geq 2$, and X, Y, and N are all integers. When a subcircuit is a delayer, a coding gain of the subcircuit is 0. Subcircuits with different coding gains correspond to digital signals with different bit error rates.

The L input digital signals refer to L digital signals that are input to the L FEC encoders. The L input digital signals are a subset of the N digital signals corresponding to the digital signals 1 to N. The W input digital signals refer to W digital signals that are input to the W delayers. The W input digital signals are a subset of the N digital signals corresponding to the digital signals 1 to N.

A subcircuit with a high gain corresponds to a digital signal with a high bit error rate, and a subcircuit with a low gain corresponds to a digital signal with a low bit error rate. Therefore, FEC with a relatively high gain covers data that easily encounters a bit error on a link. FEC with different gains is used, so that chip resources occupied by FEC are reduced, and implementation complexity of an entire system is reduced.

Optionally, the subcircuit 1 is an FEC encoder, and $G_1 > G_N$, that is, a coding gain of the subcircuit 1 is greater than a coding gain of the subcircuit N. In this embodiment of this application, $G_1 > G_N$. In this way, data with a relatively high bit error rate is corrected by using relatively complex FEC, and data with a relatively low bit error rate may be corrected by using relatively simple FEC. Therefore, system complexity is reduced, and chip resources occupied by FEC are reduced.

Further optionally, $G_1$ is greater than or equal to each coding gain in $G_2$ to $G_{N-1}$. When N=3, $G_2=G_{N-1}$. In the foregoing manner, chip resources occupied by FEC are further reduced, and implementation complexity of a system is reduced.

In this embodiment, an FEC encoding manner used by the L FEC encoders is the same as the FEC encoding manner used by the FEC encoders 1 to N in step S102. Details are not described herein again.

S304. The subcircuits 1 to N send bit streams 1 to N to a pulse amplitude modulation PAM circuit.

The bit streams 1 to N are an input signal of the PAM circuit. The bit streams 1 to N are in a one-to-one correspondence with a least significant bit to a most significant bit of the input signal. The PAM circuit is configured to modulate the bit streams 1 to N, to generate a modulation signal, and send the modulation signal to a receiver circuit. For a specific modulation process of the PAM circuit, refer to the specific description of the modulation manner of the modulator shown in FIG. 1 in this specification. Details are not described herein again. In this embodiment, the FEC encoding circuit performs integral FEC encoding on the first bit stream, to obtain the second bit stream. After the first distribution circuit distributes the second bit stream in a round robin fashion, in a first data processing module, FEC encoding needs to be performed again on a link with a relatively high bit error rate, and a delayer is used to perform time synchronization processing on a link with a relatively low bit error rate. Therefore, physical-layer resources occupied by a large amount of FEC encoding are reduced while long-distance transmission is supported.

In another specific implementation manner, the transmitter circuit further includes a first alignment marker addition circuit. After the first distribution circuit distributes the first bit stream to the channels 1 to N in a round robin fashion, and before the subcircuits 1 to N respectively process the digital signals 1 to N, the method further includes S305:

the first alignment marker addition circuit receives the digital signals 1 to N, and the first alignment marker addition circuit adds first alignment markers 1 to N to the digital signals 1 to N, where the digital signals 1 to N are in a one-to-one correspondence with the first alignment markers 1 to N, and the first alignment markers 1 to N are used for determining boundaries of the bit streams 1 to N.

The first alignment markers described in this implementation manner of this application refer to alignment markers included in the digital signals 1 to N.

In another specific implementation manner, the transmitter circuit further includes a first alignment marker addition circuit. After that the subcircuits 1 to N send bit streams 1 to N to a pulse amplitude modulation PAM circuit, the method further includes S306: The first alignment marker addition circuit receives the bit streams 1 to N, and the first alignment marker addition circuit adds first alignment markers 1 to N to the bit streams 1 to N, where the bit streams 1 to N are in a one-to-one correspondence with the first alignment markers 1 to N, and the first alignment markers 1 to N are used for determining boundaries of the bit streams 1 to N.

The first alignment markers described in this implementation manner of this application refer to alignment markers included in the bit streams 1 to N.

Specific processes of step S305 and step S306 are the same as steps S104 and S105. Details are not described herein again.

In another specific implementation manner of this application, the transmitter circuit further includes a second distribution circuit, and the PAM circuit includes M modulators. After S304, the method further includes S307:

the second distribution circuit receives the bit streams 1 to N;

the second distribution circuit distributes the bit streams 1 to N, to obtain N×M bit streams $BS_{11}$ to $BS_{NM}$, where a bit stream i corresponds to $BS_{i1}$ to $BS_{iM}$, and values of i are all integers from 1 to N; and the second distribution circuit sends $BS_{i1}$ to $BS_{iM}$ to the M modulators, where $BS_{11}$ to $BS_{iM}$ are in a one-to-one correspondence with the M modulators, the M modulators are respectively configured to modulate $BS_{i1}$ to $BS_{iM}$, and M is an integer greater than or equal to 2.

That the second distribution circuit distributes the bit streams 1 to N, to obtain N×M bit streams specifically includes: The second distribution circuit distributes each of the bit streams 1 to N as M bit streams, to obtain the N×M bit streams.

$BS_{i1}$ to $BS_{iM}$ are obtained by distributing the bit stream i. The bit stream i includes $BS_{i1}$ to $BS_{iM}$. Each of the M modulators receives only one of $BS_{i1}$ to $BS_{iM}$.

In this implementation manner, multiple PAM modulators are used to modulate the bit streams 1 to N, so as to meet a transmission rate requirement of a high-rate Ethernet.

In another specific implementation manner, the transmitter circuit further includes a second distribution circuit and a multiplexing circuit, and the PAM circuit includes M modulators. After S304, the method further includes S308:

the second distribution circuit receives the bit streams 1 to N;

the second distribution circuit distributes the bit streams 1 to N, to obtain N×P bit streams $AS_{11}$ to $AS_{NP}$, where a bit stream i correspond to $AS_{i1}$ to $AS_{iP}$, and values of i are all integers from 1 to N;

the multiplexing circuit multiplexes the N×P bit streams $AS_{11}$ to $AS_{NP}$ into N×M bit streams $BS_{11}$ to $BS_{NM}$, where a bit stream i corresponds to $BS_{i1}$ to $BS_{iM}$, and values of i are all integers from 1 to N; and the multiplexing circuit sends $BS_{i1}$ to $BS_{iM}$ to the M modulators, where $BS_{11}$ to $BS_{iM}$ are in a one-to-one correspondence with the M modulators, the M modulators are respectively configured to module $BS_{i1}$ to $BS_{iM}$, P≥M, P is an integer multiple of M, and M is an integer greater than or equal to 2.

$AS_{i1}$ to $AS_{iP}$ are obtained by distributing the bit stream i. The bit stream i includes $AS_{i1}$ to $AS_{iP}$. Each of the M modulators receives only one of $AS_{i1}$ to $AS_{iP}$.

That the second distribution circuit distributes the bit streams 1 to N, to obtain N×P bit streams specifically includes: The second distribution circuit distributes each of the bit streams 1 to N as P bit streams, to obtain the N×P bit streams.

That the multiplexing circuit multiplexes the N×P bit streams $AS_{11}$ to $AS_{NP}$ into N×M bit streams specifically includes: The multiplexing circuit divides every P bit streams into M groups, where each group of bit streams includes P/M bit streams; and multiplexes the P/M bit streams in each group into one bit stream. For example, the second distribution circuit distributes each FEC code word as 16 pieces of data. The multiplexing circuit divides the 16 pieces of data into four groups, where each group includes four pieces of data, and the four pieces of data in each group are multiplexed into one piece of data. The multiplexing circuit separately performs the foregoing operations on the N×P bit streams, to obtain the N×M bit streams.

In this implementation manner, the foregoing multiplexing circuit is used, so that the data processing circuit and the PAM circuit may be disposed on two chips, and a person skilled in the art can set the data processing circuit in such a manner that the data processing circuit includes multiple subcircuits and outputs multiple bit streams, for example, 16 bit streams. According to a quantity of modulators that need to be used, data is transmitted between a data processing circuit and a modulator by using a multiplexer, so that flexibility of disposing a circuit is improved. A person skilled in the art may understand that the data processing circuit may output eight bit streams, four bit streams, or the like. The quantity of modulators may be set according to a requirement for a data processing rate. This is not limited in this application.

In a specific implementation manner of this application, the transmitter circuit further includes a second alignment marker addition circuit. After that the second distribution circuit sends $BS_{i1}$ to $BS_{iM}$ to the M modulators, the method further includes S309:

the second alignment marker addition circuit receives $BS_{11}$ to $BS_{NM}$; and the second alignment marker addition circuit respectively adds N×M second alignment markers to $BS_{11}$ to $BS_{NM}$, where the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

In another specific implementation manner of this application, the transmitter circuit further includes a second alignment marker addition circuit. After that the multiplexing circuit sends $BS_{i1}$ to $BS_{iM}$ to the M modulators, the method further includes S310:

the second alignment marker addition circuit receives $BS_{11}$ to $BS_{NM}$; and the second alignment marker addition circuit respectively adds N×M second alignment markers to $BS_{11}$ to $BS_{NM}$, where the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

The second alignment markers described in this application refer to alignment markers included in $BS_{11}$ to $BS_{NM}$.

The second alignment marker addition circuit may be integrated with the second distribution circuit. Alternatively, the second alignment marker addition circuit and the second distribution circuit may be two circuits disposed independently from each other. This is not limited in this application.

The receiver circuit performs data alignment on $BS_{11}$ to $BS_{NM}$ by using the N×M second alignment markers, and after determining that boundaries of all data are aligned, further restores, by using a reverse process of second distribution, a data format that is used before the distribution. Second alignment markers are added at a same moment by using each piece of data as one group. A method used by the second alignment marker addition circuit to respectively add the N×M second alignment markers to $BS_{11}$ to $BS_{NM}$ is the same as the method used in steps S104 and S105 in the method 100. Details are not described herein again.

Figure 12:
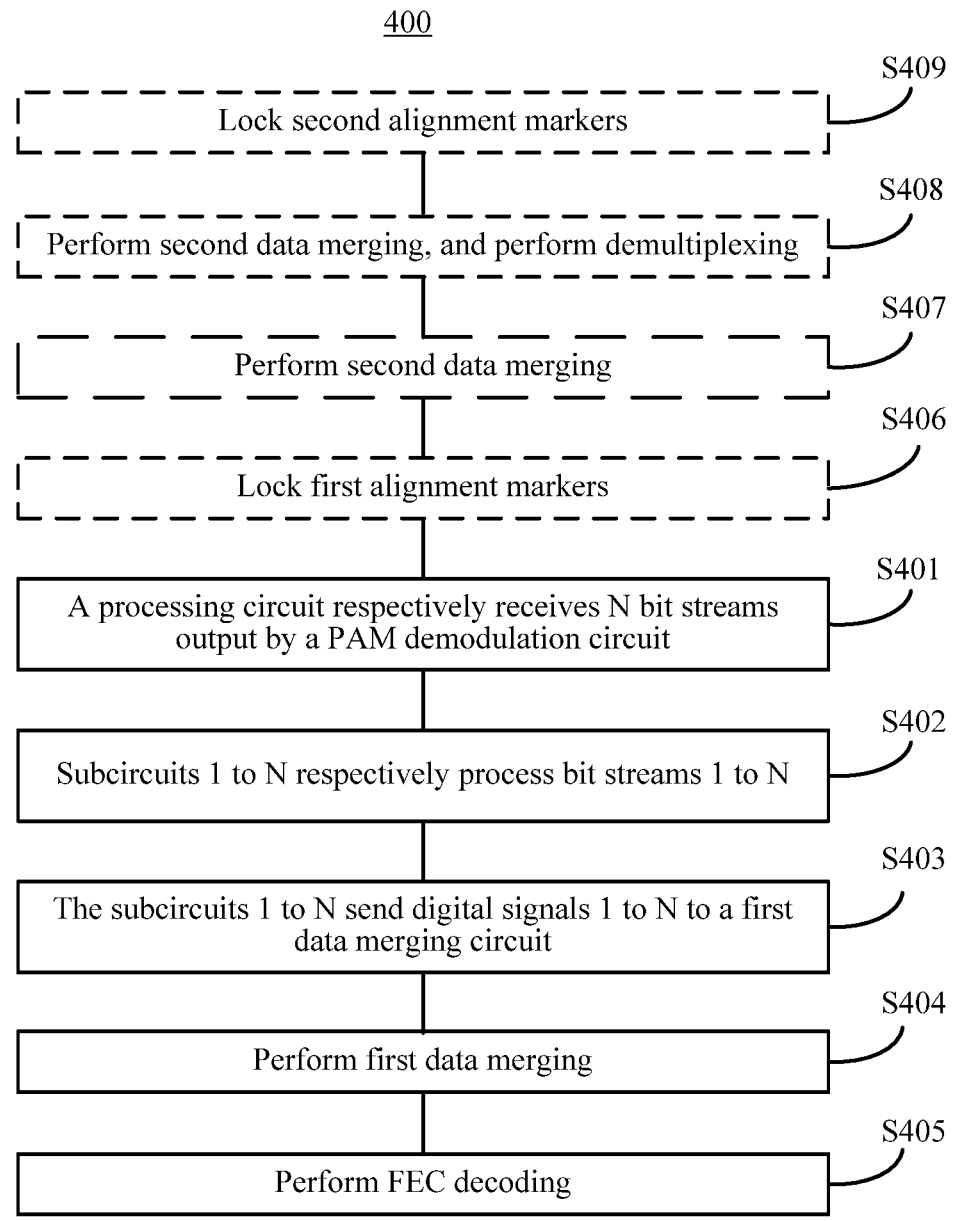
FIG. 12 is a flowchart of a data processing method according to yet another embodiment of this application.

A data processing method 400 in an Ethernet according to an embodiment of this application is described in detail below with reference to FIG. 12. The method is performed by a receiver circuit in an Ethernet interface. The receiver circuit includes a processing circuit, a first data merging circuit, and a forward error correction FEC decoding circuit. The receiver circuit may be the PHY shown in FIG. 7. For example, the method shown in FIG. 12 and the method shown in FIG. 10 may form a complete technical solution, so as to implement FEC encoding and FEC decoding. Specifically, the method shown in FIG. 12 may be used to restore the first bit stream involved in S101 in FIG. 10. This embodiment of this application can be implemented in a PHY of an Ethernet above 100 G. However, a person skilled in the art may understand that this embodiment of this application can also be implemented in an Ethernet below 100 G.

Processing performed at a PMA sublayer and/or a PCS of the receiver circuit is respectively reverse processing of processing performed at a PMA sublayer and/or a PCS of a transmitter circuit.

S401. N subcircuits of the processing circuit respectively receive N bit streams output by a pulse amplitude demodulation circuit.

The pulse amplitude demodulation circuit receives a data signal sent by the transmitter circuit, demodulates the data signal into N bit streams, and sends the N bit streams to the processing circuit. The N subcircuits are respectively represented by subcircuits 1 to N, and the N bit streams are respectively represented by bit streams 1 to N. The bit streams 1 to N are in a one-to-one correspondence with a least significant bit to a most significant bit of an output signal of the pulse amplitude demodulation circuit. The subcircuits 1 to N are in a one-to-one correspondence with the bit streams 1 to N. L subcircuits of the N subcircuits are L FEC decoders. W subcircuits of the N subcircuits are W delayers. The L subcircuits do not intersect with the W subcircuits. L+W=N, L≥1, W≥0, N≥2, and L, W, and N are all integers.

The L FEC decoders have a capability of performing FEC decoding. The W delayers have a capability of performing delay processing, but do not have the capability of performing FEC decoding. Therefore, a coding gain of each of the W delayers is equal to 0.

S402. Subcircuits 1 to N respectively process bit streams 1 to N, to obtain N processed digital signals.

The N processed digital signals are respectively represented by digital signals 1 to N. The bit streams 1 to N are in a one-to-one correspondence with the digital signals 1 to N. The L FEC decoders respectively perform FEC decoding on L input bit streams, to obtain L digital signals. The W delayers respectively perform delay processing on W input bit streams, to W digital signals. Coding gains of the subcircuits 1 to N are respectively represented by $G_1$ to $G_N$. A coding gain of a subcircuit X is $G_X$, and a coding gain of a subcircuit Y is $G_Y$. $G_X > G_Y$, $1 \leq X \leq Y \leq N$, and X and Y are integers.

The L input bit streams refer to L bit streams that are input to the L FEC decoders. The L input bit streams are a subset of the N bit streams corresponding to the bit streams 1 to N. The W input bit streams refer to W bit streams that are input to the W delayers. The W input bit streams refer to a subset of the N bit streams corresponding to the bit streams 1 to N.

In an optional implementation manner, $G_1 > G_N$, that is, a coding gain of the subcircuit 1 is greater than a coding gain of the subcircuit N. In this embodiment of this application, $G_1 > G_N$. In this way, data with a highest bit error rate is corrected by using relatively complex FEC, and data with a lowest bit error rate is corrected by using relatively simple FEC. Therefore, system complexity is reduced, and chip resources occupied by FEC are reduced. In this embodiment of this application, when a subcircuit is a delayer, a coding gain of the subcircuit is 0.

Further optionally, $G_1$ is greater than or equal to each coding gain in $G_2$ to $G_{N-1}$. When N=3, $G_2 = G_{N-1}$. In the foregoing manner, chip resources occupied by FEC are further reduced, and implementation complexity of a system is reduced.

The subcircuits 1 to N correspondingly dispose corresponding FEC decoders and delayers according to FEC encoders and delayers used by the subcircuits 1 to N in the transmitter circuit. The FEC decoders select a corresponding code type according to an encoding code type used by the FEC encoders, to perform FEC decoding. That is, a process in which the FEC decoders perform FEC decoding on the received bit streams in the method 400 is a reverse process of S303 in the method 300. Details are not described herein.

S403. The subcircuits 1 to N send digital signals 1 to N to the first data merging circuit.

S404. The first data merging circuit sends the digital signals 1 to N in a round robin fashion, and restores the digital signals 1 to N to a serial first bit stream.

The first data merging circuit specifically selects a corresponding merging manner according to a distribution manner used by a first distribution circuit in the transmitter circuit. S404 in the method 400 is a reverse process of S302 in the method 300. Details are not described herein.

S405. The FEC decoding circuit performs FEC decoding on the first bit stream, to obtain a second bit stream.

Step 405 is reverse processing of step S301 in the method 300. Details are not described herein.

In an optional implementation manner, the receiver circuit further includes a first alignment marker identification circuit. Before S401, the method further includes S406:

the first alignment marker identification circuit identifies first alignment markers 1 to N that are included in the bit streams 1 to N, where the bit streams 1 to N are in a one-to-one correspondence with the first alignment markers 1 to N; and determines boundaries of the bit streams 1 to N based on the first alignment markers 1 to N.

Step 406 is reverse processing of step S305 or S306. Details are not described herein.

In a specific implementation manner, the receiver circuit further includes a second data merging circuit, and the pulse amplitude demodulation circuit includes M demodulators. Before that N subcircuits of the processing circuit respectively receive N bit streams output by a pulse amplitude demodulation circuit, the method further includes S407:

the second data merging circuit receives N×M bit streams output by the M demodulators, where the N×M bit streams are respectively represented by $BS_{11}$ to $BS_{NM}$, a bit stream i corresponds to $BS_{i1}$ to $BS_{iM}$, and values of i are all integers from 1 to N; and the second data merging circuit merges $BS_{i1}$ to $BS_{iM}$ into the bit stream i, where $BS_{i1}$ to $BS_{iM}$ are in a one-to-one correspondence with the M demodulators, and M is an integer greater than or equal to 2.

Step S407 is reverse processing of step S307. Details are not described herein.

In another specific implementation manner, the receiver circuit further includes a demultiplexing circuit and a second data merging circuit, and the pulse amplitude demodulation circuit includes M demodulators. Before that N subcircuits of the processing circuit respectively receive N bit streams output by a pulse amplitude demodulation circuit, the method further includes S408:

the demultiplexing circuit receives N×M bit streams output by the M demodulators, where the N×M bit streams are respectively represented by $BS_{11}$ to $BS_{NM}$; and demultiplexes $BS_{11}$ to $BS_{NM}$ into N×P bit streams, where the N×P bit streams are respectively represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2;

the second data merging circuit receives $AS_{11}$ to $AS_{NP}$; and the second data merging circuit merges $AS_{i1}$ to $AS_{iP}$ into the bit stream i, where the bit stream i corresponds to $AS_{i1}$ to $AS_{iP}$, values of i are all integers from 1 to N, P≥M, P is an integer multiple of M, and M is an integer greater than or equal to 2.

Step S408 is reverse processing of step S308. Details are not described herein.

In still another possible implementation manner, the receiver circuit further includes a second alignment marker identification circuit. Before that N subcircuits of the processing circuit respectively receive N bit streams output by a pulse amplitude demodulation circuit, the method further includes S409:

the second AM identification circuit identifies N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determines a boundary of each bit stream of $BS_{11}$ to $BS_{NM}$ based on $AM_{11}$ to $AM_{NM}$.

Step S409 is reverse processing of step S309. Details are not described herein.

Figure 13:
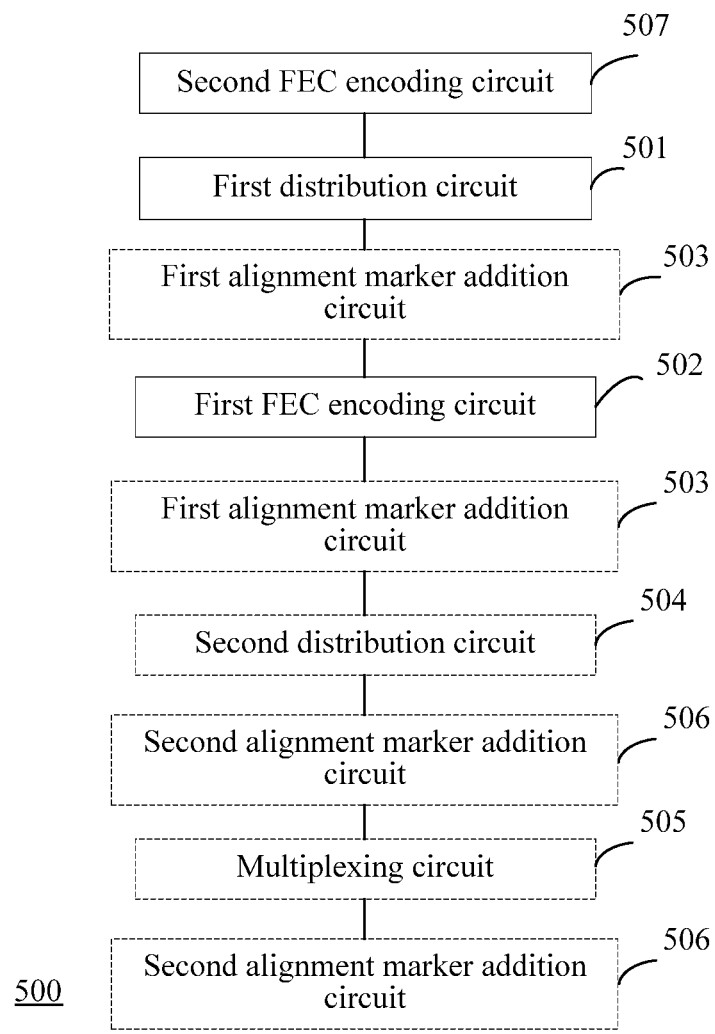
FIG. 13 is a structural diagram of a data processing apparatus according to an embodiment of this application.

To perform the data processing method 100 in the foregoing embodiment, an embodiment of this application provides a data processing apparatus 500 used for an Ethernet interface. Referring to FIG. 13, the data processing apparatus 500 includes a first distribution circuit 501 and a first forward error correction FEC encoding circuit 502.

The first distribution circuit 501 is configured to distribute a first bit stream to N channels in a round robin fashion. The N channels are respectively represented by channels 1 to N. The first bit stream includes N digital signals. The N digital signals are respectively represented by digital signals 1 to N. The digital signals 1 to N are in a one-to-one correspondence with the channels 1 to N. The digital signals 1 to N are respectively transmitted to the first FEC encoding circuit by using the channels 1 to N.

The first FEC encoding circuit 502 is configured to perform FEC encoding on the digital signals 1 to N, to obtain N FEC code words. The first FEC encoding circuit 502 includes N FEC encoders. The N FEC encoders are respectively represented by FEC encoders 1 to N. The channels 1 to N are in a one-to-one correspondence with the FEC encoders 1 to N. An FEC encoder X performs FEC encoding on a digital signal X, and an FEC encoder Y performs FEC encoding on a digital signal Y. The N FEC code words are respectively represented by $F_1$ to $F_N$. The digital signals 1 to N are in a one-to-one correspondence with $F_1$ to $F_N$. Coding gains of the FEC encoders 1 to N are respectively represented by $G_1$ to $G_N$. A coding gain of the FEC encoder X is represented by $G_X$, and a coding gain of the FEC encoder Y is represented by $G_Y$. $G_X > G_Y$, 1≤X≤Y≤N, N≥2, and X, Y, and N are all integers.

The first FEC encoding circuit 502 is further configured to send $F_1$ to $F_N$ to a pulse amplitude modulation PAM circuit. The PAM circuit is configured to modulate $F_1$ to $F_N$. $F_1$ to $F_N$ are an input signal of the PAM circuit. $F_1$ to $F_N$ are in a one-to-one correspondence with a least significant bit to a most significant bit of the input signal.

In this embodiment, FEC encoders with different coding gains correspond to digital signals with different bit error rates. An FEC encoder with a high gain corresponds to a digital signal with a high bit error rate, and an FEC encoder with a low gain corresponds to a digital signal with a low bit error rate. Therefore, FEC with a relatively high gain covers data that easily encounters a bit error on a link. FEC with different gains is used, so that chip resources occupied by FEC are reduced, and implementation complexity of an entire system is reduced.

In a specific implementation manner, $G_1 > G_N$, that is, a coding gain of the FEC encoder 1 is greater than a coding gain of the FEC encoder N. In this embodiment of this application, $G_1 > G_N$. In this way, data with a relatively high bit error rate is corrected by using relatively complex FEC, and data with a relatively low bit error rate may be corrected by using relatively simple FEC. Therefore, system complexity is reduced, and chip resources occupied by FEC are reduced.

Further optionally, $G_1$ is greater than or equal to each coding gain in $G_2$ to $G_{N-1}$. When N=3, $G_2 = G_{N-1}$. In the foregoing manner, chip resources occupied by FEC are further reduced, and implementation complexity of a system is reduced.

In a specific implementation manner, the data processing apparatus 500 further includes a first alignment marker addition circuit 503. The first alignment marker addition circuit 503 is configured to: after the first distribution circuit 501 distributes the first bit stream to the N channels in a round robin fashion, and before the first FEC encoding circuit 502 performs FEC encoding on the digital signals 1 to N, respectively add first alignment markers 1 to N to the digital signals 1 to N. The digital signals 1 to N are in a one-to-one correspondence with the first alignment markers 1 to N. The first alignment markers 1 to N are in a one-to-one correspondence with $F_1$ to $F_N$. The first alignment markers 1 to N are used for determining boundaries of $F_1$ to $F_N$.

In a specific implementation manner, the data processing apparatus 500 further includes a first alignment marker addition circuit 503. The first alignment marker addition circuit 503 is configured to: after the first FEC encoding circuit 502 sends $F_1$ to $F_N$ to the pulse amplitude modulation PAM circuit, receive $F_1$ to $F_N$, and respectively add first alignment markers 1 to N to $F_1$ to $F_N$. The first alignment markers 1 to N are in a one-to-one correspondence with $F_1$ to $F_N$. The first alignment markers 1 to N are used for determining boundaries of $F_1$ to $F_N$.

In another specific implementation manner, the PAM circuit includes M modulators, and the data processing apparatus 500 further includes a second distribution circuit 504. The second distribution circuit 504 is configured to receive $F_1$ to $F_N$ after the first FEC encoding circuit 502 sends $F_1$ to $F_N$ to the PAM circuit. The second distribution circuit is further configured to distribute $F_1$ to $F_N$, to obtain N×M bit streams. The N×M bit streams are represented by $BS_{11}$ to $BS_{NM}$. $F_i$ corresponds to $BS_{i1}$ to $BS_{iM}$. Values of i are all integers from 1 to N.

The second distribution circuit 504 is further configured to respectively distribute $BS_{i1}$ to $BS_{iM}$ to the M modulators. $BS_{i1}$ to $BS_{iM}$ are in a one-to-one correspondence with the M modulators. The M modulators are respectively configured to modulate $BS_{i1}$ to $BS_{iM}$. M is an integer greater than or equal to 2.

In this implementation manner, multiple modulators are used to modulate the N FEC code words, so as to meet a transmission rate requirement of a high-rate Ethernet.

In another specific implementation manner, the PAM circuit includes M modulators, and the data processing apparatus 500 further includes a second distribution circuit 504 and a multiplexing circuit 505.

The second distribution circuit 504 is configured to receive $F_1$ to $F_N$ after the first FEC encoding circuit 502 sends $F_1$ to $F_N$ to the PAM circuit.

The second distribution circuit 504 is further configured to distribute $F_1$ to $F_N$, to obtain N×P bit streams. The N×P bit streams are represented by $AS_{11}$ to $AS_{NP}$. $F_i$ corresponds to $AS_{i1}$ to $AS_{iP}$. Values of i are all integers from 1 to N.

The multiplexing circuit 505 is configured to multiplex the N×P bit streams $AS_{11}$ to $AS_{NP}$ into N×M bit streams. The N×M bit streams are represented by $BS_{11}$ to $BS_{NM}$. corresponds to $BS_{i1}$ to $BS_{iM}$. Values of i are all integers from 1 to N.

The multiplexing circuit 505 is further configured to respectively send $BS_{11}$ to $BS_{NM}$ to the M modulators. $BS_{i1}$ to $BS_{iM}$ are in a one-to-one correspondence with the M modulators. The M modulators are respectively configured to module $BS_{i1}$ to $BS_{iM}$. P≥M, P is an integer multiple of M, and M is an integer greater than or equal to 2.

In this implementation manner, the foregoing multiplexing circuit is used, so that the first FEC encoding circuit and the PAM circuit may be disposed on two chips, and a person skilled in the art can set the first FEC encoding circuit in such a manner that the first FEC encoding circuit includes multiple subcircuits and outputs multiple FEC code words, for example, 16 FEC code words. According to a quantity of modulators that are subsequently used, data is transmitted between an FEC encoding circuit and a modulator by using a multiplexer, so that flexibility of disposing a circuit is improved. A person skilled in the art may understand that the first FEC encoding circuit may output eight FEC code words, four FEC code words, or the like. The quantity of modulators is set according to a requirement for a data processing rate. This is not limited in this application.

In another specific implementation manner of this application, the data processing apparatus further includes a second alignment marker addition circuit 506.

The second alignment marker addition circuit 506 is configured to receive $BS_{11}$ to $BS_{NM}$ after the second distribution circuit 504 respectively sends $BS_{i1}$ to $BS_{iM}$ to the M modulators.

The second alignment marker addition circuit 506 is further configured to respectively add N×M second alignment markers to $BS_{11}$ to $BS_{NM}$. The N×M second alignment markers are represented by $AM_{11}$ to $AM_{NM}$. $BS_{11}$ to $BS_{NM}$ are in a one-to-one correspondence with $AM_{11}$ to $AM_{NM}$. $AM_{11}$ to $AM_{NM}$ are used for determining boundaries of $BS_{11}$ to $BS_{NM}$.

In another specific implementation manner of this application, the data processing apparatus 500 further includes a second alignment marker addition circuit 506.

The second alignment marker addition circuit 506 is configured to receive $BS_{11}$ to $BS_{NM}$ after the multiplexing circuit 505 respectively sends $BS_{i1}$ to $BS_{iM}$ to the M modulators.

The second alignment marker addition circuit 506 is further configured to respectively add N×M second alignment markers to $BS_{11}$ to $BS_{NM}$. The N×M second alignment markers are represented by $AM_{11}$ to $AM_{NM}$. $BS_{11}$ to $BS_{NM}$ are in a one-to-one correspondence with $AM_{11}$ to $AM_{NM}$. $AM_{11}$ to $AM_{NM}$ are used for determining boundaries of $BS_{11}$ to $BS_{NM}$.

In another specific implementation manner of this application, the data processing apparatus 500 further includes a second FEC encoding circuit 507, configured to perform FEC encoding on a second bit stream, to obtain the first bit stream. In a specific implementation manner, the first bit stream that is obtained after the second FEC encoding circuit performs FEC encoding includes an FEC code word, and the FEC code word includes multiple symbols. The first distribution circuit is configured to send the first bit stream to a channel P according to a first unit. The first distribution circuit is further configured to send the first bit stream to a channel Q according to a second unit. A quantity of bits included in the first unit is equal to or is not equal to a quantity of bits included in the second unit. 1≤P≤N−1, 2≤Q≤N, P≠Q, and both P and Q are integers.

In a specific implementation manner, the first unit is one or more symbols, and the second unit is one or more symbols.

In another specific implementation manner, that the first distribution circuit is configured to send the first bit stream to a channel P according to a first unit specifically includes: The first distribution circuit is configured to send a first part of a first symbol to the channel P, where the first unit includes the first part of the first symbol.

The first distribution circuit is further configured to send a second part of the first symbol to a channel P+1. The first symbol includes the first part and the second part.

Figure 14:
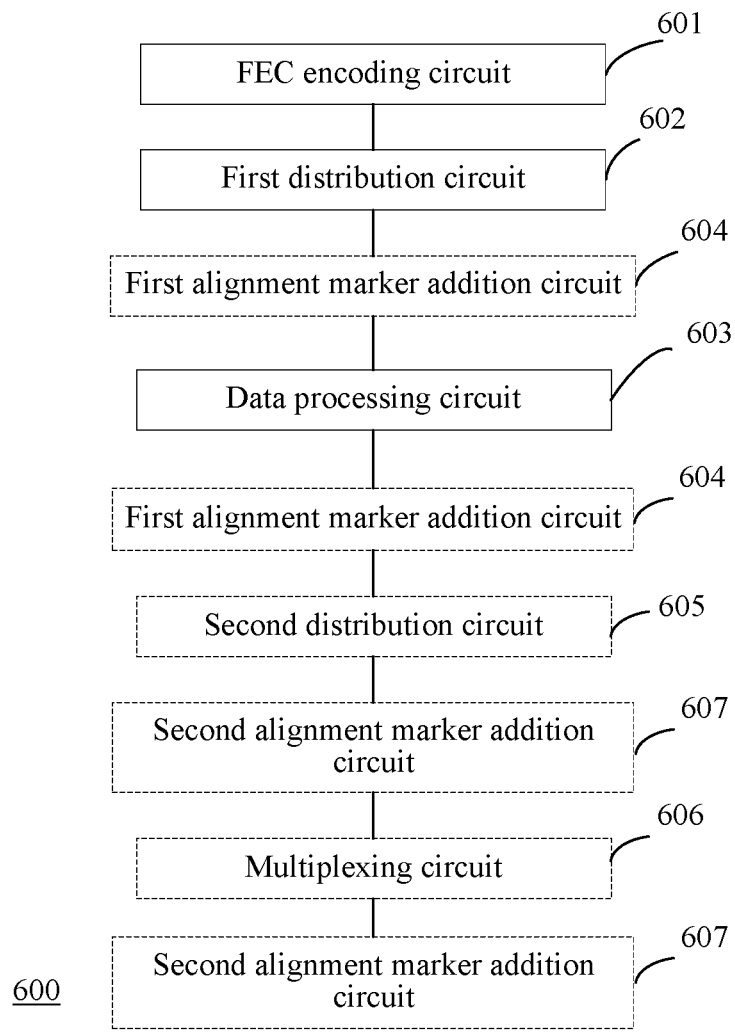
FIG. 14 is a structural diagram of a data processing apparatus according to an embodiment of this application.

To perform the data processing method 200 in the foregoing embodiment, an embodiment of this application provides a data processing apparatus 600 used for an Ethernet interface. Referring to FIG. 14, the data processing apparatus 600 includes a forward error correction FEC encoding circuit 601, a first distribution circuit 602, and a data processing circuit 603.

The FEC encoding circuit 601 is configured to perform FEC encoding on a first bit stream, to obtain a second bit stream.

The first distribution circuit 602 is configured to distribute the second bit stream to N channels in a round robin fashion. The N channels are respectively represented by channels 1 to N. The second bit stream includes N digital signals. The N digital signals are respectively represented by digital signals 1 to N. The digital signals 1 to N are respectively transmitted to N subcircuits of the data processing circuit by using the channels 1 to N. The N subcircuits are respectively represented by subcircuits 1 to N. The digital signals 1 to N are in a one-to-one correspondence with the channels 1 to N. The channels 1 to N are in a one-to-one correspondence with the subcircuits 1 to N. L subcircuits of the N subcircuits are L FEC encoders. W subcircuits of the N subcircuits are W delayers. The L subcircuits do not intersect with the W subcircuits.

The data processing circuit 603 is configured to respectively process the digital signals 1 to N by using the subcircuits 1 to N, to obtain N processed digital signals. The N processed digital signals are respectively represented by bit streams 1 to N. The bit streams 1 to N are in a one-to-one correspondence with the digital signals 1 to N. The L FEC encoders respectively perform FEC encoding processing on L input digital signals, to obtain L bit streams. The W delayers respectively perform delay processing on W input digital signals, to obtain W bit streams. Coding gains of the subcircuits 1 to N are respectively represented by $G_1$ to $G_N$.

A coding gain of a subcircuit X is $G_X$, and a coding gain of a subcircuit Y is $G_Y$. $G_X > G_Y$, L+W=N, L≥1, W≥0, 1≤X≤Y≤N, N≥2, and L, W, X, Y, and N are all integers.

The data processing circuit 603 is further configured to send the bit streams 1 to N to a pulse amplitude modulation PAM circuit. The PAM circuit is configured to modulate the bit streams 1 to N. The bit streams 1 to N are an input signal of the PAM circuit. The bit streams 1 to N are in a one-to-one correspondence with a least significant bit to a most significant bit of the input signal.

In this embodiment of this application, subcircuits with different coding gains correspond to digital signals with different bit error rates. A subcircuit with a high gain corresponds to a digital signal with a high bit error rate, and a subcircuit with a low gain corresponds to a digital signal with a low bit error rate. Therefore, FEC with a relatively high gain covers data that easily encounters a bit error on a link. FEC with different gains is used, so that chip resources occupied by single FEC are reduced, and implementation complexity of an entire system is reduced.

In a specific implementation manner, $G_1 > G_N$, that is, a coding gain of the subcircuit 1 is greater than a coding gain of the subcircuit N. The subcircuit 1 sends the bit stream 1 to the PAM circuit. The subcircuit N sends the bit stream N to the PAM circuit. The bit stream 1 and the bit stream N are an input signal of the PAM circuit. The bit stream 1 corresponds to a least significant bit of the input signal. The bit stream N corresponds to a most significant bit of the input signal.

In this embodiment of this application, $G_1 > G_N$. In this way, data with a highest bit error rate is corrected by using relatively complex FEC, and data with a lowest bit error rate may be corrected by using relatively simple FEC. Therefore, system complexity is reduced, and chip resources occupied by FEC are reduced.

Further optionally, $G_1$ is greater than or equal to each coding gain in $G_2$ to $G_{N-1}$. When N=3, $G_2 = G_{N-1}$.

In the foregoing manner, chip resources occupied by FEC are further reduced, and implementation complexity of a system is reduced.

In a specific implementation manner, the second bit stream includes an FEC code word, and the FEC code word includes multiple symbols. The first distribution circuit is configured to send the second bit stream to a channel P according to a first unit. The first distribution circuit is further configured to send the second bit stream to a channel Q according to a second unit. A quantity of bits included in the first unit is equal to or is not equal to a quantity of bits included in the second unit. 1≤P≤N−1, 2≤Q≤N, P≠Q, and both P and Q are integers.

In a specific implementation manner, the first unit is one or more symbols, and the second unit is one or more symbols.

In an optional implementation manner, that the first distribution circuit is configured to send the second bit stream to a channel P according to a first unit specifically includes: The first distribution circuit is configured to send a first part of a first symbol to the channel P, where the first unit includes the first part of the first symbol.

The first distribution circuit is further configured to send a second part of the first symbol to a channel P+1. The first symbol includes the first part and the second part.

In a specific implementation manner, the data processing apparatus 600 further includes a first alignment marker addition circuit 604.

The first alignment marker addition circuit 604 is configured to: after the first distribution circuit distributes the first bit stream to the channels 1 to N in a round robin fashion, and before the subcircuits 1 to N respectively process the digital signals 1 to N, receive the digital signals 1 to N, and add first alignment markers 1 to N to the digital signals 1 to N. The digital signals 1 to N are in a one-to-one correspondence with the first alignment markers 1 to N. The first alignment markers 1 to N are used for determining boundaries of the bit streams 1 to N.

In another specific implementation manner, the first alignment marker addition circuit 604 is configured to: after the subcircuits 1 to N send the bit streams 1 to N to the pulse amplitude modulation PAM circuit, receive the bit streams 1 to N, and add first alignment markers 1 to N to the bit streams 1 to N. The bit streams 1 to N are in a one-to-one correspondence with the first alignment markers 1 to N. The first alignment markers 1 to N are used for determining boundaries of the bit streams 1 to N.

In another specific implementation manner, the PAM circuit includes M modulators, and the data processing apparatus 600 further includes a second distribution circuit 605.

The second distribution circuit 605 is configured to: after the subcircuits 1 to N send the bit streams 1 to N to the pulse amplitude modulation PAM circuit, receive the bit streams 1 to N, and distribute the bit streams 1 to N, to obtain N×M bit streams $BS_{11}$ to $BS_{NM}$. A bit stream i corresponds to $BS_{i1}$ to $BS_{iM}$, and values of i are all integers from 1 to N.

The second distribution circuit is further configured to send $BS_{i1}$ to $BS_{iM}$ to the M modulators. $BS_{i1}$ to $BS_{iM}$ are in a one-to-one correspondence with the M modulators. The M modulators are respectively configured to modulate $BS_{i1}$ to $BS_{iM}$. M is an integer greater than or equal to 2.

In this implementation manner, multiple modulators are used to modulate signals in the bit streams 1 to N, so as to meet a transmission rate requirement of a high-rate Ethernet.

In another specific implementation manner, the PAM circuit includes M modulators, and the data processing apparatus includes the second distribution circuit 605 and a multiplexing circuit 606.

The second distribution circuit 605 is configured to: after the subcircuits 1 to N send the bit streams 1 to N to the pulse amplitude modulation PAM circuit, receive the bit streams 1 to N, and distribute the bit streams 1 to N, to obtain N×P bit streams $AS_{11}$ to $AS_{NP}$. A bit stream i corresponds to $AS_{i1}$ to $AS_{iP}$, and values of i are all integers from 1 to N.

The multiplexing circuit 606 is configured to multiplex the N×P bit streams $AS_{11}$ to $AS_{NP}$ into N×M bit streams $BS_{11}$ to $BS_{NM}$. A bit stream i corresponds to $BS_{i1}$ to $BS_{iM}$, and values of i are all integers from 1 to N.

The multiplexing circuit 606 is further configured to send $BS_{i1}$ to $BS_{iM}$ to the M modulators. $BS_{i1}$ to $BS_{iM}$ are in a one-to-one correspondence with the M modulators, the M modulators are respectively configured to module $BS_{i1}$ to $BS_{iM}$, P≥M, P is an integer multiple of M, and M is an integer greater than or equal to 2.

In this implementation manner, the foregoing multiplexing circuit is used, so that the data processing circuit and the PAM circuit may be disposed on two chips, and a person skilled in the art can set the data processing circuit 603 in such a manner that the data processing circuit includes multiple subcircuits, for example, 16 subcircuits, and outputs 16 bit streams. According to a quantity of modulators that are subsequently used, data is transmitted between a data processing circuit and a modulator by using a multiplexer, so that flexibility of disposing a circuit is improved. A person skilled in the art may understand that the data processing circuit 603 may output eight bit streams, four bit streams, or the like. The quantity of modulators is set according to a requirement for a data processing rate. This is not limited in this application.

In a specific implementation manner, the data processing apparatus 600 further includes a second alignment marker addition circuit 607.

The second alignment marker addition circuit 607 is configured to receive $BS_{11}$ to $BS_{NM}$ after the second distribution circuit 605 sends $BS_{i1}$ to $BS_{iM}$ to the M modulators.

The second alignment marker addition circuit 607 is further configured to respectively add N×M second alignment markers to $BS_{11}$ to $BS_{NM}$. The N×M second alignment markers are represented by $AM_{11}$ to $AM_{NM}$. The bit streams $BS_{11}$ to $BS_{NM}$ are in a one-to-one correspondence with the second alignment markers $AM_{11}$ to $AM_{NM}$. The second alignment markers $AM_{11}$ to $AM_{NM}$ are used for determining boundaries of the bit streams $BS_{11}$ to $BS_{NM}$.

In another specific implementation manner, the second alignment marker addition circuit 607 is configured to receive $BS_{11}$ to $BS_{NM}$ after the multiplexing circuit 606 sends $BS_{11}$ to $BS_{iM}$ to the M modulators.

The second alignment marker addition circuit 607 is further configured to respectively add N×M second alignment markers to $BS_{11}$ to $BS_{NM}$. The N×M second alignment markers are represented by $AM_{11}$ to $AM_{NM}$. The bit streams $BS_{11}$ to $BS_{NM}$ are in a one-to-one correspondence with the second alignment markers $AM_{11}$ to $AM_{NM}$. The second alignment markers $AM_{11}$ to $AM_{NM}$ are used for determining boundaries of the bit streams $BS_{11}$ to $BS_{NM}$.

Figure 15:
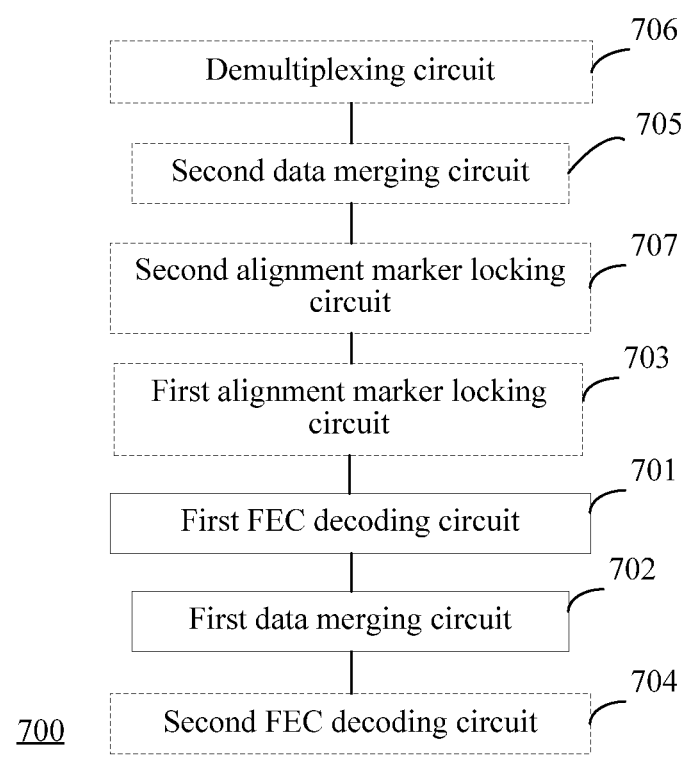
FIG. 15 is a structural diagram of a data processing apparatus according to an embodiment of this application.

To perform the data processing method 300 in the foregoing embodiment, an embodiment of this application provides a data processing apparatus 700 used for an Ethernet interface. Referring to FIG. 15, the data processing apparatus 700 includes a first forward error correction FEC decoding circuit 701 and a first data merging circuit 702. The first FEC decoding circuit 701 includes N FEC decoders.

The first FEC decoding circuit 701 is configured to respectively receive, by using the N FEC decoders, N bit streams output by a pulse amplitude demodulation circuit. The N FEC decoders are respectively represented by FEC decoders 1 to N, and the N bit streams are respectively represented by bit streams 1 to N. The bit streams 1 to N are in a one-to-one correspondence with a least significant bit to a most significant bit of an output signal of the pulse amplitude demodulation circuit. The FEC decoders 1 to N are in a one-to-one correspondence with the bit streams 1 to N. N is an integer greater than or equal to 2.

The first FEC decoding circuit 701 is further configured to respectively perform FEC decoding on the bit streams 1 to N by using the FEC decoders 1 to N, to obtain N digital signals. An FEC decoder X performs FEC decoding on a bit stream X, and an FEC decoder Y performs FEC decoding on a bit stream Y. The N digital signals are respectively represented by digital signals 1 to N. The digital signals 1 to N are in a one-to-one correspondence with the FEC decoders 1 to N. Coding gains of the FEC decoders 1 to N are respectively represented by $G_1$ to $G_N$. A coding gain of the FEC decoder x is represented by $G_X$, and a coding gain of the FEC decoder Y is represented by $G_Y$. $G_X>G_Y$, $1 \le X \le Y \le N$, $N \ge 2$, and X, Y, and N are all integers.

The FEC decoding circuit 701 is further configured to respectively send the digital signals 1 to N to the first data merging circuit 702 by using the FEC decoders 1 to N.

The first data merging circuit 702 is configured to merge the digital signals 1 to N into a serial first bit stream.

In this embodiment, FEC with a relatively high gain covers data that easily encounters a bit error on a link. FEC with different gains is used, so that chip resources occupied by FEC are reduced, and implementation complexity of an entire system is reduced.

In an optional implementation manner, $G_1>G_N$, that is, a coding gain of the FEC decoder 1 is greater than a coding gain of the FEC decoder N. In this embodiment of this application, $G_1>G_N$. In this way, data with a highest bit error rate is corrected by using relatively complex FEC, and data with a lowest bit error rate is corrected by using relatively simple FEC, so that system complexity is reduced and chip resources occupied by FEC are reduced.

Further optionally, $G_1$ is greater than or equal to each coding gain in $G_2$ to $G_{N-1}$. When N=3, $G_2=G_{N-1}$. In the foregoing manner, chip resources occupied by FEC are further reduced, and implementation complexity of a system is reduced.

In a specific implementation manner, the data processing apparatus 700 further includes a first alignment marker identification circuit 703.

The first alignment marker identification circuit 703 is configured to: identify alignment markers 1 to N included in the bit streams 1 to N, where the bit streams 1 to N are in a one-to-one correspondence with a comparison marker 1 to an alignment marker N; and determine boundaries of the bit streams 1 to N based on the alignment markers 1 to N.

In a specific implementation manner, the data processing apparatus 700 further includes a second FEC decoding circuit 704.

The second FEC decoding circuit 704 is configured to: after the first data merging circuit 702 merges the digital signals 1 to N into the serial first bit stream, perform second FEC decoding on the first bit stream, to obtain a second bit stream.

In a specific implementation manner, the pulse amplitude demodulation circuit includes M demodulators, and the data processing apparatus 700 further includes a second data merging circuit 705.

The second data merging circuit 705 is configured to: before the N FEC decoders of the first FEC decoding circuit 701 respectively receive the N bit streams output by the pulse amplitude demodulation circuit, receive N×M bit streams output by the M demodulators. The N×M bit streams are represented by $BS_{11}$ to $BS_{NM}$, a bit stream i corresponds to $BS_{i1}$ to $BS_{iM}$, and values of i are all integers from 1 to N.

The second data merging circuit 705 is further configured to merge $BS_{i1}$ to $BS_{iM}$ into the bit stream i. $B_{i1}$ to $B_{iM}$ are in a one-to-one correspondence with the M demodulators, and M is an integer greater than or equal to 2.

In a specific implementation manner, the pulse amplitude demodulation circuit includes M demodulators, and the data processing apparatus 700 further includes a second data merging circuit 705 and a demultiplexing circuit 706.

The demultiplexing circuit 706 is configured to: before the N FEC decoders of the first FEC decoding circuit 701 respectively receive the N bit streams output by the pulse amplitude demodulation circuit, receive N×M bit streams output by the M demodulators, where the N×M bit streams are represented by $BS_{11}$ to $BS_{NM}$; and demultiplex the N×M bit streams $BS_{11}$ to $BS_{NM}$ into N×P bit streams, where the N×P bit streams are respectively represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2.

The second data merging circuit is configured to: receive $AS_{11}$ to $AS_{NP}$, and merge $AS_{i1}$ to $AS_{iP}$ into the bit stream i.

The bit stream i corresponds to $AS_{i1}$ to $AS_{iP}$, values of i are all integers from 1 to N, P≥M, P is an integer multiple of M, and M is an integer greater than or equal to 2.

In a specific implementation manner, the data processing apparatus 700 further includes a second alignment marker identification circuit 707.

The second alignment marker identification circuit 707 is configured to: before the N FEC decoders of the first FEC decoding circuit 704 respectively receive the N bit streams output by the pulse amplitude demodulation circuit, identify N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determine a boundary of each bit stream of $BS_{11}$ to $BS_{NM}$ based on $AM_{11}$ to $AM_{NM}$.

Figure 16:
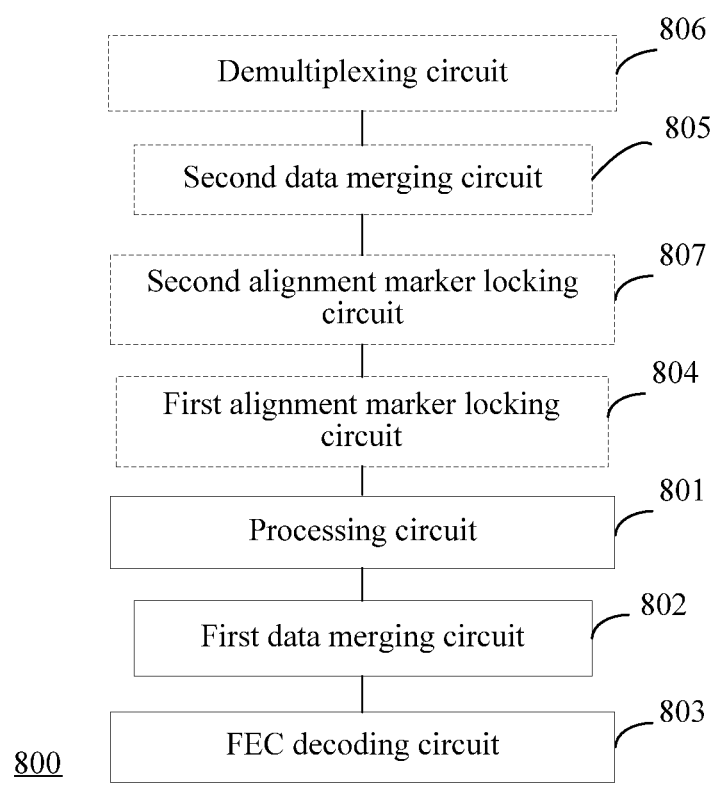
FIG. 16 is a structural diagram of a data processing apparatus according to an embodiment of this application.

To perform the data processing method 400 in the foregoing embodiment, an embodiment of this application provides a data processing apparatus 800 used for an Ethernet interface. Referring to FIG. 16, the data processing apparatus 800 includes a processing circuit 801, a first data merging circuit 802, and a forward error correction FEC decoding circuit 803. The processing circuit 801 includes N subcircuits.

The processing circuit 801 is configured to respectively receive, by using the N subcircuits, N bit streams output by a pulse amplitude demodulation circuit. The N subcircuits are respectively represented by subcircuits 1 to N, the N bit streams are respectively represented by bit streams 1 to N, the bit streams 1 to N are in a one-to-one correspondence with a least significant bit to a most significant bit of an output signal of the pulse amplitude demodulation circuit, the subcircuits 1 to N are in a one-to-one correspondence with the bit streams 1 to N, L subcircuits of the N subcircuits are L FEC decoders, W subcircuits of the N subcircuits are W delayers, the L subcircuits do not intersect with the W subcircuits, L+W=N, L≥1, W≥0, N≥2, and L, W, and N are all integers.

The processing circuit 801 is further configured to respectively process the bit streams 1 to N by using the subcircuits 1 to N, to obtain digital signals 1 to N. The bit streams 1 to N are in a one-to-one correspondence with the digital signals 1 to N, the L FEC decoders respectively perform FEC decoding on L input bit streams, to obtain L digital signals, the W delayers respectively perform delay processing on W input bit streams, to obtain W digital signals, coding gains of the subcircuits 1 to N are respectively represented by $G_1$ to $G_N$, a coding gain of a subcircuit X is $G_X$, a coding gain of a subcircuit Y is $G_Y$, $G_X > G_Y$, 1≤X≤Y≤N, and X and Y are integers.

The subcircuits 1 to N send the digital signals 1 to N to the first data merging circuit.

The first data merging circuit 802 is configured to merge the digital signals 1 to N into a serial first bit stream.

The FEC decoding circuit 803 is configured to perform FEC decoding on the first bit stream, to obtain a second bit stream.

In an optional implementation manner, the subcircuit 1 is an FEC encoder, and $G_1 > G_N$, that is, a coding gain of the subcircuit 1 is greater than a coding gain of the subcircuit N. In this embodiment of this application, $G_1 > G_N$. In this way, data with a highest bit error rate is corrected by using relatively complex FEC, and data with a lowest bit error rate is corrected by using relatively simple FEC, so that system complexity is reduced, and chip resources occupied by FEC are reduced.

Further optionally, $G_1$ is greater than or equal to each coding gain in $G_2$ to $G_{N-1}$. When N=3, $G_2 = G_{N-1}$. In the foregoing manner, chip resources occupied by FEC are further reduced, and implementation complexity of a system is reduced.

In a specific implementation manner, the data processing apparatus 800 may further include a first alignment marker identification circuit 804.

The first alignment marker identification circuit 804 is configured to: before the N subcircuits of the processing circuit 801 respectively receive the N bit streams output by the pulse amplitude demodulation circuit, identify first alignment markers 1 to N that are included in the bit streams 1 to N, where the bit streams 1 to N are in a one-to-one correspondence with the first alignment markers 1 to N; and determine boundaries of the bit streams 1 to N based on the first alignment markers 1 to N.

In a specific implementation manner, the pulse amplitude demodulation circuit includes M demodulators, and the data processing apparatus 800 may further include a second data merging circuit 805.

The second data merging circuit 805 is configured to: before the N subcircuits of the processing circuit 801 respectively receive the N bit streams output by the pulse amplitude demodulation circuit, receive N×M bit streams output by the M demodulators. The N×M bit streams are respectively represented by $BS_{11}$ to $BS_{NM}$, a bit stream i corresponds to $BS_{i1}$ to $BS_{iM}$, and values of i are all integers from 1 to N.

The second data merging circuit 805 is further configured to merge $AS_{i1}$ to $A_{iP}$ into the bit stream i. $BS_{i1}$ to $BS_{iM}$ are in a one-to-one correspondence with the M demodulators, and M is an integer greater than or equal to 2.

In a specific implementation manner, the pulse amplitude demodulation circuit includes M demodulators, and the data processing apparatus 800 further includes a demultiplexing circuit 806 and the second data merging circuit 805.

The demultiplexing circuit 806 is configured to: before the N subcircuits of the processing circuit 801 respectively receive the N bit streams output by the pulse amplitude demodulation circuit, receive N×M bit streams output by the M demodulators, where the N×M bit streams are respectively represented by $BS_{11}$ to $BS_{NM}$; and demultiplex $BS_{11}$ to $BS_{NM}$ into N×P bit streams, where the N×P bit streams are respectively represented by $AS_{11}$ to $AS_{NP}$, a bit stream i corresponds to $BS_{i1}$ to $BS_{iM}$, values of i are all integers from 1 to N, the bit streams $BS_{i1}$ to $BS_{iM}$ are in a one-to-one correspondence with the M demodulators, and M is an integer greater than or equal to 2.

The second data merging circuit 805 is configured to receive $AS_{11}$ to $AS_{NP}$.

The second data merging circuit 805 is further configured to merge $AS_{i1}$ to $A_{iP}$ into the bit stream i. The bit stream i corresponds to $AS_{i1}$ to $AS_{iP}$, values of i are all integers from 1 to N, P≥M, P is an integer multiple of M, and M is an integer greater than or equal to 2.

In a specific implementation manner, the data processing apparatus further includes a second alignment marker identification circuit 807.

The second alignment marker identification circuit 807 is configured to: before the N subcircuits of the processing circuit respectively receive the N bit streams output by the pulse amplitude demodulation circuit, identify N×M second alignment markers included in $BS_{11}$ to $BS_{NM}$, where the N×M second alignment markers are respectively represented by $AM_{11}$ to $AM_{NM}$, and $BS_{11}$ to $BS_{NM}$ are in a one-to-one correspondence with $AM_{11}$ to $AM_{NM}$; and determine a boundary of each bit stream of $BS_{11}$ to $BS_{NM}$ based on $AM_{11}$ to $AM_{NM}$.

The functional units in the embodiments of this application may be implemented by one or any combination of components, for example, an application-specific integrated circuit (ASIC) and a programmable logic device (PLD), that can implement described operation functions of circuits. The foregoing PLD may be a complex programmable logic device (CPLD), a field-programmable gate array (FPGA), generic array logic (GAL), or any combination thereof.

Figure 17:
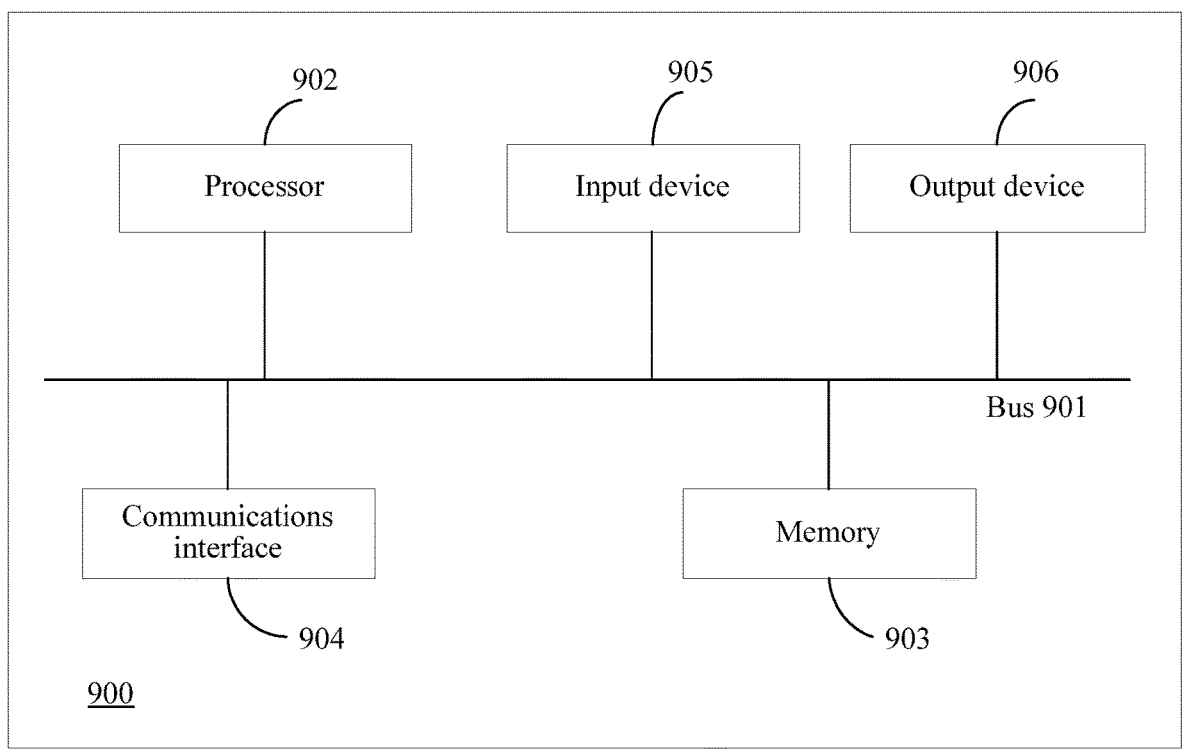
FIG. 17 is a schematic structural diagram of a data processing apparatus according to an embodiment of this application.

FIG. 17 shows a schematic structural diagram of another data processing apparatus 900 used for an Ethernet interface according to an embodiment of this application, and a general computer system structure is used.

The computer system may be specifically a computer with a processor, such as a general personal computer (PC), a portable device such as a tablet computer, a smartphone, or the like. The data processing apparatus 900 includes a bus 901, a processor 902, a memory 903, a communications interface 904, an input device 905, and an output device 906.

The memory 901 is configured to store a program, an instruction, or code.

The processor 902 is configured to execute the program, instruction, or code in the memory 901, to complete operations of S101 to S110 in the method 100, or to complete operations of S201 to S209 in the method 200, or to complete operations of S301 to S310 in the method 300, or to complete operations of S401 to S409 in the method 400.

The bus 901 may include a path used for transmitting information between components of the computer.

The processor 902 may be one or more general purpose central processing units (CPUs), a microprocessor, an application-specific integrated circuit ASIC, or one or more integrated circuits used for controlling program execution in the solutions of this application. The computer system includes one or more memories. The memory may be but is not limited to any medium capable of storing a program, an instruction, or code, such as a random access memory (RAM), a read-only memory (ROM), an erasable programmable read-only memory (EPROM), a compact disc read-only memory (CD-ROM), a hard disk, or a magnetic disk. These memories are connected to the processor 902 by using the bus 901.

The input device 905 may include an apparatus or a physical interface, such as a keyboard, a mouse, a scanner, a voice input apparatus, or a touchscreen, so as to receive data or information entered by a user.

The output device may include an apparatus or a physical interface, including a display, a printer, or a loudspeaker, so as to allow output of information to the user.

The communications interface 904 may be any apparatus such as a transceiver, so as to communicate with another device or a communications network, such as the Ethernet, a radio access network, or a wireless local area network.

The memory 903, such as a RAM, stores a program for performing the technical solutions of this application, and may further store an operating system, another application program, Ethernet data, or the like. Program code for performing the technical solutions of this application is stored in the memory 903, and is executed by the processor 904.

This application further provides a data processing system. The data processing system includes any one or any combination of a data processing apparatus 500, a data processing apparatus 600, a data processing apparatus 700, or a data processing apparatus 800. The data processing apparatus 500 is configured to complete operations of S101 to S110 in the method 100. The data processing apparatus 600 is configured to complete operations of S201 to S209 in the method 200. The data processing apparatus 700 is configured to complete operations of S301 to S310 in the method 300. The data processing apparatus is configured to complete operations of S401 to S409 in the method 400.

Functional units in the embodiments of this application may be integrated into one processor, or each of the units may exist alone physically, or two or more circuits are integrated into one circuit. The functional units may be implemented in a form of hardware, or may be implemented in a form of a software functional unit.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiments are merely an example. For example, the unit division is merely logical function division and may be other division in actual implementation. For example, multiple units or modules may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, that is, may be located in one place or distributed to at least two network units. Some or all of the modules may be selected to achieve the objective of the solutions of the embodiments according to actual demands.

When the integrated unit is implemented in the form of a combination of hardware and software and sold or used as an independent product, the software may be stored in a computer-readable storage medium. Based on such an understanding, the part of the technical solutions of the present disclosure contributing to the prior art may be implemented in a form of a software product. The software product is stored in a storage medium, and includes several instructions for instructing a computer device (which may be a personal computer, a server, a network device, or the like) to perform all or some of the steps of the methods described in the embodiments of the present disclosure. The foregoing storage medium may be: a USB flash drive, a removable hard disk, a read-only memory (ROM), a random access memory (RAM), a magnetic disk, or an optical disc.

All parts in this specification are described in a progressive manner, for same or similar parts in the embodiments, reference may be made to these embodiments, and each embodiment focuses on a difference from other embodiments. Especially, apparatus and system embodiments are basically similar to a method embodiment, and therefore are described briefly; for related parts, reference may be made to partial descriptions in the method embodiment.

It should be understood that sequence numbers of the foregoing methods do not mean execution sequences in various embodiments of this application. The execution sequences of the methods should be determined according to functions and internal logic of the processes, and should not be construed as any limitation on the implementation processes of the embodiments of this application.

A person of ordinary skill in the art may be aware that, in combination with the examples described in the embodiments disclosed in this specification, circuits and method steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

Finally, it should be noted that what is described above is merely examples of embodiments of the technical solutions of this application, but is not intended to limit the protection scope of this application. Obviously, a person skilled in the art can make various modifications and variations to this application without departing from the scope of this application. This application is intended to cover these modifications, equivalent replacements, and variations provided that they fall within the scope of protection defined by the following claims and their equivalent technologies.

What is claimed is:

1. A data processing method, comprising:
    performing, by a forward error correction (FEC) encoding circuit included in a transmitter circuit, FEC encoding on a first bit stream to obtain a second bit stream, wherein the transmitter circuit comprises the FEC encoding circuit, a first distribution circuit, and a data processing circuit;
    distributing, by the first distribution circuit included in the transmitter circuit, the second bit stream to N channels in a round robin fashion, wherein:
        the N channels are represented by channels 1 to N, respectively,
        the second bit stream comprises N digital signals,
        the N digital signals are represented by digital signals 1 to N, respectively,
        the digital signals 1 to N are transmitted to N subcircuits of the data processing circuit by using the channels 1 to N, respectively,
        the N subcircuits are represented by subcircuits 1 to N, respectively,
        the digital signals 1 to N are in a one-to-one correspondence with the channels 1 to N,
        the channels 1 to N are in a one-to-one correspondence with the subcircuits 1 to N,
        L subcircuits of the N subcircuits are L FEC encoders,
        W subcircuits of the N subcircuits are W delayers, and
        the L subcircuits do not intersect with the W subcircuits;
    processing, by the subcircuits 1 to N, the digital signals 1 to N, respectively, to obtain N processed digital signals, wherein:
        the N processed digital signals are represented by bit streams 1 to N, respectively,
        the bit streams 1 to N are in a one-to-one correspondence with the digital signals 1 to N,
        the L FEC encoders perform FEC encoding processing on L input digital signals, respectively, to obtain L bit streams,
        the W delayers perform delay processing on W input digital signals, respectively, to obtain W bit streams,
        coding gains of the subcircuits 1 to N are represented by $G_1$ to $G_N$, respectively, and
        a coding gain of a subcircuit X is $G_X$, a coding gain of a subcircuit Y is $G_Y$, $G_X > G_Y$, L+W=N, L≥1, W≥0, 1≤X<Y≤N, N≥2, and L, W, X, Y, and N are integers; and
    sending, by the subcircuits 1 to N, the bit streams 1 to N to a pulse amplitude modulation (PAM) circuit, wherein the PAM circuit is configured to modulate the bit streams 1 to N, wherein the bit streams 1 to N are an input signal of the PAM circuit, and the bit streams 1 to N are in a one-to-one correspondence with a least significant bit to a most significant bit of the input signal.

2. The method according to claim 1, wherein the subcircuit 1 is an FEC encoder, $G_1 > G_N$, and $G_1$ is greater than or equal to each coding gain in $G_2$ to $G_{N-1}$.

3. The method according to claim 1, wherein the transmitter circuit further comprises a first alignment marker addition circuit, and the method further comprises:
    after the first distribution circuit distributes the first bit stream to the channels 1 to N in a round robin fashion, and before the subcircuits 1 to N process the digital signals 1 to N, respectively, receiving, by the first alignment marker addition circuit, the digital signals 1 to N, and adding, by the first alignment marker addition circuit, first alignment markers 1 to N to the digital signals 1 to N, wherein the digital signals 1 to N are in a one-to-one correspondence with the first alignment markers 1 to N, and the first alignment markers 1 to N are used for determining boundaries of the bit streams 1 to N; or
    after the subcircuits 1 to N send the bit streams 1 to N to the pulse amplitude modulation PAM circuit, receiving, by the first alignment marker addition circuit, the bit streams 1 to N, and adding, by the first alignment marker addition circuit, first alignment markers 1 to N to the bit streams 1 to N, wherein the bit streams 1 to N are in a one-to-one correspondence with the first alignment markers 1 to N, and the first alignment markers 1 to N are used for determining boundaries of the bit streams 1 to N.

4. The method according to claim 1, wherein the transmitter circuit further comprises a second distribution circuit, the PAM circuit comprises M modulators, and after the sending, by the subcircuits 1 to N, the bit streams 1 to N to a pulse amplitude modulation PAM circuit, the method further comprises:
    receiving, by the second distribution circuit, the bit streams 1 to N;
    distributing, by the second distribution circuit, the bit streams 1 to N, to obtain N×M bit streams $BS_{11}$ to $BS_{NM}$, wherein a bit stream i corresponds to $BS_{i1}$ to $BS_{iM}$, and values of i are integers from 1 to N; and
    sending, by the second distribution circuit, $BS_{i1}$ to $BS_{iM}$ to the M modulators, wherein $BS_{i1}$ to $BS_{iM}$ are in a one-to-one correspondence with the M modulators, the M modulators are respectively configured to modulate $BS_{i1}$ to $BS_{iM}$, and M is an integer greater than or equal to 2.

5. The method according to claim 1, wherein the transmitter circuit further comprises a second distribution circuit and a multiplexing circuit, the PAM circuit comprises M modulators, and after the sending, by the subcircuits 1 to N, the bit streams 1 to N to a pulse amplitude modulation PAM circuit, the method further comprises:

receiving, by the second distribution circuit, the bit streams 1 to N;

distributing, by the second distribution circuit, the bit streams 1 to N, to obtain N×P bit streams $AS_{11}$ to $AS_{NP}$, wherein a bit stream i corresponds to $AS_{i1}$ to $AS_{iP}$, and values of i are integers from 1 to N;

multiplexing, by the multiplexing circuit, the N×P bit streams $AS_{11}$ to $AS_{NP}$ into N×M bit streams $BS_{11}$ to $BS_{NM}$, wherein a bit stream i corresponds to $BS_{i1}$ to $BS_{iM}$, and values of i are integers from 1 to N; and sending, by the multiplexing circuit, $BS_{i1}$ to $BS_{iM}$ to the M modulators, wherein $BS_{i1}$ to $BS_{iM}$ are in a one-to-one correspondence with the M modulators, the M modulators are configured to modulate $BS_{i1}$ to $BS_{iM}$, respectively, P≥M, P is an integer multiple of M, and M is an integer greater than or equal to 2.

6. The method according to claim 4, wherein the transmitter circuit further comprises a second alignment marker addition circuit, and after the sending, by the second distribution circuit, $BS_{i1}$ to $BS_{iM}$ to the M modulators, the method further comprises:

receiving, by the second alignment marker addition circuit, $BS_{11}$ to $BS_{NM}$; and adding, by the second alignment marker addition circuit, N×M second alignment markers to $BS_{11}$ to $BS_{NM}$, respectively, wherein the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

7. The method according to claim 5, wherein the transmitter circuit further comprises a second alignment marker addition circuit, and after the sending, by the multiplexing circuit, $BS_{i1}$ to $BS_{iM}$ to the M modulators, the method further comprises:

receiving, by the second alignment marker addition circuit, $BS_{11}$ to $BS_{NM}$; and adding, by the second alignment marker addition circuit, N×M second alignment markers to $BS_{11}$ to $BS_{NM}$, respectively, wherein the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

8. A data processing method, comprising:

respectively receiving, by N subcircuits of a processing circuit included in a receiver circuit, N bit streams output by a pulse amplitude demodulation circuit, wherein the receiver circuit comprises the processing circuit, a first data merging circuit, and a forward error correction (FEC) decoding circuit, wherein:

the N subcircuits are represented by subcircuits 1 to N, respectively, the N bit streams are represented by bit streams 1 to N, respectively, the bit streams 1 to N are in a one-to-one correspondence with a least significant bit to a most significant bit of an output signal of the pulse amplitude demodulation circuit, the subcircuits 1 to N are in a one-to-one correspondence with the bit streams 1 to N, L subcircuits of the N subcircuits are L FEC decoders, W subcircuits of the N subcircuits are W delayers, the L subcircuits do not intersect with the W subcircuits, L+W=N, L≥1, W≥0, N≥2, and L, W, and N are integers;

respectively processing, by the subcircuits 1 to N, the bit streams 1 to N to obtain digital signals 1 to N, wherein the bit streams 1 to N are in a one-to-one correspondence with the digital signals 1 to N, the L FEC decoders perform FEC decoding on L input bit streams, respectively, to obtain L digital signals, and the W delayers perform delay processing on W input bit streams, respectively, to obtain W digital signals, wherein coding gains of the subcircuits 1 to N are represented by $G_1$ to $G_N$, respectively, a coding gain of a subcircuit X is $G_X$, a coding gain of a subcircuit Y is $G_Y$, $G_X > G_Y$, $1 \leq X < Y \leq N$, and X and Y are integers;

sending, by the subcircuits 1 to N, the digital signals 1 to N to the first data merging circuit;

merging, by the first data merging circuit, the digital signals 1 to N into a serial first bit stream; and performing, by the FEC decoding circuit, FEC decoding on the first bit stream, to obtain a second bit stream.

9. The method according to claim 8, wherein the subcircuit 1 is an FEC decoder, $G_1 > G_N$, and $G_1$ is greater than or equal to each coding gain in $G_2$ to $G_{N-1}$.

10. The method according to claim 8, wherein the receiver circuit further comprises a first alignment marker identification circuit, and before the respectively receiving, by N subcircuits of the processing circuit, N bit streams output by a pulse amplitude demodulation circuit, the method further comprises:

identifying, by the first alignment marker identification circuit, first alignment markers 1 to N that are comprised in the bit streams 1 to N, wherein the bit streams 1 to N are in a one-to-one correspondence with the first alignment markers 1 to N; and determining boundaries of the bit streams 1 to N based on the first alignment markers 1 to N.

11. The method according to claim 8, wherein the pulse amplitude demodulation circuit comprises M demodulators, the receiver circuit further comprises a second data merging circuit, and before the receiving, by the N subcircuits of the processing circuit, the N bit streams output by the pulse amplitude demodulation circuit, the method further comprises:

receiving, by the second data merging circuit, N×M bit streams output by the M demodulators, wherein the N×M bit streams are represented by $BS_{11}$ to $BS_{NM}$, respectively, a bit stream i corresponds to $BS_{i1}$ to $BS_{iM}$, and values of i are all integers from 1 to N; and merging, by the second data merging circuit, $BS_{i1}$ to $BS_{iM}$ into the bit stream i, wherein $BS_{i1}$ to $BS_{iM}$ are in a one-to-one correspondence with the M demodulators, and M is an integer greater than or equal to 2.

12. The method according to claim 8, wherein the pulse amplitude demodulation circuit comprises M demodulators, the receiver circuit further comprises a demultiplexing circuit and a second data merging circuit, and before the respectively receiving, by the N subcircuits of the processing circuit, the N bit streams output by the pulse amplitude demodulation circuit, the method further comprises:

receiving, by the demultiplexing circuit, N×M bit streams output by the M demodulators, wherein the N×M bit streams are represented by $BS_{11}$ to $BS_{NM}$, respectively, and demultiplexing $BS_{11}$ to $BS_{NM}$ into N×P bit streams, wherein the N×P bit streams are represented by $AS_{11}$ to $AS_{NP}$, respectively, a bit stream i corresponds to $BS_{i1}$ to $BS_{iM}$, values of i are integers from 1 to N, the bit streams $BS_{i1}$ to $BS_{iM}$ are in a one-to-one correspondence with the M demodulators, and M is an integer greater than or equal to 2;

receiving, by the second data merging circuit, $AS_{11}$ to $AS_{NP}$; and merging, by the second data merging circuit, $AS_{i1}$ to $AS_{iP}$ into the bit stream i, wherein the bit stream i corresponds to $AS_{i1}$ to $AS_{iP}$, values of i are all integers from 1 to N, P≥M, P is an integer multiple of M, and M is an integer greater than or equal to 2.

13. The method according to claim 11, wherein the receiver circuit further comprises a second alignment marker identification circuit, and before the receiving, by the N subcircuits of the processing circuit, the N bit streams output by the pulse amplitude demodulation circuit, the method further comprises:

identifying, by the second alignment marker identification circuit, N×M second alignment markers comprised in $BS_{11}$ to $BS_{NM}$, wherein the N×M second alignment markers are represented by $AM_{11}$ to $AM_{NM}$, respectively, and $BS_{11}$ to $BS_{NM}$ are in a one-to-one correspondence with $AM_{11}$ to $AM_{NM}$; and determining a boundary of each bit stream in $BS_{11}$ to $BS_{NM}$ based on $AM_{11}$ to $AM_{NM}$.

14. A data processing apparatus, comprising:
a forward error correction (FEC) encoding circuit;
a first distribution circuit; and
a data processing circuit, wherein:
the FEC encoding circuit is configured to perform FEC encoding on a first bit stream to obtain a second bit stream;
the first distribution circuit is configured to distribute the second bit stream to N channels in a round robin fashion, wherein:
the N channels are represented by channels 1 to N, respectively,
the second bit stream comprises N digital signals,
the N digital signals are represented by digital signals 1 to N, respectively,
the digital signals 1 to N are transmitted to N subcircuits of the data processing circuit by using the channels 1 to N, respectively,
the N subcircuits are represented by subcircuits 1 to N, respectively,
the digital signals 1 to N are in a one-to-one correspondence with the channels 1 to N,
the channels 1 to N are in a one-to-one correspondence with the subcircuits 1 to N,
L subcircuits of the N subcircuits are L FEC encoders,
W subcircuits of the N subcircuits are W delayers, and the L FEC encoders do not intersect with the W delayers;
the data processing circuit is configured to process the digital signals 1 to N by using the subcircuits 1 to N, respectively, to obtain N processed digital signals, wherein the N processed digital signals are represented by bit streams 1 to N, respectively, and the bit streams 1 to N are in a one-to-one correspondence with the digital signals 1 to N, wherein the L FEC encoders perform FEC encoding processing on L input digital signals, respectively, to obtain L bit streams, and the W delayers perform delay processing on W input digital signals, respectively, to obtain W bit streams, wherein coding gains of the subcircuits 1 to N are represented by $G_1$ to $GA_N$, respectively, a coding gain of a subcircuit X is $G_X$, a coding gain of a subcircuit Y is $G_Y$, $G_X > G_Y$, L+W=N, L≥1, W≥0, 1≤X<Y≤N, N≥2, and L, W, X, Y, and N are integers; and the data processing circuit is further configured to send the bit streams 1 to N to a pulse amplitude modulation (PAM) circuit, wherein the PAM circuit is configured to modulate the bit streams 1 to N, the bit streams 1 to N are an input signal of the PAM circuit, and the bit streams 1 to N are in a one-to-one correspondence with a least significant bit to a most significant bit of the input signal.

15. The data processing apparatus according to claim 14, wherein $G_1 > G_N$, and $G_1$ is greater than or equal to each coding gain in $G_2$ to $G_{N-1}$.

16. The data processing apparatus according to claim 14, wherein the data processing apparatus further comprises a first alignment marker addition circuit, wherein:

the first alignment marker addition circuit is configured to: after the first distribution circuit distributes the second bit stream to the channels 1 to N in a round robin fashion, and before the subcircuits 1 to N process the digital signals 1 to N, receive the digital signals 1 to N, and add first alignment markers 1 to N to the digital signals 1 to N, wherein the digital signals 1 to N are in a one-to-one correspondence with the first alignment markers 1 to N, and the first alignment markers 1 to N are used for determining boundaries of the bit streams 1 to N; or the first alignment marker addition circuit is configured to: after the subcircuits 1 to N send the bit streams 1 to N to the pulse amplitude modulation PAM circuit, receive the bit streams 1 to N, and add first alignment markers 1 to N to the bit streams 1 to N, wherein the bit streams 1 to N are in a one-to-one correspondence with the first alignment markers 1 to N, and the first alignment markers 1 to N are used for determining boundaries of the bit streams 1 to N.

17. The data processing apparatus according to claim 14, wherein the PAM circuit comprises M modulators, and the data processing apparatus further comprises a second distribution circuit, wherein:

the second distribution circuit is configured to: after the subcircuits 1 to N send the bit streams 1 to N to the PAM circuit, receive the bit streams 1 to N, and distribute the bit streams 1 to N, to obtain N×M bit streams $BS_{11}$ to $BS_{NM}$, wherein a bit stream i corresponds to $BS_{i1}$ to $BS_{iM}$, and values of i are integers from 1 to N; and the second distribution circuit is further configured to send $BS_{i1}$ to $BS_{iM}$ to the M modulators, wherein $BS_{i1}$ to $BS_{iM}$ are in a one-to-one correspondence with the M modulators, the M modulators are configured to modulate $BS_{i1}$ to $BS_{iM}$, respectively, and M is an integer greater than or equal to 2.

18. The data processing apparatus according to claim 14, wherein the PAM circuit comprises M modulators, and the data processing apparatus further comprises a second distribution circuit and a multiplexing circuit, wherein:

the second distribution circuit is configured to: after the subcircuits 1 to N send the bit streams 1 to N to the PAM circuit, receive the bit streams 1 to N, and distribute the bit streams 1 to N, to obtain N×P bit streams $AS_{11}$ to $AS_{NP}$, wherein a bit stream i corresponds to $AS_{i1}$ to $AS_{iP}$, and values of i are integers from 1 to N;

the multiplexing circuit is configured to multiplex the N×P bit streams $AS_{11}$ to $AS_{NP}$ into N×M bit streams $BS_{11}$ to $BS_{NM}$, wherein a bit stream i corresponds to $BS_{i1}$ to $BS_{iM}$, and values of i are all integers from 1 to N; and the multiplexing circuit is further configured to send $BS_{i1}$ to $BS_{iM}$ to the M modulators, wherein $BS_{i1}$ to $BS_{iM}$ are in a one-to-one correspondence with the M modulators, the M modulators are configured to modulate $BS_{i1}$ to $BS_{iM}$, respectively, P≥M, P is an integer multiple of M, and M is an integer greater than or equal to 2.

19. The data processing apparatus according to claim 17, wherein the data processing apparatus further comprises a second alignment marker addition circuit, wherein:
the second alignment marker addition circuit is configured to receive $BS_{11}$ to $BS_{NM}$ after the second distribution circuit sends $BS_{i1}$ to $BS_{iM}$ to the M modulators; and
the second alignment marker addition circuit is further configured to add N×M second alignment markers to $BS_{11}$ to $BS_{NM}$, respectively, wherein the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

20. The data processing apparatus according to claim 18, wherein the data processing apparatus further comprises a second alignment marker addition circuit, wherein:
the second alignment marker addition circuit is configured to receive $BS_{11}$ to $BS_{NM}$ after the multiplexing circuit sends $BS_{i1}$ to $BS_{iM}$ to the M modulators; and
the second alignment marker addition circuit is further configured to add N×M second alignment markers to $BS_{11}$ to $BS_{NM}$, respectively, wherein the N×M second alignment markers are represented by $AM_{11}$ to $AM_{NM}$, the bit streams $BS_{11}$ to $BS_{NM}$ are in a one-to-one correspondence with the second alignment markers $AM_{11}$ to $AM_{NM}$, and the second alignment markers $AM_{11}$ to $AM_{NM}$ are used for determining boundaries of the bit streams $BS_{11}$ to $BS_{NM}$.

21. A data processing apparatus, comprising:
a processing circuit comprising N subcircuits;
a first data merging circuit; and
a forward error correction (FEC) decoding circuit, wherein:
the processing circuit is configured to respectively receive, by using the N subcircuits, N bit streams output by a pulse amplitude demodulation circuit, wherein:
the N subcircuits are represented by subcircuits 1 to N, respectively,
the N bit streams are represented by bit streams 1 to N, respectively,
the bit streams 1 to N are in a one-to-one correspondence with a least significant bit to a most significant bit of an output signal of the pulse amplitude demodulation circuit,
the subcircuits 1 to N are in a one-to-one correspondence with the bit streams 1 to N,
L subcircuits of the N subcircuits are L FEC decoders,
W subcircuits of the N subcircuits are W delayers,
the L FEC decoders do not intersect with the W delayers,
L+W=N, L≥1, W≥0, N≥2, and
L, W, and N are integers;
the processing circuit is further configured to respectively process the bit streams 1 to N by using the subcircuits 1 to N, to obtain digital signals 1 to N, wherein the bit streams 1 to N are in a one-to-one correspondence with the digital signals 1 to N, the L FEC decoders perform FEC decoding on L input bit streams, respectively, to obtain L digital signals, and the W delayers perform delay processing on W input bit streams, respectively, to obtain W digital signals, wherein coding gains of the subcircuits 1 to N are represented by $G_1$ to $G_N$, respectively, a coding gain of a subcircuit X is $G_X$, a coding gain of a subcircuit Y is $G_Y$, $G_X > G_Y$, 1≤X<Y≤N, and X and Y are integers;
the subcircuits 1 to N send the digital signals 1 to N to the first data merging circuit;
the first data merging circuit is configured to merge the digital signals 1 to N into a serial first bit stream; and
the FEC decoding circuit is configured to perform FEC decoding on the first bit stream, to obtain a second bit stream.

22. The data processing apparatus according to claim 21, wherein $G_1 > G_N$, and $G_1$ is greater than or equal to each coding gain in $G_2$ to $G_{N-1}$.

23. The data processing apparatus according to claim 21, wherein the data processing apparatus further comprises a first alignment marker identification circuit, wherein the first alignment marker identification circuit is configured to:
before the N subcircuits of the processing circuit receive the N bit streams output by the pulse amplitude demodulation circuit, identify first alignment markers 1 to N that are comprised in the bit streams 1 to N, wherein the bit streams 1 to N are in a one-to-one correspondence with the first alignment markers 1 to N; and
determine boundaries of the bit streams 1 to N based on the first alignment markers 1 to N.

24. The data processing apparatus according to claim 21, wherein the pulse amplitude demodulation circuit comprises M demodulators, and the data processing apparatus further comprises a second data merging circuit, wherein the second data merging circuit is configured to:
before the N subcircuits of the processing circuit respectively receive the N bit streams output by the pulse amplitude demodulation circuit, receive N×M bit streams output by the M demodulators, wherein the N×M bit streams are represented by $BS_{11}$ to $BS_{NM}$, respectively, a bit stream i corresponds to $BS_{i1}$ to $BS_{iM}$, and values of i are all integers from 1 to N; and
merge $BS_{i1}$ to $BS_{iM}$ into the bit stream i, wherein $BS_{i1}$ to $BS_{iM}$ are in a one-to-one correspondence with the M demodulators, and M is an integer greater than or equal to 2.

25. The data processing apparatus according to claim 21, wherein the pulse amplitude demodulation circuit comprises M demodulators, and the data processing apparatus further comprises a demultiplexing circuit and the second data merging circuit, wherein:
the demultiplexing circuit is configured to: before the N subcircuits of the processing circuit receive the N bit streams output by the pulse amplitude demodulation circuit, receive N×M bit streams output by the M demodulators, wherein the N×M bit streams are represented by $BS_{11}$ to $BS_{NM}$, respectively, and demultiplex $BS_{11}$ to $BS_{NM}$ into N×P bit streams, wherein the N×P bit streams are represented by $AS_{11}$ to $AS_{NP}$, respectively, a bit stream i corresponds to $BS_{i1}$ to $BS_{iM}$, values of i are integers from 1 to N, the bit streams $BS_{i1}$ to $BS_{iM}$ are in a one-to-one correspondence with the M demodulators, and M is an integer greater than or equal to 2;
the second data merging circuit is configured to receive $AS_{11}$ to $AS_{NP}$; and
the second data merging circuit is further configured to merge $AS_{i1}$ to $AS_{iP}$ into the bit stream i, wherein the bit stream i corresponds to $AS_{i1}$ to $AS_{iP}$, values of i are integers from 1 to N, P≥M, P is an integer multiple of M, and M is an integer greater than or equal to 2.

26. The data processing apparatus according to claim 24, wherein the data processing apparatus further comprises a second alignment marker identification circuit, wherein the second alignment marker identification circuit is configured to:

before the N subcircuits of the processing circuit receive the N bit streams output by the pulse amplitude demodulation circuit, identify N×M second alignment markers comprised in $BS_{11}$ to $BS_{NM}$, wherein the N×M second alignment markers are represented by $AM_{11}$ to $AM_{NM}$, respectively, and $BS_{11}$ to $BS_{NM}$ are in a one-to-one correspondence with $AM_{11}$ to $AM_{NM}$; and determine a boundary of each bit stream of $BS_{11}$ to $BS_{NM}$ based on $AM_{11}$ to $AM_{NM}$.

* * * * *